(12) United States Patent
Finn

(10) Patent No.: US 8,608,080 B2  
(45) Date of Patent: Dec. 17, 2013

(54) INLAYS FOR SECURITY DOCUMENTS

(75) Inventor: David Finn, Tourmakeady (IE)

(73) Assignee: Feinics Amatech Teoranta, Lower Churchfield, Toumakeady, Co. Mayo (IE)

( * ) Notice: Subject to any disclaimer, the term of this patent is extended or adjusted under 35 U.S.C. 154(b) by 646 days.

(21) Appl. No.: 12/545,825

(22) Filed: Aug. 22, 2009

(65) Prior Publication Data

US 2009/0315320 A1 Dec. 24, 2009

Related U.S. Application Data

(63) Continuation-in-part of application No. 12/045,043, filed on Mar. 10, 2008, now abandoned, and a continuation-in-part of application No. 12/200,926, filed on Aug. 28, 2008, now Pat. No. 7,979,975, application No. 12/545,825, which is a continuation-in-part of application No. 11/831,987, filed on Aug. 1, 2007, now Pat. No. 8,240,022, which is a continuation-in-part of application No. 11/773,434, (Continued)

(51) Int. Cl.  
*G06K 19/00* (2006.01)

(52) U.S. Cl.  
USPC .......................................... 235/492; 235/487

(58) Field of Classification Search  
USPC .............................................. 235/487, 492  
See application file for complete search history.

(56) References Cited

U.S. PATENT DOCUMENTS

| | | |
|---|---|---|
| 3,674,914 A | 7/1972 | Burr |
| 4,014,602 A | 3/1977 | Ruell |

(Continued)

FOREIGN PATENT DOCUMENTS

| | | |
|---|---|---|
| CA | 2279176 | 7/1998 |
| CA | 2555034 | 9/2005 |

(Continued)

OTHER PUBLICATIONS

*Reactive hot melts—but without NCO, please*, Jowatt Klebstoffe.

(Continued)

*Primary Examiner* — Michael G Lee  
*Assistant Examiner* — Matthew Mikels  
(74) *Attorney, Agent, or Firm* — Gerald E. Linden

(57) ABSTRACT

Secure inlays for secure documents such as a passport comprising an inlay substrate may have laser ablated recesses within which a chip module is installed. Channels for an antenna wire may be formed in a surface of the substrate. Instead of using wire, the channels may be filled with a flowable, conductive material. Patches homogenous with the substrate layer may be used to protect and seal the chip and interconnection area. The inlay substrate may include two layers, and the antenna wire may be between the two layers. A moisture-curing polyurethane hot melt adhesive may be used to laminate a cover layer and the additional inlay substrate layers. The adhesive layer may include metal nanoscale powder and ink for electro-magnetic shielding. Additional security elements may include material that is optically changeable by an electro-magnetic field. Ferrite-containing layers may be incorporated in the inlay substrate.

20 Claims, 23 Drawing Sheets

Related U.S. Application Data

(63) filed on Jul. 5, 2007, now Pat. No. 7,581,308, and a continuation-in-part of application No. 11/760,793, filed on Jun. 11, 2007, now abandoned, application No. 12/545,825, which is a continuation-in-part of application No. 12/177,748, filed on Jul. 22, 2008, now Pat. No. 7,546,619, and a continuation-in-part of application No. 11/773,434, filed on Jul. 5, 2007, now Pat. No. 7,581,308.

(60) Provisional application No. 61/145,971, filed on Jan. 21, 2009, provisional application No. 61/092,766, filed on Aug. 29, 2008, provisional application No. 61/020,141, filed on Jan. 9, 2008, provisional application No. 60/971,581, filed on Sep. 12, 2007, provisional application No. 60/968,901, filed on Aug. 30, 2007, provisional application No. 60/894,469, filed on Mar. 13, 2007, provisional application No. 60/887,294, filed on Jan. 30, 2007, provisional application No. 60/884,158, filed on Jan. 9, 2007, provisional application No. 60/938,454, filed on May 17, 2007, provisional application No. 61/235,012, filed on Aug. 19, 2009, provisional application No. 61/230,710, filed on Aug. 2, 2009.

(56) References Cited

U.S. PATENT DOCUMENTS

| | | |
|---|---|---|
| 4,437,603 A | 3/1984 | Kobayashi et al. |
| 4,533,787 A | 8/1985 | Anderegg et al. |
| 4,539,433 A | 9/1985 | Ishino et al. |
| 4,641,773 A | 2/1987 | Morino et al. |
| 4,693,778 A | 9/1987 | Swiggett et al. |
| 4,730,188 A | 3/1988 | Milheiser |
| 4,884,334 A | 12/1989 | Houser et al. |
| 4,897,644 A | 1/1990 | Hirano |
| 4,912,143 A | 3/1990 | Ahn et al. |
| 5,034,648 A | 7/1991 | Gastgeb |
| 5,041,826 A | 8/1991 | Milheiser |
| 5,068,521 A | 11/1991 | Yamaguchi |
| 5,083,087 A | 1/1992 | Fox et al. |
| 5,084,699 A | 1/1992 | DeMichele |
| 5,094,907 A | 3/1992 | Yamura et al. |
| 5,166,676 A | 11/1992 | Milheiser |
| 5,201,453 A | 4/1993 | Amador et al. |
| 5,211,129 A | 5/1993 | Taylor et al. |
| 5,281,855 A | 1/1994 | Hadden et al. |
| 5,340,946 A | 8/1994 | Friedrich et al. |
| 5,365,657 A | 11/1994 | Brown et al. |
| 5,376,778 A | 12/1994 | Kreft |
| 5,399,847 A | 3/1995 | Droz |
| 5,491,302 A | 2/1996 | Distefano et al. |
| 5,598,032 A | 1/1997 | Fidalgo |
| 5,682,143 A | 10/1997 | Brady et al. |
| 5,696,363 A | 12/1997 | Larchevesque |
| 5,741,392 A | 4/1998 | Droz |
| 5,773,812 A | 6/1998 | Kreft |
| 5,786,626 A | 7/1998 | Brady et al. |
| 5,809,633 A | 9/1998 | Mundigl et al. |
| 5,847,372 A | 12/1998 | Kreft |
| 6,008,993 A | 12/1999 | Kreft |
| 6,088,230 A | 7/2000 | Finn et al. |
| 6,095,423 A | 8/2000 | Houdeau et al. |
| 6,095,915 A | 8/2000 | Geissler |
| 6,107,920 A | 8/2000 | Eberhardt et al. |
| 6,111,288 A | 8/2000 | Watanabe et al. |
| 6,140,707 A | 10/2000 | Plepys et al. |
| 6,142,381 A | 11/2000 | Finn et al. |
| 6,152,348 A | 11/2000 | Finn et al. |
| 6,190,942 B1 | 2/2001 | Wilm et al. |
| 6,206,292 B1 | 3/2001 | Robertz et al. |
| 6,233,818 B1 | 5/2001 | Finn et al. |
| 6,259,369 B1 | 7/2001 | Monico |
| 6,288,443 B1 | 9/2001 | Finn et al. |
| 6,310,778 B1 | 10/2001 | Finn et al. |
| 6,343,744 B1 | 2/2002 | Shibata et al. |
| 6,379,779 B1 | 4/2002 | Murl |
| 6,406,935 B2 | 6/2002 | Kayanakis et al. |
| 6,424,029 B1 | 7/2002 | Giesler |
| 6,471,878 B1 | 10/2002 | Greene et al. |
| 6,521,829 B2 | 2/2003 | Matsumura et al. |
| 6,522,308 B1 | 2/2003 | Mathieu |
| 6,575,374 B1 | 6/2003 | Boyadjian et al. |
| 6,606,247 B2 | 8/2003 | Credelle et al. |
| 6,626,364 B2 | 9/2003 | Taban |
| 6,628,240 B2 | 9/2003 | Amadeo |
| 6,662,430 B2 | 12/2003 | Brady et al. |
| 6,667,092 B1 | 12/2003 | Brollier et al. |
| 6,677,917 B2 | 1/2004 | Van Heerden et al. |
| 6,698,089 B2 | 3/2004 | Finn et al. |
| 6,719,205 B1 | 4/2004 | Puschner et al. |
| 6,816,125 B2 | 11/2004 | Kuhns et al. |
| 6,870,497 B2 | 3/2005 | Kondo et al. |
| 6,879,424 B2 | 4/2005 | Vincent et al. |
| 6,881,605 B2 | 4/2005 | Lee et al. |
| 6,956,182 B2 | 10/2005 | Gregory |
| 7,000,845 B2 | 2/2006 | Welling et al. |
| 7,011,980 B1 | 3/2006 | Na et al. |
| 7,054,050 B2 | 5/2006 | Vincent et al. |
| 7,093,499 B2 | 8/2006 | Baudendistel |
| 7,145,432 B2 | 12/2006 | Lussey et al. |
| 7,176,053 B1 | 2/2007 | Dimmler |
| 7,295,161 B2 | 11/2007 | Gaucher et al. |
| 7,422,708 B2 | 9/2008 | Kunze et al. |
| 7,427,029 B2 | 9/2008 | Bailleu et al. |
| 7,449,212 B2 | 11/2008 | Schneider |
| 7,546,671 B2 | 6/2009 | Finn |
| 2001/0011962 A1 | 8/2001 | Fletout et al. |
| 2001/0054230 A1 | 12/2001 | Finn et al. |
| 2002/0020903 A1 | 2/2002 | Kreft et al. |
| 2003/0000070 A1 | 1/2003 | Lee et al. |
| 2003/0132301 A1 | 7/2003 | Selker |
| 2004/0061994 A1 | 4/2004 | Kerr et al. |
| 2004/0089707 A1 | 5/2004 | Cortina et al. |
| 2004/0155114 A1 | 8/2004 | Rietzler |
| 2005/0011960 A1 | 1/2005 | Koike et al. |
| 2005/0206524 A1 | 9/2005 | Forster et al. |
| 2005/0282355 A1 | 12/2005 | Edwards et al. |
| 2005/0282495 A1 | 12/2005 | Forster |
| 2006/0114109 A1 | 6/2006 | Geissler |
| 2006/0220868 A1* | 10/2006 | Takasawa et al. .......... 340/572.1 |
| 2006/0255903 A1 | 11/2006 | Lussey et al. |
| 2006/0285301 A1 | 12/2006 | Provost et al. |
| 2007/0130754 A1 | 6/2007 | Fein |
| 2007/0146139 A1 | 6/2007 | Rietzler |
| 2007/0152829 A1* | 7/2007 | Lindsay et al. ............ 340/572.3 |
| 2007/0182154 A1 | 8/2007 | Hoeppner et al. |
| 2007/0205953 A1 | 9/2007 | Bombay et al. |
| 2007/0289775 A1* | 12/2007 | Potts et al. ................... 174/350 |
| 2007/0290051 A1 | 12/2007 | Bielmann et al. |
| 2008/0072423 A1 | 3/2008 | Finn |
| 2008/0073800 A1 | 3/2008 | Finn |
| 2008/0150817 A1 | 6/2008 | Carre et al. |
| 2008/0155822 A1 | 7/2008 | Finn |
| 2008/0169638 A1 | 7/2008 | Beyer-Meklenburg et al. |
| 2008/0179404 A1 | 7/2008 | Finn |
| 2008/0191029 A1 | 8/2008 | Deloche |
| 2008/0283615 A1 | 11/2008 | Finn |
| 2008/0308641 A1 | 12/2008 | Finn |
| 2009/0045618 A1 | 2/2009 | Williams et al. |
| 2009/0066076 A1 | 3/2009 | Schneider |
| 2009/0091424 A1 | 4/2009 | Rietzler |
| 2009/0108974 A1 | 4/2009 | Raggam et al. |
| 2009/0115185 A1 | 5/2009 | Hoffmuller et al. |
| 2009/0213027 A1 | 8/2009 | Finn |

FOREIGN PATENT DOCUMENTS

| | | |
|---|---|---|
| DE | 28 11 458 | 2/1979 |
| DE | 36 22 246 | 1/1987 |
| DE | 39 35 364 | 8/1990 |
| DE | 42 05 084 | 9/1993 |

(56) References Cited

FOREIGN PATENT DOCUMENTS

| | | |
|---|---|---|
| DE | 43 07 080 A1 | 9/1994 |
| DE | 44 43 980 | 6/1996 |
| DE | 195 25 933 | 1/1997 |
| DE | 195 41 039 | 5/1997 |
| DE | 195 42 900 | 5/1997 |
| DE | 196 10 507 | 9/1997 |
| DE | 196 16 424 | 10/1997 |
| DE | 196 54 902 | 10/1997 |
| DE | 196 34 473 | 1/1998 |
| DE | 196 46 717 | 5/1998 |
| DE | 196 51 566 | 6/1998 |
| DE | 197 16 912 | 11/1998 |
| DE | 197 45 648 | 11/1998 |
| DE | 197 42 126 | 3/1999 |
| DE | 197 41 984 | 6/1999 |
| DE | 198 50 353 | 3/2000 |
| DE | 199 20 593 | 11/2000 |
| DE | 199 20 399 | 1/2001 |
| DE | 201 05 170 | 8/2002 |
| DE | 102 01 112 | 10/2002 |
| DE | 101 40 662 | 3/2003 |
| DE | 10 2004 043 747 | 3/2006 |
| DE | 10 2004 045 896 | 3/2006 |
| DE | 20 2005 016 382 | 3/2006 |
| DE | 20 2007 013 680 | 1/2008 |
| EP | 0999729 | 5/2000 |
| EP | 0947281 | 3/2002 |
| EP | 1406209 | 4/2004 |
| EP | 1498843 | 1/2005 |
| FR | 2 728 710 | 6/1996 |
| GB | 1 593 235 | 7/1981 |
| JP | 63 51194 A | 12/1994 |
| WO | WO 91 16718 | 10/1991 |
| WO | WO 95 26538 | 10/1995 |
| WO | WO 97 30418 | 8/1997 |
| WO | WO 97 35273 | 9/1997 |
| WO | WO 98 20450 | 5/1998 |
| WO | WO 00 21030 | 4/2000 |
| WO | WO 00 36891 | 6/2000 |
| WO | WO 00 68994 | 11/2000 |
| WO | WO 2006 048577 | 5/2006 |
| WO | WO 2006 050691 | 5/2006 |
| WO | WO 2006048577 | 11/2006 |

OTHER PUBLICATIONS

Technical Data Sheet, Terorehm-MC-9622-02, Moisture Curing Hot Melt with High Initial Strength, Henkel, Feb. 7, 2005.
Information Sheets, soft ferrite, ferrite beads, EMI shielding, SMD inductors, shock absorbing, Kitegawa GmbH Germany, Aug. 1, 2009.
RF Inlay, Biosmart, 2008.
Flexield Series Flexible Composite-Type Electromagnetic Shield Materials for 13.56MHz RFID System, TDK Corporation, Tokyo Japan.
U.S. Appl. No. 12/200,926, filed Aug. 28, 2008, Not yet published.
U.S. Appl. No. 11/760,793, filed Jun. 11, 2007, Not yet published.

* cited by examiner

Leadframe Module

EPOXY GLASS MODULE

Laser Ablation

Gouging

Ultrasonic Stamp

Heat/Mold

FIG. 10B
FIG. 10C
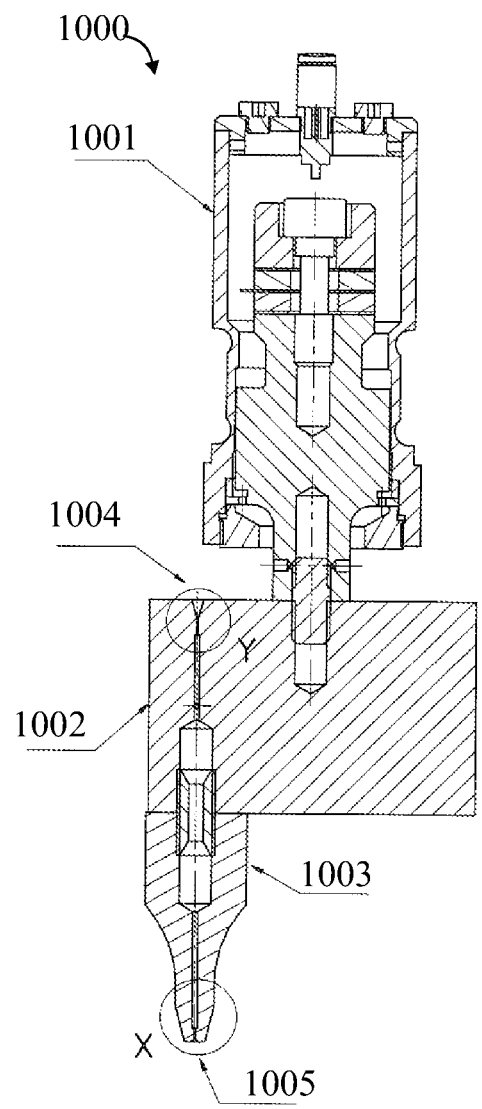
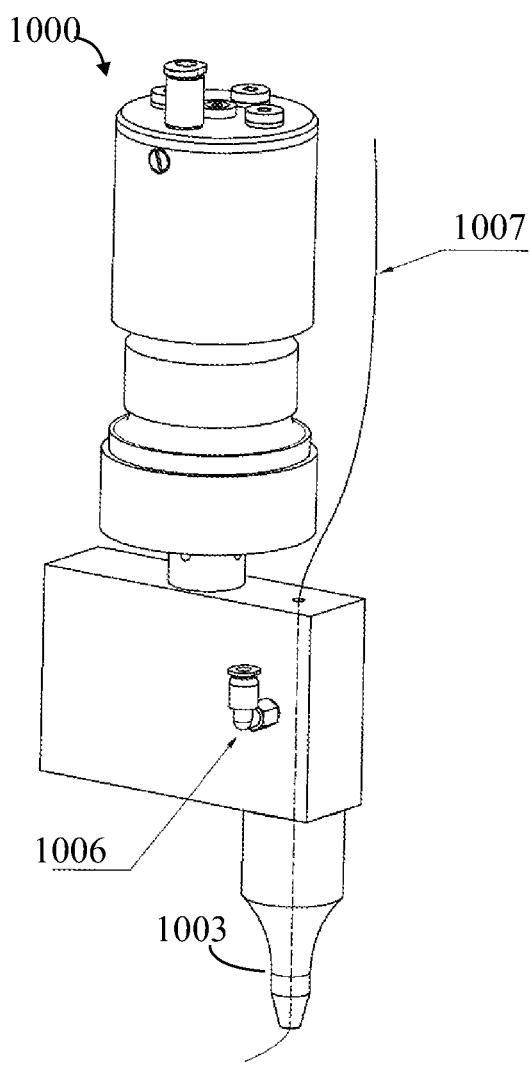

INLAYS FOR SECURITY DOCUMENTS

TECHNICAL FIELD

The invention relates to "inlay substrates" used in the production of "inlays" for "security documents" such as electronic passports and electronic identification cards.

BACKGROUND

A "security document" such as an electronic passport (ePassport) or an electronic identification (eID) card may comprise an "inlay substrate" (or "inlay laminate") which is typically a sheet (or layer) of material such as Teslin™, with a Radio Frequency Identification (RFID) chip module and corresponding antenna mounted therein. An ePassport may have an additional "cover layer" (or "cover material"), such as PVC-coated paper, cloth or synthetic leather laminated (or joined) thereto. An eID card may have an additional upper "overlay layer" of anti-scratch, typically transparent material, with an adhesive backing laminated thereto, and an additional "bottom layer", which may have a magnetic stripe.

In the main hereinafter, the inlay substrate (or inlay laminate) portion of security documents which are electronic passports (ePassport) are discussed. The inlay substrate, with transponder module and antenna incorporated therein may be referred to as a "secure inlay".

Examples of Some Secure Documents

An electronic passport cover (or "e-cover") generally comprises a hinged cover comprising a front panel (or portion) and a back panel (or portion), and an insert of several pages disposed within the e-cover. The "passport card" is an alternative to an ordinary US passport cover. Both the passport cover and passport card include a vicinity-read radio frequency identification (RFID) chip. The RFID chip in the passport card (eID card) is designed to be readable at a greater distance than that of the passport cover, and to prevent the RFID chip from being read when the passport card (eID card) is not being used, the passport card (eID card) typically comes with a sleeve designed to block the RFID chip from being read while the card is in the sleeve. See, for example, US Published Application No. 2007/0205953, incorporated by reference herein.

FIG. 1A shows an example of a security document which may an electronic "passport cover" (e-cover) comprising an inlay substrate (layer) and a cover layer (cover material). An RFID chip module (not shown) and corresponding antenna (not shown) may be mounted (disposed, embedded) in the inlay substrate. An insert having several pages (not shown) for presenting printed information and receiving visa (entry and exit) stamps may be mounted within the passport cover. Notice that the passport cover, cover layer and inlay substrate may be folded, resulting in a front cover panel (portion) and a back cover panel (portion) of the passport cover. The passport cover is shown partially open (partially closed). In use, when being examined, scanned or stamped by a border (Varna, Duoanes) official, the passport cover may be fully open. When the passport cover is closed, the cover layer is external to (surrounds) the inlay substrate. The passport cover, cover layer and inlay substrate are not shown to scale.

FIG. 1B shows an example of a security document which may be an identification (eID) card having an inlay substrate (layer), and additional layers comprising a top overlay layer and a bottom layer. An RFID chip module and corresponding antenna (not shown) may be mounted in the inlay substrate (middle layer). The additional top and bottom layers may be anti-scratch layers, and protect the inlay substrate in the middle from top and bottom. The eID card, inlay substrate layer and top and bottom layers are not shown to scale.

Examples of Some RFID Chip Modules

In the main hereinafter, the discussion may focus on RFID chip modules which are leadframe-type modules. However, some of the techniques for producing security documents discussed herein may also be applicable to epoxy glass modules (chip on FR4, wire bonded, glob topped).

FIG. 1C shows an example of an RFID chip module which is a "leadframe module" comprising:
  a leadframe having a thickness of approximately 80 µm
  an RFID chip disposed on and connected by wire bonds to the leadframe, having a thickness of approximately 80 µm
  a mold mass disposed over the chip and wire bonds, having a thickness of approximately 240 µm
  an antenna wire having end portions connected to "connection areas" of the leadframe, typically on a side of the leadframe opposite the RFID chip (as shown), but the end portions can also be connected to connection areas on the same side of the lead frame as the RFID chip.

The total thickness of the leadframe module may be 320 µm, such as for an inlay substrate having a thickness of approximately 356 µm. Generally, the chip module will be disposed in a recess in the inlay substrate so as to be concealed therein.

FIG. 1D shows an example of an RFID chip module which is an "epoxy glass module" comprising:
  an interconnect substrate, such as FR4 (printed circuit board substrate material), having a thickness of approximately 100 µm (FR4 is 100 µm and the chip & glob top 160 µm=overall 260 µm)
  an RFID chip, wire-bonded (alternatively flip-chip connected with solder bumps and underfiller, as illustrated) to the FR4 substrate, having a thickness of approximately 100
  a glob top epoxy disposed over the chip and connections, having a thickness with chip of approximately 160 µm
  an antenna wire having ends connected to "connection pads", typically on the same side of the FR4 substrate as the RFID chip, but can also be connected on the opposite side of the FR4 substrate as the chip.

The total thickness of the epoxy glass module may be 260 µm, such as for an inlay substrate having a thickness of approximately 365 µm. Generally, the chip module will be disposed in a recess in the inlay substrate so as to be concealed therein.

Generally speaking, epoxy glass modules are inherently somewhat more flexible than leadframe modules. This is a factor that may need to be taken into consideration when incorporating an RFID module into a secure document. And, whereas leadframe modules are typically rectangular, the mold part (glob top) of an epoxy glass module are typically round.

It should be understood that, although FIG. 1D shows a flip chip connection between the RFID chip and the FR4 substrate, the chip can be wire-bonded to the substrate (such as was shown in FIG. 1C, for the leadframe-type module.)

SOME DEFINITIONS AND TERMINOLOGY

An "inlay" or "inlay laminate" may comprise an "inlay substrate" which is a planar sheet of plastic material, such as Teslin™. A "chip module" disposed in a "recess" in the inlay substrate. An antenna wire is mounted to the inlay substrate, such as be embedding (countersinking) within or adhesively attaching (sticking, placing) to a surface of the inlay substrate.

A chip module may include an RFID (radio frequency identification) chip and means such as a leadframe or an epoxy-glass (FR4) substrate for facilitating interconnecting the RFID chip with an antenna. Some RFID chips have integrated antennas, and do not require the means for interconnecting with and antenna. As used herein "chip" and "chip module" can encompass many configurations of a silicon die or a packaged chip.

The antenna is typically in the form of a flat coil of wire having a number (such as 4 or 5) of turns and two end portions which are connected to corresponding contact pads (contact areas, terminals) of the chip module. The antenna may be a dipole antenna having two wire segments with two inner ends, or any other antenna configuration suitable for connection to a chip or chip module in an inlay. The wire may include any elongate means for conveying or radiating signals, such as metallic wire (such as gold, aluminum, copper, silver), of any profile (such as round or rectangular), either bare, coated or color coated, as well as optical fibers.

The recess for receiving the chip module extends into the inlay substrate from a "top" surface thereof, and may be a "window" type recess extending completely through the inlay substrate to a "bottom" surface thereof, or the recess may be a "pocket" type recess extending only partially through the inlay substrate towards the bottom surface thereof.

The recess may have a "straight" profile—in other words, substantially constant cross-dimension through (or into) the inlay substrate. Or, the recess may have a "stepped" profile, including a larger cross-dimension at the top surface of the substrate than at (or towards) the bottom surface of the inlay substrate. The recess is generally sized and shaped to accommodate the size and shape of the chip module being disposed therein. The term "cavity" may be used interchangeably with "recess".

A secure document, such as an electronic passport (e-passport) comprises an "inlay" (inlay substrate, plus chip module, plus antenna) and a "cover" layer (or substrate). The inlay plus cover constitute an "e-cover". The "inlay" may be fully functional, but rarely would be used on its own, without additional, protective layers (such as the cover layer) laminated thereto.

The inlay substrate may comprise, for example, Teslin™, PVC, Polycarbonate (PC), polyethylene (PE) PET (doped PE), PETE (derivative of PE), and the like.

The cover layer may comprise, for example, PVC, coated offset board, with or without optical bleacher or acrylic coated cotton, supplied in web form or in sheets.

E-covers may be manufactured several at a time, such as "3up", on an "inlay sheet" which may include several (a plurality of) distinct "transponder areas" (or "transponder sites") on an "oversize" inlay substrate, for forming a plurality of e-covers. Each transponder site may comprise a chip module and antenna mounted to the inlay substrate. The chip module and antenna may be referred to as a "transponder". A cover layer may be laminated (joined) thereto, then the individual e-covers may be separated from the inlay sheet.

An Inlay and Transponder of the Prior Art

FIGS. 1E and 1F illustrate an inlay sheet 100 having a plurality of transponder areas (or sites). A selected one of the transponder areas 102 is shown in detail. The vertical and horizontal dashed lines (in FIG. 1E) are intended to indicate that there may be additional transponder areas (and corresponding additional transponders) disposed to the left and right of, as well as above and below, the transponder area 102, on the inlay sheet 100. As best viewed in FIG. 1F, the inlay sheet 100 may be a multi-layer substrate 104 comprising one or more upper (top) layers 104a and one or more lower (bottom) layers 104b.

A recess 106 may be formed in (completely through) the upper layer 104a so that a transponder chip 108 may be disposed in the recess 106, and supported by the lower layer 104b. The transponder chip 108 is shown having two terminals 108a and 108b on a top surface thereof.

This inlay sheet 100 is representative of a credit card, using hot lamination to bond the material. The overall thickness of the inlay sheet (104a and 104b) is approximately 450 µm.

the thickness of a top overlay layer (not shown), approximately 50 µm the thickness of the top layer(s) 104a, approximately 400 µm depth of the recess 106, same as thickness of the top layer(s) 104a thickness of the transponder chip 108, approximately 320 µm thickness of the bottom layer(s) 104b, approximately 240 µm Generally, the recess 106 is sized and shaped to accurately position the transponder chip 108, having side dimensions only slightly larger than the transponder chip 108 to allow the transponder chip 108 to be located within the recess 106. For example, the transponder chip 108 may measure: 5.0×8.0 mm the recess 106 may measure: 5.1×8.1 mm the terminals 108a/b may measure: 5.0×1.45 mm the wire (discussed below) may have a diameter between 60 and 112 µm One millimeter (mm) equals one thousand (1000) micrometers (µm, "micron").

In FIGS. 1E and 1F, the recess 106 may be illustrated with an exaggerated gap between its inside edges and the outside edges of the chip 108, for illustrative clarity. In reality, the gap may be only approximately 50 µm-100 µm (0.05 mm-0.1 mm).

In FIG. 1E the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b.

As best viewed in FIG. 1E, an antenna wire 110 is disposed on a top surface (side) of the substrate 104, and may be formed into a flat (generally planar) coil, having two end portions 110a and 110b.

As best viewed in FIG. 1F, the antenna wire 110 is "mounted" to the substrate 104a, which may comprise "embedding" (countersinking) the antenna wire into the surface of the substrate, or "adhesively placing" (adhesively sticking) the antenna wire on the surface of the substrate. The wire typically feeds out of a capillary 116 of an ultrasonic wire guide tool (or "sonotrode", not shown). The capillary 116 is typically disposed perpendicular to the surface of the substrate 100. The capillary 116 is omitted from the view in FIG. 1E, for illustrative clarity.

The antenna wire 110 may be considered "heavy" wire (such as 60 µm) and requires higher bonding loads than those used for "fine" wire (such as 30 µm). Rectangular section copper ribbon (such as 60×30 µm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1F, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1E) and may subsequently be connected, such as by thermo-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1F, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1F is a "generic" bond head, poised to move down (see arrow) onto the wire 110b to bond it to the terminal 108b. The bond head 118 is omitted from the view in FIG. 1E, for illustrative clarity.

The interconnection process can be inner lead bonding (diamond tool), thermo-compression bonding (thermode), ultrasonic bonding, laser bonding, soldering, ColdHeat soldering (Athalite) or conductive gluing.

As best viewed in FIG. 1E, due to the layout of the antenna coils, the antenna wire 110 needs to cross over itself. This is illustrated in the dashed-line circled area "c". In order to prevent shorting (electrical contact between different portions of the antenna coil) the antenna wire should be an insulated wire, generally comprising a metallic core and an insulation (typically a polymer) coating. Also, the polymer coating facilitates the wire being "adhesively placed" on (stuck to) a plastic substrate layer (such as 104a). (In some cases, the antenna wire does not need to cross over itself. See, for example, FIG. 4 of U.S. Pat. No. 6,698,089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self-bonding copper wire, enamel copper wire or partially coated enamel wire, silver coated copper wire, un-insulated wire, aluminum wire, doped copper wire or litz wire.

The inlay substrate 104a may comprise PVC, PC, PE, PET, PETE, TYVEK, TESLIN, Paper or Cotton/Noil.

A cover layer (not shown) can be disposed over the inlay substrate 104a for the final product, which may be an e-ID card. See. FIG. 1B.

The conventional method of embedding an insulated copper wire into a synthetic substrate is described in U.S. Pat. No. 6,233,818 and U.S. Pat. No. 6,698,089 in which an ultrasonic converter is bolted to a sonotrode having a capillary hole to allow the passage of wire from the side of the sonotrode to the tip. The ultrasonic converter coaxially induces vibrations into the sonotrode, thus creating localized friction and heat against the wire emerging from the tip of the sonotrode with a synthetic substrate. The wire is embedded into the substrate by inducing vibrations into the sonotrode and applying pressure, while at the same time moving the complete assembly to route the wire into the substrate to create an antenna with several turns. Embedding wire into a synthetic substrate such as PVC with a soft texture and low melting point can be accomplished using the conventional technique, but countersinking an antenna wire into a Teslin™ substrate, requires the additional procedure after the wire embedding process of pre-pressing the Teslin™ inlay in a lamination press.

Mounting an antenna wire to an inlay substrate by "embedding" or "adhesively attaching" have been mentioned, and are suitable for producing inlay substrates of secure documents, such as electronic passports. However, some of the techniques for producing electronic passports discussed herein may also be applicable to inlay substrates wherein the antenna comprises traces on an etched PWB (printed wiring board) or printed antenna (conductive ink) substrates. See, for example, U.S. Pat. Nos. 6,379,779; 6,406,935; 7,000,845; 7,449,212; and US Patent Publication Nos. 20090066076 and 20090115185, all of which are incorporated by reference herein.

An Example of Forming an Electronic Passport Cover (e-Cover)

The production of an electronic passport cover (such as shown FIG. 1A) in may involve the adhesive attachment of an inlay substrate with a cover layer.

FIG. 1G is a plan view illustrating an "inlay", (or "passport inlay", or "e-cover inlay") for preparing three (3) "passport covers" (such as shown in FIG. 1A). The cover layer 104 is shown partially, so as to reveal the underlying inlay substrate 108. FIG. 1H is a cross-sectional view through FIG. 1G.

FIGS. 1G and 1H illustrate an e-cover inlay 100 having a "front" portion and a "back" portion, and comprising:
 a cover layer (cover material) 104, such as approximately 350 µm thick; and
 an inlay substrate 108, such as approximately 356 µm thick (14 mils) Teslin™

The material for the cover layer 104 may be PVC coated offset board or acrylic coated cotton, embossed and thermo-resistant. In the case of the fabric material, the backside coating can be water-base coated (aqueous/non-solvent), synthetic coated or have no coating. The front side coating can have two base coatings and one top coating of acrylic. An alternative to acrylic coating is peroxylene-based coating (nitrocellulose). The fabric can have a strong bias (diagonal) in the weave (drill weave as opposed to linear weave) which gives it high tensile strength and restricts the elongation. The leather embossing grain can have the resemblance of the skin of a kid goat or sheep (skiver) and is applied using an embossing cylinder drum at a pressure of 60 tons at around 180 degrees Celsius (° C.). Because of the front and backside coatings the fabric is not porous.

The material for the cover layer 104 may be a cloth product, with chemistry in the coatings and a leather-like appearance to the cloth, such as by Holliston Inc. (905 Holliston Mills Road, Church Hill, Tenn. 37642; www.holliston.com)

The material for the inlay substrate 108 may be Teslin™, a waterproof synthetic film, single-layer, uncoated with a thickness of 356 microns.

The material for the inlay substrate 108 may be PVC, PC, PE, PET, PETE, TYVEK, TESLIN, Paper or Cotton/Noil. The inlay substrate can also have special markings such as luminous threads, water marks, microscopic filings and optical polymer memory for additional security.

The inlay format is typically "3up" (for making three passport covers at once), and is generally planar and rectangular, having exemplary overall dimensions of 404.81 mm×182.56 mm×0.70 mm (thick). Each one of the three covers (A), (B) and (C) are generally rectangular, having exemplary dimensions of (404.85 mm/3)=134.94 mm×182.56 mm, with a thickness of 0.70 mm. In FIG. 1G, "A", "B" and "C", each are a "transponder site" for a given passport cover (see FIG. 1A).

The inlay substrate 108 is prepared with index slots, holes, windows for the 3 chip modules' mold mass and hinge gaps for the passport covers, and is then cut into sheets. The approximate width of the Teslin™ substrate is 248 mm, whilst the cover layer is approximately 216 mm with a Teslin™ margin of 14 mm one side and 18 mm on the other side (248=216+14+18).

A hinge gap 106 may be cut or punched through the inlay substrate 108 and the cover layer 104, separating the "front" portion from the "back" portion of the passport cover(s).

An RFID chip module 110 and corresponding antenna wire 120 are disposed in the inlay substrate 108.

the chip module 110 may be a leadframe-type chip module (compare FIG. 1C) comprising a chip encapsulated by a mold mass 112 and a leadframe 118.

the mold mass may be approximately 240 μm thick and 5 mm wide the leadframe 118 may be approximately 80 μm thick and 8 mm wide.

the chip module 110 may have an overall size of 5.1×8.1 mm, encapsulation size: 4.8×5.1 mm, leadframe thickness: 75 to 80 μm and overall thickness of the module (leadframe and mold mass) approximately 320 μm.

the antenna wire 120 may comprise 4 or 5 turns of wire, such as approximately 80 μm diameter (thick) wire. Ends of the antenna wire 120 are connected to the leadframe 118, such as described with respect to FIG. 1C.

The inlay substrate 108 may be prepared by embedding an insulated wire (such as 80 cm) into the inlay substrate 108 to form an antenna 120 with 4 turns and interconnecting the wire ends of the antenna to a leadframe chip module by means of thermo-compression bonding.

The leadframe chip module 110 may include a mold mass, such as epoxy or resin, surrounding a silicon die on the leadframe 118. (see FIG. 1C)

The chip module 110 is disposed in a recess 116 in the inlay substrate. The recess 116 may be slightly wider than the module (compare FIG. 1F). The recess 116 may be a "stepped" recess, as shown, and may be a "window" recess extending completely through the inlay substrate 108. Normally, the opening of the recess 116 at the bottom of the inlay substrate 108 is left open, revealing the mold mass 112 (flush with the bottom surface), which presents security problems.

The recess 116 has a larger cross-dimension at the top surface of the inlay substrate 108 to accept the protruding leadframe 112 on each side of the chip module, and this larger portion of the recess may be formed by using an ultrasonic stamp to create a dent (depression) into the top surface of the inlay substrate 108.

A stepped recess, such as the recess 116 shown in FIG. 1H may be created in a single layer by first forming a window opening through the layer, then compressing the layer (such as the inlay substrate 108) to form a "shoulder" (region of reduced cross-dimension) around a periphery of the window opening. See US 2009/0091424, incorporated by reference herein.

The cover layer 104 is laminated (joined) to the inlay substrate 104 using a polyurethane hot melt adhesive 114, such as approximately 50-80 μm thick. Prior to the adhesive process, the inlay substrate may be pre-pressed to ensure that the antenna wire does not protrude over (extend above) the surface of the Teslin™ substrate, in other words, to ensure that the antenna wire is fully embedded in the inlay substrate.

Non-reactive adhesives based on polyamide are typically not used in electronic passports for security reasons, as it would be possible to de-laminate the material by applying heat. Instead, reactive adhesive, moisture curing hot melt adhesive based on polyurethane, is used. Many are available.

The adhesive can be characterized by a high initial tack and a long open time (several minutes) or a short setting time (several seconds). In the latter case, the adhesive has to be reactivated using infra red light before the cover layer is attached to the inlay, or hot laminated within a certain period (within 1 to 2 hours). The adhesive cures exclusively in the presence of moisture and gains its final strength after 3 to 7 days.

The adhesive may be applied to the cover layer (cover material) at approximately 150 degrees Celsius, putting down a layer of 50 to 80 microns (μm). The inlay is applied to the cover layer (cover material) in web or in sheet form, and is then laminated together using a roll press. Thereafter, the laminated inlay with the cover layer (cover material) is cut to size and stored in a stack for 3 to 7 days in a storage area having a regulated temperature and humidity.

Some Technical (Physical) Problems Associated with Using Hot-Melt Adhesive

The technique of applying moisture-curing hot melt based on polyurethane to a cover material processed in web form may have a number of drawbacks:

The back side of the cover material has a non-smooth (grained) texture which prevents a homogenous layer of adhesive coating being applied, irrespective of the coating applicator such as slot nozzle, screen printing, spray applicator or flexo/gravure roller. In the event of over-coating in a humid environment, leaving an uneven thickness of adhesive on the cover layer, the probability of $CO_2$ emission after lamination is quite high. The release of $CO_2$ gas from the adhesive layer results in the formation of bubbles between the cover material and the Teslin inlay.

The tensile strength properties and the thermal expansion coefficient of the cover material differ significantly from that of Teslin™. During the coating process in which adhesive is applied to the cover material at approximately 150° Celsius and thereafter during the roll press lamination process to reactivate the adhesive at 125° Celsius, the Teslin™ inlay held at room temperature is positioned onto the cover material, meaning that the different thermal expansion of the substrates can lead to sideways displacement of the finished product. This mechanical displacement results in the so-called "banana effect" in which the electronic passport cover is curve shaped (warped).

As the cover layer (cover material) in web form is stretched across drums during the coating and lamination processes, the cover layer (cover material) memorizes the curved shape of the drums which can present a problem during curing. If the final product is stored in stacks under the pressure of a weight, separated by paper sheets, in a non-controlled temperature and humidity environment, the optimal curing time of 3 to 7 days will vary significantly according to production batches. The resulting effect of a short curing time is the warping of the final product.

Apart from the formation of bubbles and the warping of the final product, the longevity of the electronic passport could be reduced by moisture seeping into the exposed area around the mold mass of the chip module.

Some Security Concerns Regarding Secure Documents

Apart from the above "technical" issues (physical problems) which impinge on the quality, reliability and longevity of secure documents, there may be a number of additional concerns surrounding (i) security and (ii) the type of chip module (such as leadframe module, or epoxy glass module) used, for example, in a passport inlay.

To prevent or indicate tampering of the area surrounding the chip module, it is advantageous to hide the transponder chip or chip module and the wire interconnections thereto in the inlay substrate layer to enhance protection against falsification. Security elements may also be designed in particular as optically variable elements, such as holograms, electroluminescent pigments, or interference layer elements for example which, when viewed, give different color impressions depending on the viewing angle.

One of the impediments in hiding the transponder chip module and the wire interconnections thereto in the inlay substrate layer (thickness: 356 microns) has been the thickness of the chip module with 320 microns. In addition, metal leadframe chip modules mounted to an inlay substrate tend to break during torsion and bending of the substrate. Semiconductor companies have reduced the footprint and thickness of the chip module down to 250 microns, by packaging the transponder chips as a flip-chip module, glass epoxy module, plastic leadframe module or as naked die connected directly to the wire ends of an antenna.

To prevent external skimming of the data stored in the transponder chip when a passport is closed, it is desired that an electromagnetic shield be integrated into the front and back cover of a passport cover. See, for example, US 2007/0205953 (Axalto), incorporated in its entirety by reference herein.

GLOSSARY & DEFINITIONS

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

| | |
|---|---|
| Chip | As used herein, the word "chip" can encompass many configurations of a silicon die or a packaged chip. The silicon die for example can have metallized bumps to facilitate the direct connection of the wire ends of an antenna to form a transponder or tag device. A package chip can include various structures such as a tape automated bonding module, a chip module, a flip chip module, a leadframe, a glass epoxy flexible module, a chip carrier, a strap, an interposer or any form of packaging to facilitate transponder manufacturing. |
| Electronic Ink | It is a proprietary material that is processed into a film for integration into electronic displays. The principal components of electronic ink are millions of tiny microcapsules. Each microcapsule contains positively charged white particles and negatively charged black particles suspended in a clear fluid. When a negative electric field is applied, the white particles move to the top of the microcapsule where they become visible to the user. This makes the surface appear white at that spot. At the same time, an opposite electric field pulls the black particles to the bottom of the microcapsules where they are hidden. By reversing this process, the black particles appear at the top of the capsule, which now makes the surface appear dark at that spot. To form an E Ink electronic display, the ink is printed onto a sheet of plastic film that is laminated to a layer of circuitry. The circuitry forms a pattern of pixels that can then be controlled by a display driver. These microcapsules are suspended in a liquid "carrier medium" allowing them to be printed using existing screen printing processes onto virtually any surface, including glass, plastic, fabric and even paper. |
| Faraday Cage | Faraday shield is an enclosure formed by conducting material, or by a mesh of such material. Such an enclosure blocks out external static electrical fields. Faraday cages are named after the English scientist Michael Faraday, who invented them in 1836. A Faraday cage's operation depends on the fact that an external static electrical field will cause the electrical charges within the cage's conducting material to redistribute themselves so as to cancel the fields effects in the cage's interior. This phenomenon is used, for example, to protect electronic equipment from lightning strikes and other electrostatic discharges. To a large degree, Faraday cages also shield the interior from external electromagnetic radiation if the conductor is thick enough and any holes are significantly smaller than the radiation's wavelength. |
| FR-4 | FR-4, an abbreviation for Flame Retardant 4, is a type of material used for making a printed circuit board (PCB). It describes the board substrate, with no copper layer. FR-4 meets the requirements of Underwriters Laboratories UL94-V0. The FR-4 used in PCBs is typically UV stabilized with a tetrafunctional epoxy resin system. It is typically a transparent yellowish color - the green, red and sometimes blue color of a finished board comes from the solder mask. FR-4 manufactured strictly as an insulator (without copper cladding) is typically a difunctional epoxy resin system and a greenish color. FR-4 is similar to an older material called G-10. G-10 lacked FR-4's self-extinguishing flammability-characteristics. FR-4 has widely replaced G-10 in most applications. Some military applications where destruction of the circuit board is a desirable trait will still utilize G-10. |
| Inlay | An inlay substrate typically has a plurality, such as array of transponder sites on a substrate which matches the position of the data or graphics on a printed sheet or holder/cover page of a smart card or electronic passport respectively. A secure inlay is similar to a conventional inlay but with additional features such as an additional RFID chip on the transponder site storing information about the production processes in the value chain as well as having personalization features integrated into the inlay such as a hologram, an anti-skimming material or security codes embedded into the inlay. |
| Laminating | As used herein, in its most general sense, laminating refers to joining two (or more) sheets of material to one another. The sheets may be the same material as one another. Two different (and distinct) kinds of lamination are discussed herein. Hot Lamination which used temperature and pressure to cause the two sheets of material to fuse with one another Cold Lamination in which an adhesive is used to join the two sheets of material to one another. |
| Laser Ablation | Laser ablation is the process of removing material from a solid (or occasionally liquid) surface by irradiating it with a laser beam. At low laser flux, the material is heated by the absorbed laser energy and evaporates or sublimates. At high laser flux, the material is typically converted to a plasma. Usually, laser ablation refers to removing material with a pulsed laser, but it is possible to ablate material with a continuous wave laser beam if the laser intensity is high |

-continued

| | |
|---|---|
| | enough. The depth over which the laser energy is absorbed, and thus the amount of material removed by a single laser pulse, depends on the material's optical properties and the laser wavelength. Laser pulses can vary over a very wide range of duration (milliseconds to femtoseconds) and fluxes, and can be precisely controlled. This makes laser ablation very valuable for both research and industrial applications. The simplest application of laser ablation is to remove material from a solid surface in a controlled fashion. Laser machining and particularly laser drilling are examples; pulsed lasers can drill extremely small, deep holes through very hard materials. Very short laser pulses remove material so quickly that the surrounding material absorbs very little heat, so laser drilling can be done on delicate or heat-sensitive materials. A typical laser for ablating synthetic material such as Teslin ™ or Polycarbonate is an ultra violet diode pump laser operating at the wavelength of 385 nm. |
| Metallic Pigments | Metallic pigments such as aluminium pigments are utilized in the coating industry to fulfil functional requirements such as electrical conductivity and shielding in consumer electronics. Typical metal pigments range from approximately 3 μm (offset printing) to over 50 μm. |
| Mold Mass | Mold mass is the part of a chip module which encapsulates the area surrounding a silicon die mounted on a leadframe or carrier and the wire bond connections (Au wire Ø 24 μm) thereto. The mold mass is typically epoxy duraplast and the encapsulation process is transfer molding. Alternatively, the silicon die and wire interconnections can be protected by dispensing a fast curing resin (glob top). |
| Patch | A piece of material used to cover a hole, cavity or recess area in a substrate layer assigned to a transponder chip and or antenna, used to protect and hermetically seal the underlying chip and interconnections thereto, to prevent moisture seeping into and electro-static discharge (ESD) entering the assigned area, having security elements which may overlap onto the substrate layer. The patch may be attached to the substrate layer by means of adhesion, lamination under pressure and temperature, laser welding, ultrasonic collation, etc. |
| Printed Silicon Electronics | Printed Silicon Electronics refers to semiconductor technology using printable silicon-based inks, additive printing techniques and thin film technology. Silicon ink, oxide inks and metal inks are deposited on thin metal-foil substrates. After the ink is printed, it forms silicon islands that are annealed to drive out the solvents, leaving a polysilicon crystal film. Oxide inks are used to create a gate dielectric, other inks for in situ n- and p-type dopants and metal inks for contacts to the silicon. |
| Reactive Adhesive | In general, one-component moisture-curing polyurethane hot-melt adhesive-based on reaction products from di- or polyisocyanates and polyether-polyols, crystalline or partly crystalline polyester-polyols and low molecular weight polymers from olefinically unsaturated monomers and optionally hydroxylated tackifying resins. |
| RFID | Short for "Radio Frequency Identification". An RFID device interacts, typically at a limited distance, with a "reader", and may be either "passive" (powered by the reader) or "active" (having its own power source, such as a battery). |
| Teslin | A single layer of microporous, polyolefin-based, uncoated film that bonds readily and firmly with toners, inks, adhesives and laminating films. Teslin is a waterproof synthetic material that works well with an inkjet printer, laser printer, or thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 1up, 2up, 3up, 6up, and 8up. Teslin is used widely in the production of drivers licenses, voter ID cards, and other forms of identification card. Because of its commercial availability, Teslin is also often found used for counterfeit or fake IDs. "Teslin" is a registered trademark of PPG Industries, Inc. for synthetic printing sheet. |

SUMMARY OF THE INVENTION

It is a general object of the invention to provide improved techniques for use in the manufacture of security documents, and security documents (the "product") having improved technical and security features. For example, improvements in the manufacture of the product to reduce warpage and breakage in the product, and to integrate and hide the chip module and the wire interconnections in an inlay substrate layer of the product and add security features to make alteration of the product and/or the production of forgeries technically impossible or at least uneconomical.

unauthorized separation of the cover material and inlay substrate mechanically or through de-lamination should result in the destruction of the chip module and the antenna to prevent skimming of the personal data stored in the memory of an RFID chip in an electronic passport by activating the secure document with correct keys at close proximity or eavesdropping by intercepting the communication between a reader and an electronic passport, shielding is required.

Some features and embodiments disclosed herein may be concerned with techniques to protect a chip module from moisture and mechanical shock using a adhesive patch; to hide an antenna in a multi-layered construction; to create recesses in a substrate to accommodate a chip module leadframe using laser ablation instead of compressing the material to form a recess; to loop the wire ends of an antenna adjacent to the terminals areas of a chip module in preparation for interconnection, and to embed a wire conductor into a substrate using a wire guide assembly consisting of an ultrasonic converter, aluminum block directing the ultrasonic energy and a sonotrode.

Other features disclosed herein may be concerned with security issues: to hide a chip (die, leadframe chip module, epoxy glass chip carrier, etc) in a substrate using stepped recesses to accommodate the chip and a patch or patches to protect the chip and the wire interconnections thereto; to integrate security features into the inlay such as a hologram, metal security strip or an electronic ink display which can be activated by the electro-magnetic field driving the RFID chip, and to shield a transponder unit in a passport cover from authorized skimming when the passport cover is closed, by adding metallic pigments to the adhesive layer bonding the cover layer to the inlay substrate.

According to an embodiment of the invention, an inlay substrate for a secure document having a recess extending into the inlay substrate from a first (top) surface thereof for receiving a chip module therein, and an antenna wire disposed in the inlay substrate and connected with the chip module, the inlay substrate comprises: at least two layers of a synthetic material, such as Teslin™, laminated to one another with a layer of adhesive. The chip module may be a leadframe-type module or an epoxy glass type module.

The antenna wire may be disposed on a top one of the at least two layers, or between the at least two layers.

The recess may be straight or stepped. The recess may be a pocket-type recess extending only partially through the substrate or a window-type recess extending completely through the inlay substrate. The recess may be formed by laser ablation, or by freezing the material of the inlay substrate and machining (milling) it.

A moisture-resistant patch may cover the chip module. An epoxy filling may be disposed in the recess, surrounding the chip module and the antenna wire interconnections. A lid may covering an opening of the recess.

Channels may be formed (pre-formed) in a surface of the substrate within which the antenna wire is at least partially embedded. The channels may be formed by removing material or displacing material. The channels may be formed by at least one of (i) laser ablation, (ii) gouging, (iii) ultrasonic stamp, and (iv) heating and molding.

The channels define a pattern for the antenna. An antenna wire may be mounted in the channel.

Rather than using antenna wire, the channels may be filled with a flowable, conductive material to form the antenna. Techniques are disclosed for connecting the flowable, conductive material with terminals of a chip module.

Ferrite material may be incorporated into the inlay substrate to reflect or absorb electromagnetic energy. Various embodiments are disclosed.

A cover layer may be laminated to the inlay substrate. The cover layer and inlay substrate may comprise an inlay, such as for a passport booklet (cover) having a front panel and a back panel. A shielding/detuning antenna may be disposed on the back panel of the passport cover. A switch may be disposed in the passport cover for disconnecting the chip module's antenna when the passport booklet is closed.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
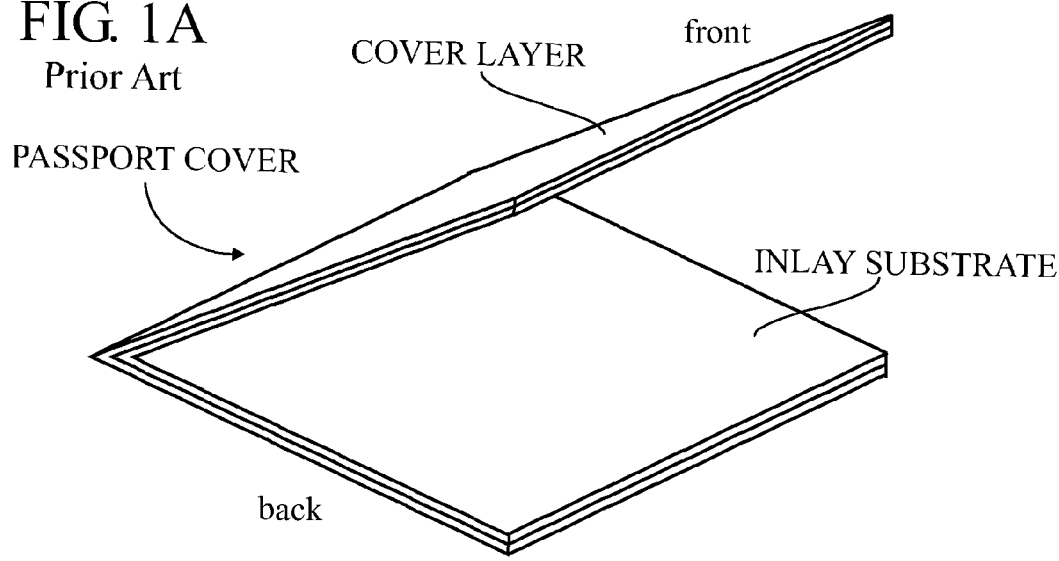

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a perspective view of a security document which is a passport cover (e-cover), according to the prior art.

Figure 1B:
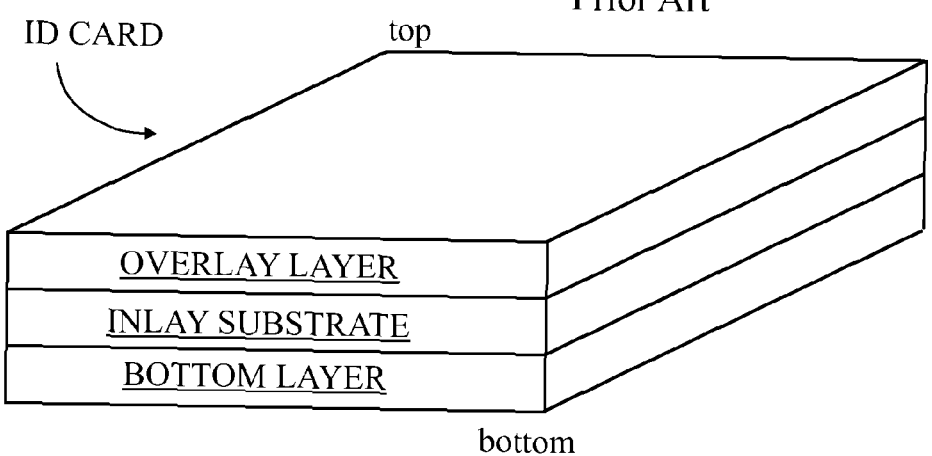

FIG. 1B is a perspective view of a security document which is an electronic identification card (eID), according to the prior art.

Figure 1C:
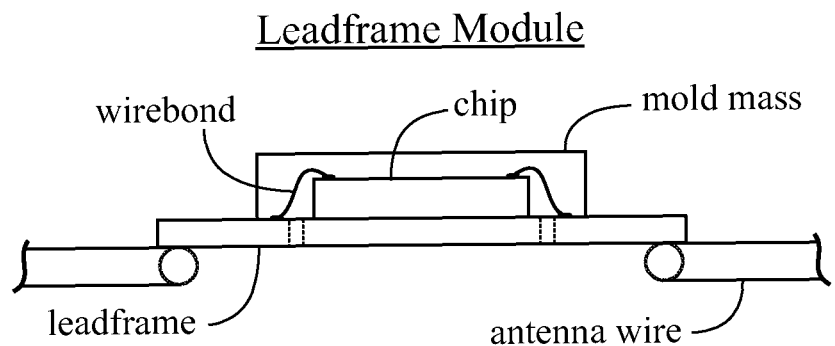

FIG. 1C is a perspective view of a chip module which is a leadframe module, according to the prior art.

Figure 1D:
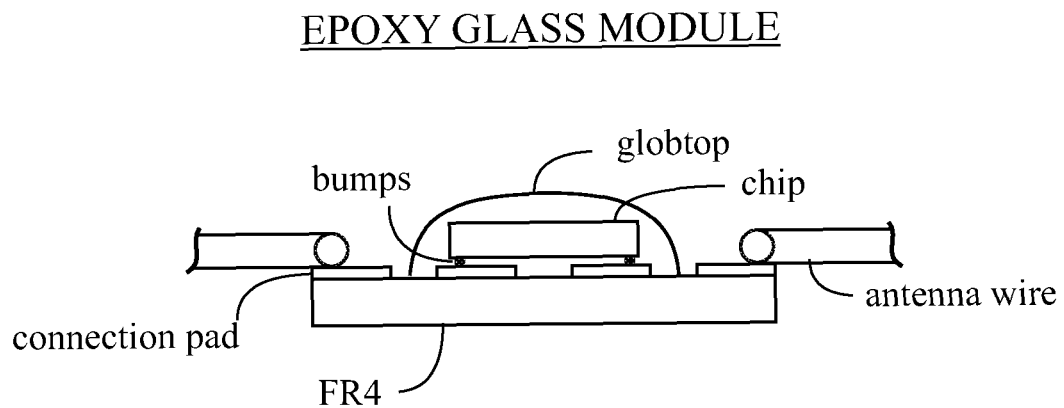

FIG. 1D is a perspective view of a chip module which is an epoxy-glass module, according to the prior art.

Figure 1E:
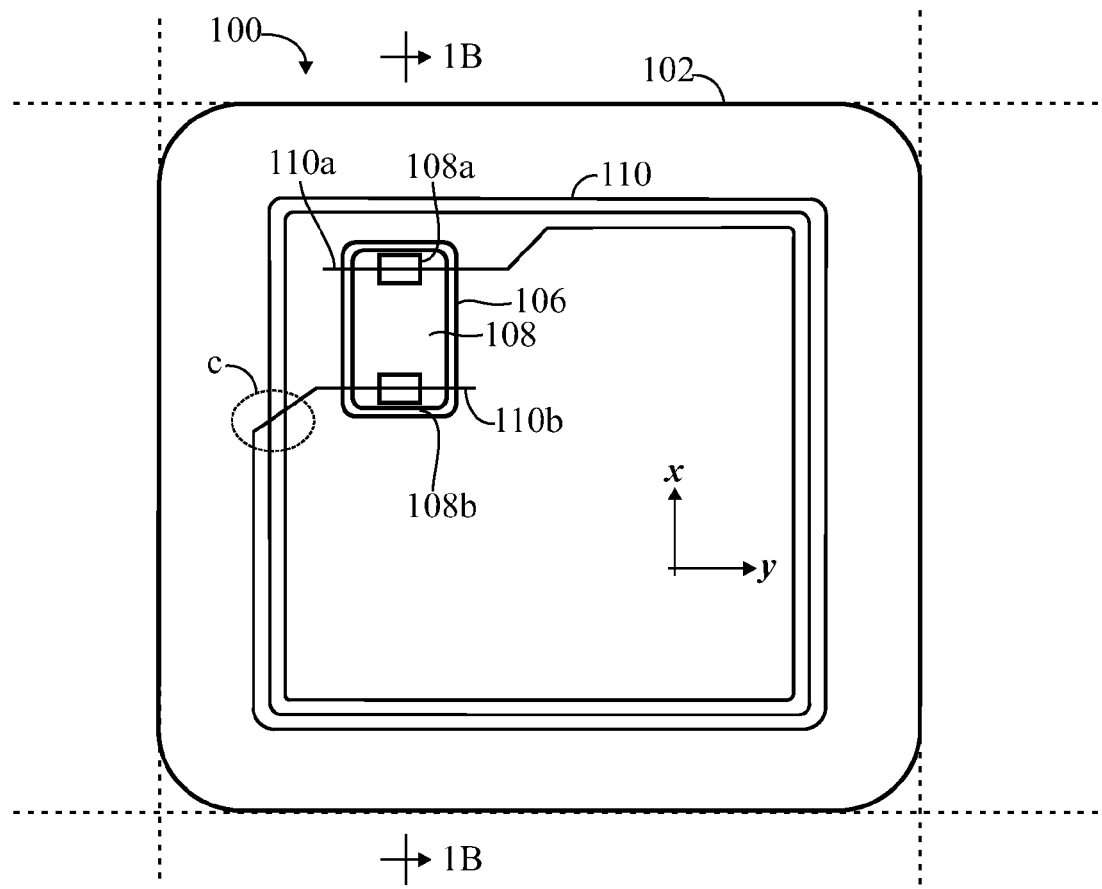

FIG. 1E is a top view of a transponder site (one of many on an inlay sheet), according to the prior art.

Figure 1F:
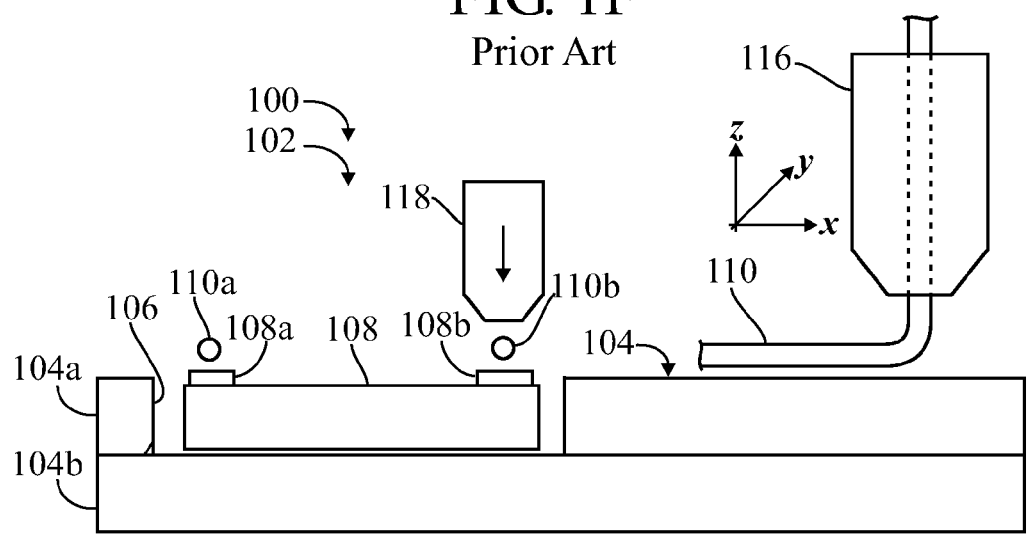

FIG. 1F is a side, cross-sectional view, partially exploded, of a wire being mounted to the an inlay substrate and bonded to the terminals of a transponder chip, according to the prior art.

Figure 1G:
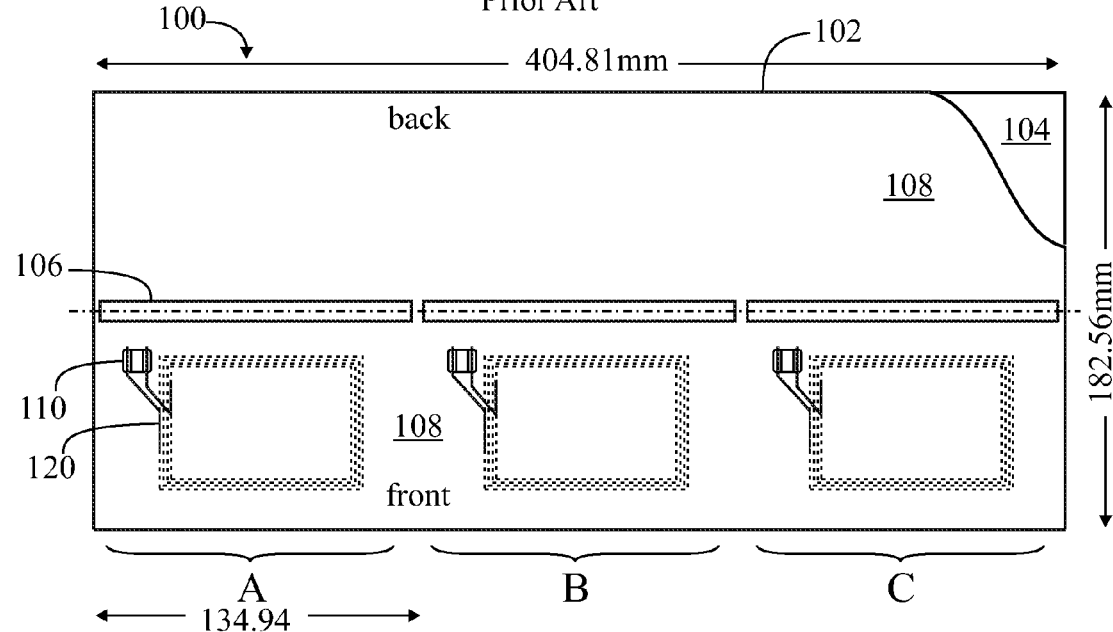

FIG. 1G is a top view of an inlay sheet for making e-covers, having three "transponder sites" ("3up"), according to the prior art.

Figure 1H:
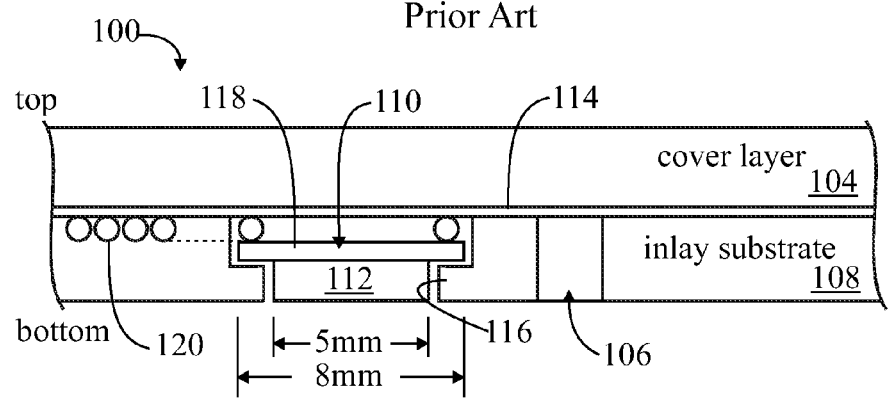

FIG. 1H is a side, cross-sectional view, partially exploded, of an e-cover of FIG. 1G.

Figure 2A:
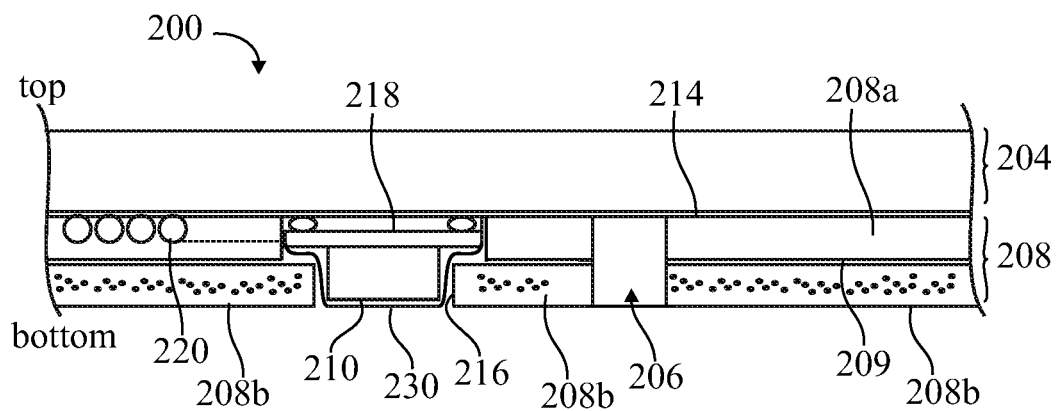

FIG. 2A is a cross-sectional view, illustrating a passport cover comprising a multi-layer inlay substrate and a patch covering a chip module in a recess of the inlay substrate, according to an embodiment of the invention.

Figure 2B:
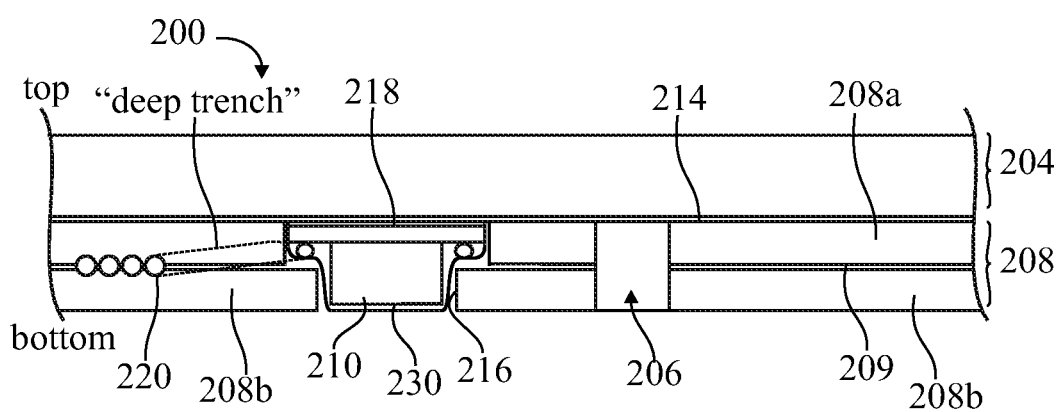

FIG. 2B is a cross-sectional view, illustrating a passport cover comprising a multi-layer inlay substrate and a patch covering a chip module in a recess of the inlay substrate, according to an embodiment of the invention.

Figure 2C:
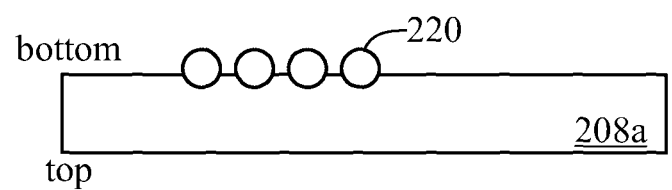
Figure 2D:
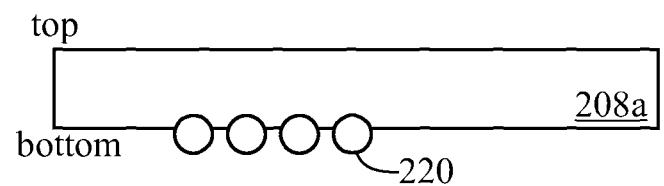
Figure 2E:
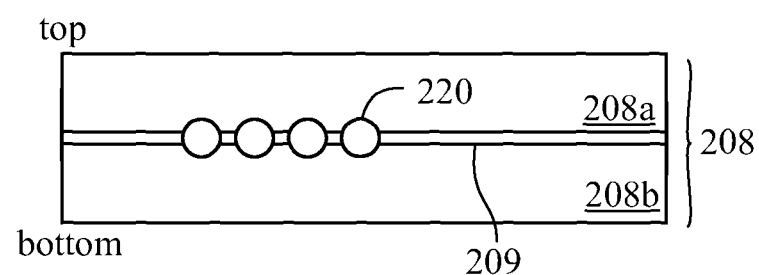

FIGS. 2C, 2D and 2E are cross-sectional views showing a method of making the passport cover in FIG. 2B, according to an embodiment of the invention.

Figure 2F:
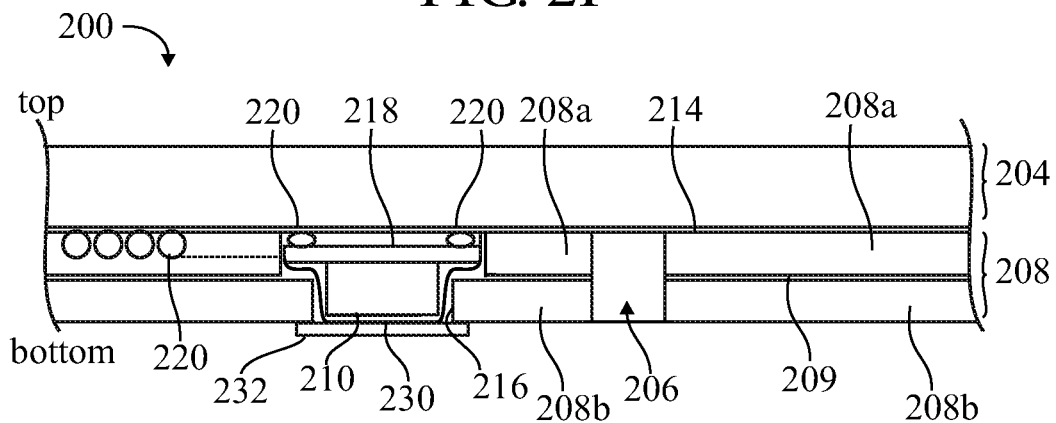

FIG. 2F is a cross-sectional view, illustrating a passport cover comprising a multi-layer inlay substrate and a patch covering a chip module in a recess of the inlay substrate, according to an embodiment of the invention.

Figure 2G:
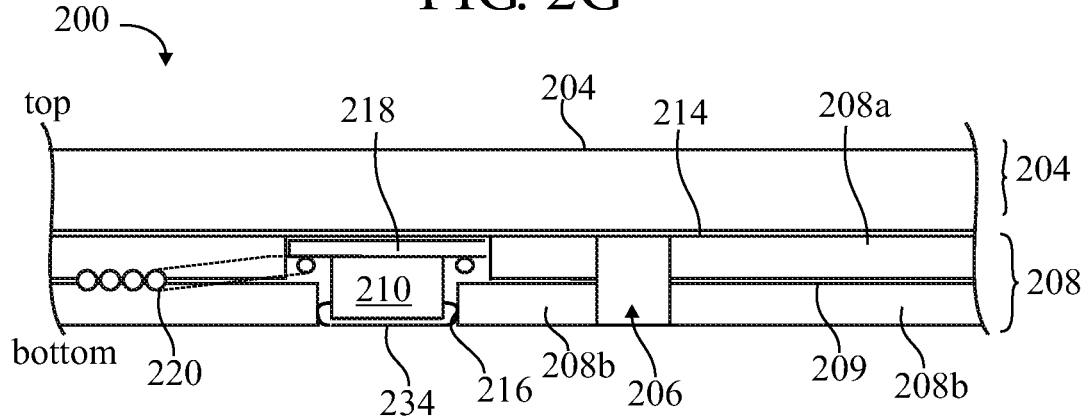

FIG. 2G is a cross-sectional view, illustrating a passport cover comprising a multi-layer inlay substrate and a patch covering a chip module in a recess of the inlay substrate, according to an embodiment of the invention.

Figure 2H:
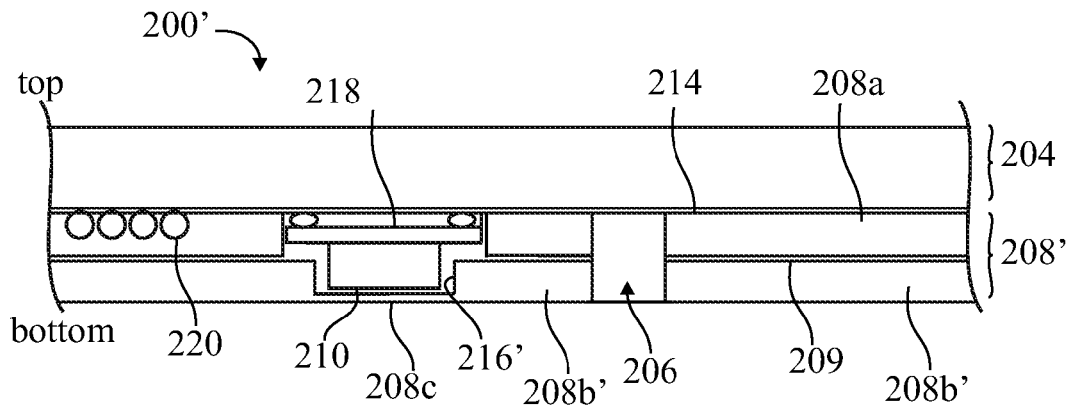

FIG. 2H is a cross-sectional view, illustrating a passport cover comprising a multi-layer inlay substrate and a chip module in a pocket-type recess of the inlay substrate, according to an embodiment of the invention.

Figure 2I:
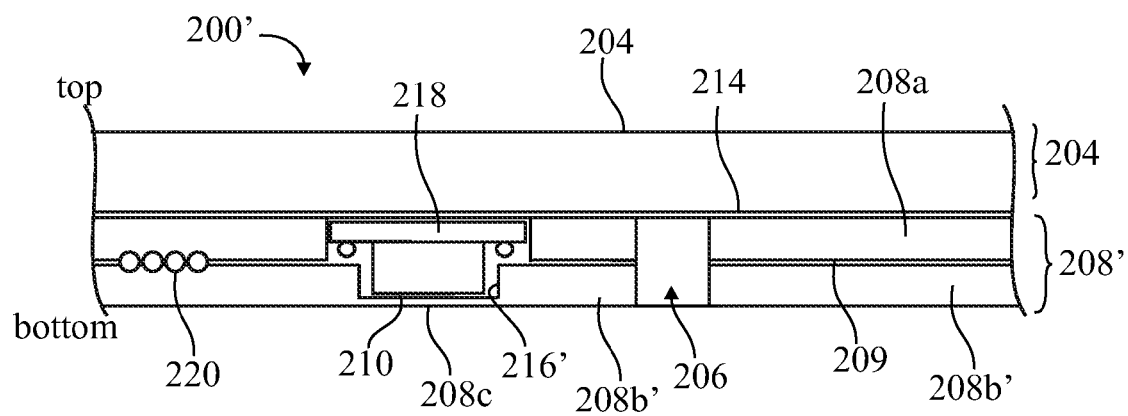

FIG. 2I is a cross-sectional view, illustrating a passport cover comprising a multi-layer inlay substrate and a chip module in a pocket-type recess of the inlay substrate, according to an embodiment of the invention.

Figure 2J:
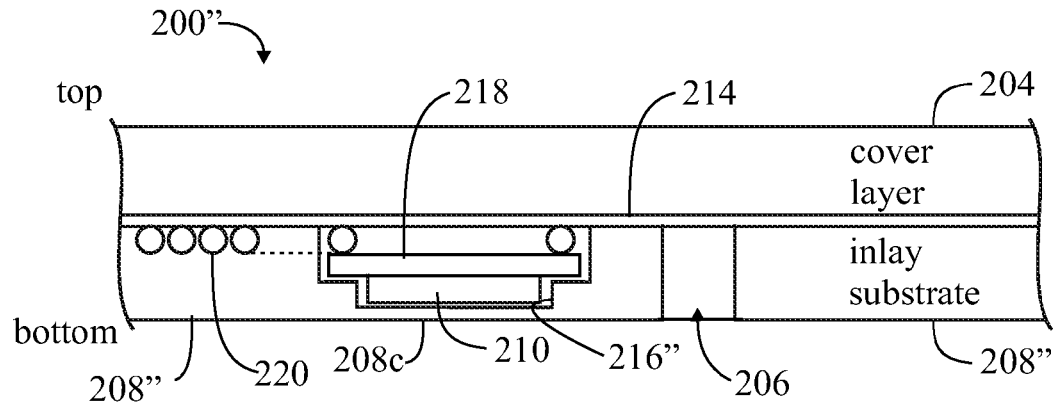

FIG. 2J is a cross-sectional view, illustrating a passport cover comprising a single layer inlay substrate and a chip module in a pocket-type recess of the inlay substrate, according to an embodiment of the invention.

Figure 3A:
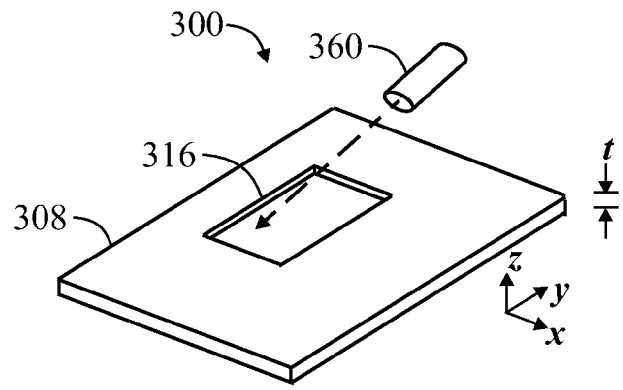

FIG. 3A is a perspective view illustrating a technique for forming a recess in an inlay substrate using laser ablation, according to an embodiment of the invention.

Figure 3B:
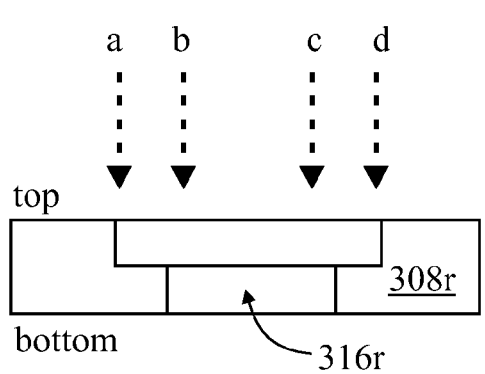

FIG. 3B is a cross-sectional view illustrating a technique for forming a recess in an inlay substrate using laser ablation, according to an embodiment of the invention.

Figure 3D:
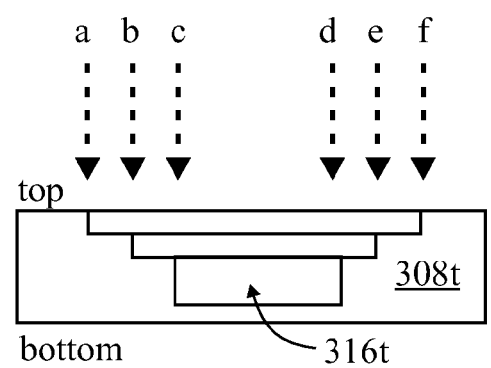
Figure 3C:
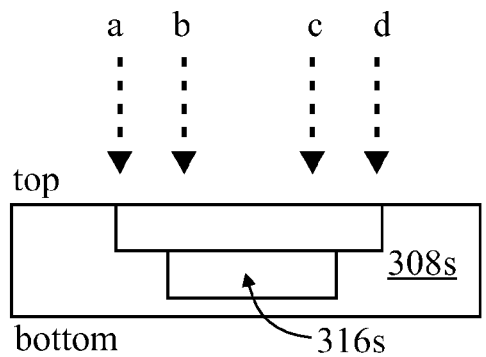

FIG. 3C is a cross-sectional view illustrating a technique for forming a recess in an inlay substrate using laser ablation, according to an embodiment of the invention.

FIG. 3D is a cross-sectional view illustrating a technique for forming a recess in an inlay substrate using laser ablation, according to an embodiment of the invention.

Figure 4A:
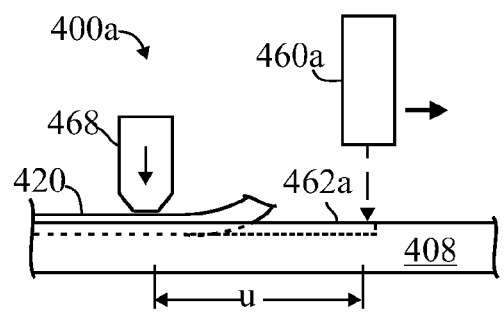

FIG. 4A is a cross-sectional view illustrating a technique for creating channels for mounting an antenna wire in an inlay substrate, according to an embodiment of the invention.

Figure 4B:
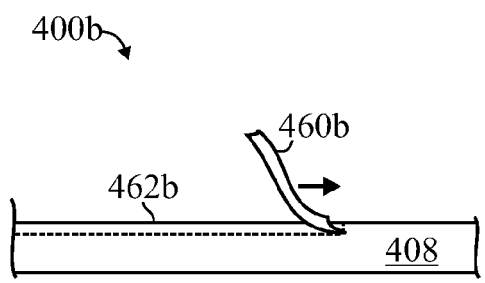

FIG. 4B is a cross-sectional view illustrating a technique for creating channels for mounting an antenna wire in an inlay substrate, according to an embodiment of the invention.

Figure 4C:
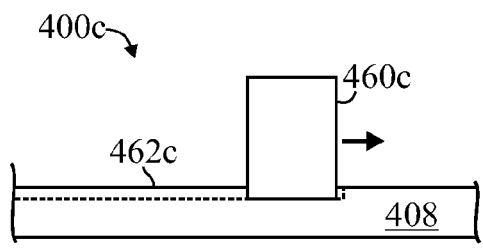

FIG. 4C is a cross-sectional view illustrating a technique for creating channels for mounting an antenna wire in an inlay substrate, according to an embodiment of the invention.

Figure 4D:
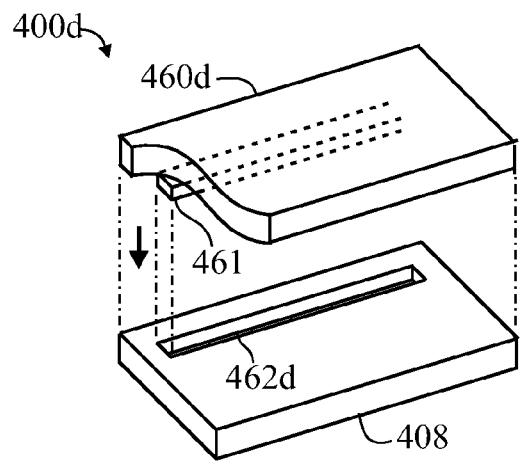

FIG. 4D is a perspective view illustrating a technique for creating channels for mounting an antenna wire in an inlay substrate, according to an embodiment of the invention.

Figure 4E:
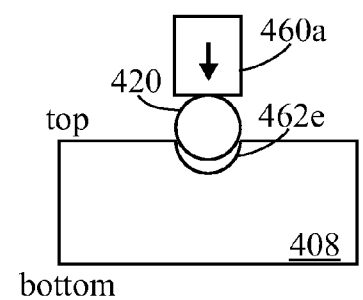

FIG. 4E is a cross-sectional view illustrating mounting an antenna wire in a channel, according to an embodiment of the invention.

Figure 4F:
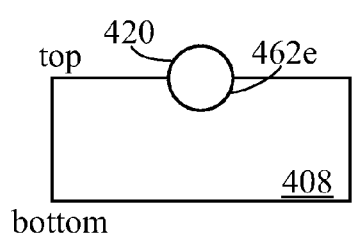

FIG. 4F is a cross-sectional view illustrating an antenna wire mounted in a channel, according to an embodiment of the invention.

Figure 4G:
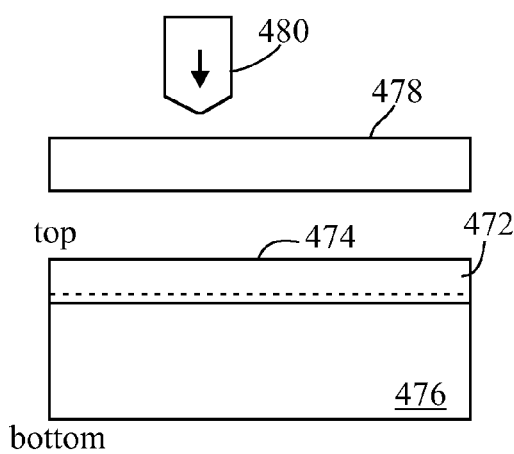

FIG. 4G is a cross-sectional view illustrating mounting an antenna wire in a channel, according to an embodiment of the invention.

Figure 4H:
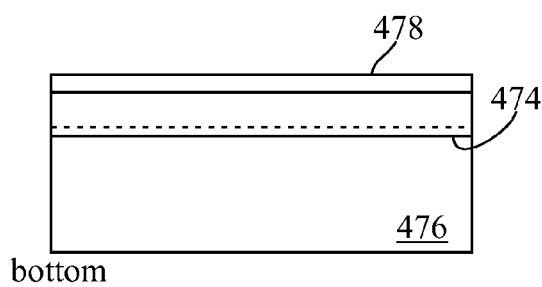

FIG. 4H is a cross-sectional view illustrating an antenna wire mounted in a channel, according to an embodiment of the invention.

Figure 4I:
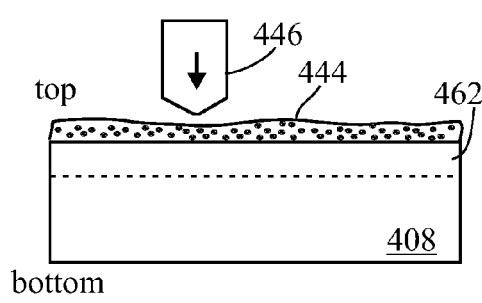

FIG. 4I is a cross-sectional view illustrating a flowable, conductive material being applied on a surface of a substrate to fill a channel, according to an embodiment of the invention.

Figure 4J:
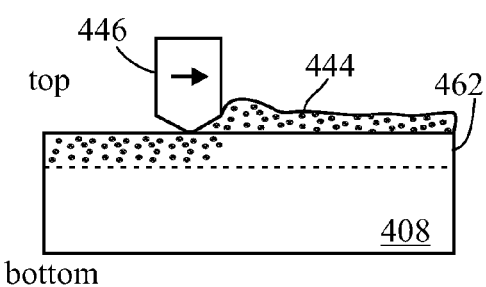

FIG. 4J is a cross-sectional view illustrating a further step in the technique of applying a flowable, conductive material on a surface of a substrate to fill a channel, according to an embodiment of the invention.

Figure 4K:
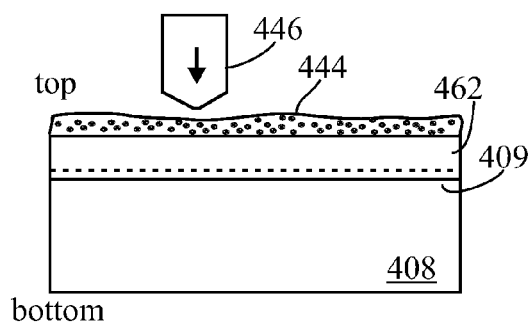

FIG. 4K is a cross-sectional view illustrating a flowable, conductive material being applied to fill a channel in a layer of adhesive, according to an embodiment of the invention.

Figure 4L:
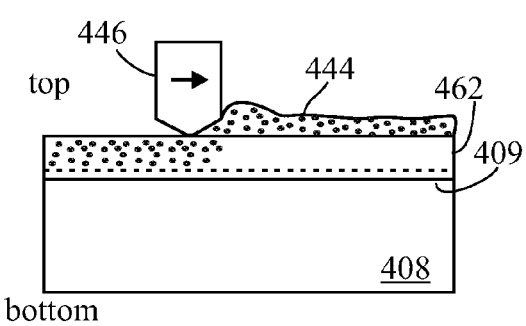

FIG. 4L is a cross-sectional view illustrating a further step in the technique of applying a flowable, conductive material to an adhesive layer to fill a channel, according to an embodiment of the invention.

Figure 4M:
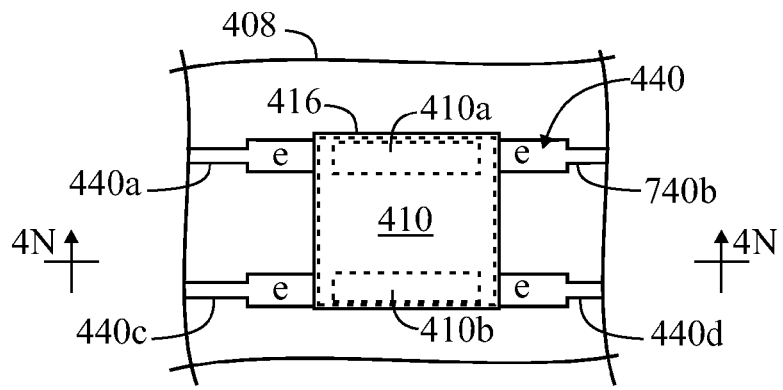

FIG. 4M is a top of an inlay substrate with recess for a leadframe-type chip module and channels for a flowable, conductive material, according to an embodiment of the invention.

Figure 4N:
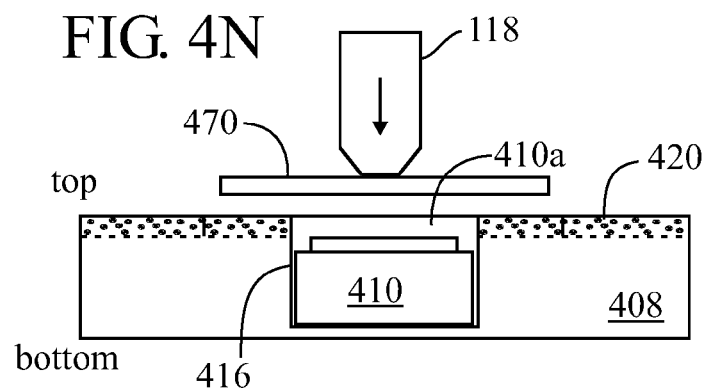

FIG. 4N is a cross-sectional view illustrating a flowable, conductive material in channels formed in a surface of a substrate, and connecting the conductive material to terminals of a chip module, according to an embodiment of the invention.

Figure 4P:
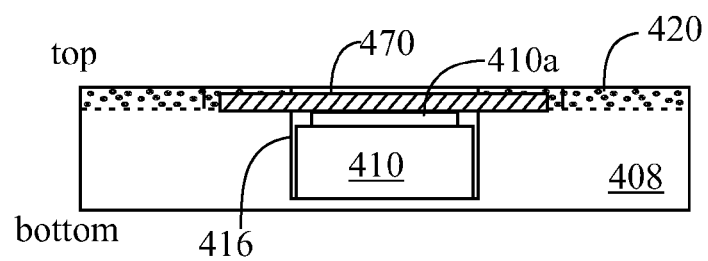

FIG. 4P is a cross-sectional view illustrating a further step in the technique of connecting a flowable, conductive material in channels formed in a surface of a substrate with terminals of a chip module, according to an embodiment of the invention.

Figure 4Q:
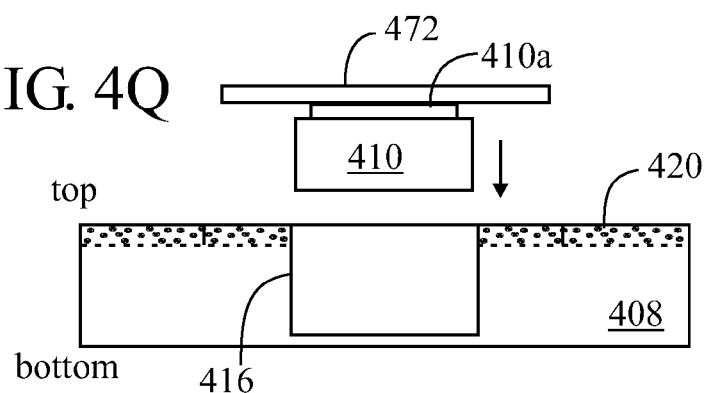

FIG. 4Q is a cross-sectional view of a technique for connecting a flowable, conductive material in channels formed in a surface of a substrate with terminals of a chip module, according to an embodiment of the invention.

Figure 5A:
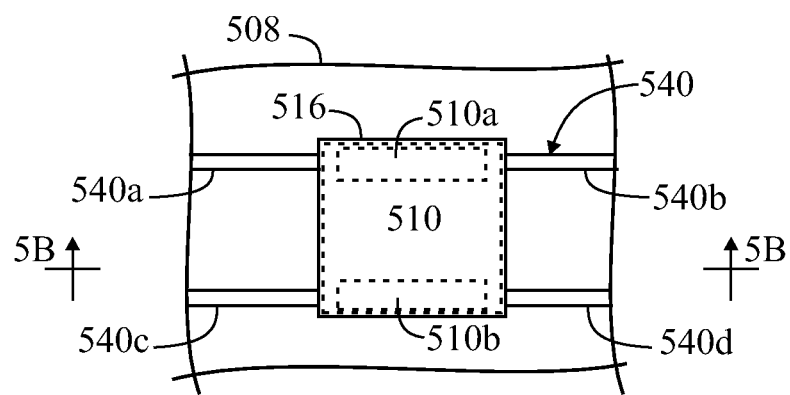

FIG. 5A is a top of an inlay substrate with recess for a leadframe-type chip module and channels for antenna wire, according to an embodiment of the invention.

Figure 5B:
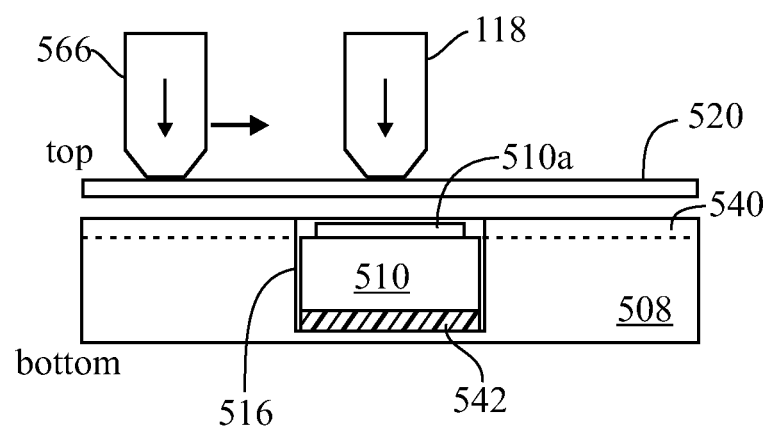

FIG. 5B is a side, cross-sectional view of the inlay substrate of FIG. 5B, showing embedding an antenna wire in the channel, and bonding end portions of the antenna wire to terminals of the chip module, according to an embodiment of the invention.

Figure 5C:
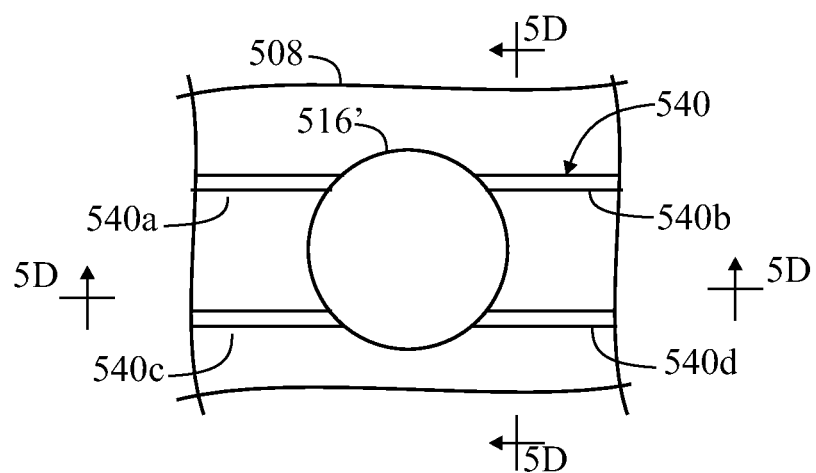

FIG. 5C is a top of an inlay substrate with recess for an epoxy glass type chip module and channels for antenna wire, according to an embodiment of the invention.

Figure 5D:
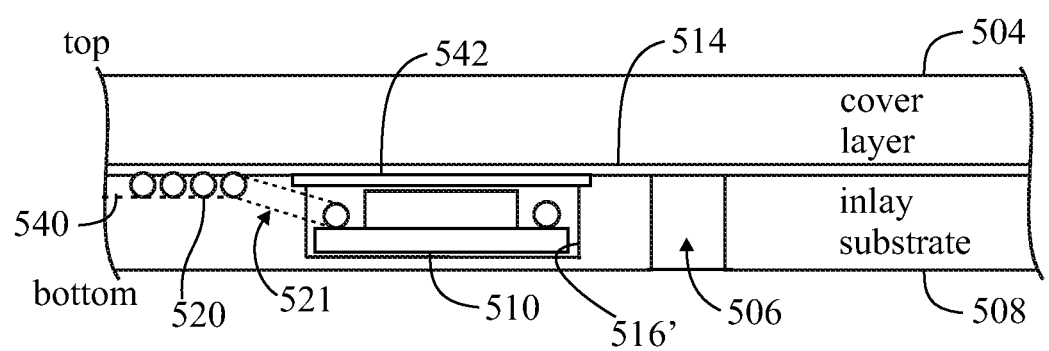

FIG. 5D is a side, cross-sectional view of the inlay substrate of FIG. 5C, showing embedding an antenna wire in the channel, and bonding end portions of the antenna wire to terminals of the chip module, according to an embodiment of the invention.

Figure 6A:
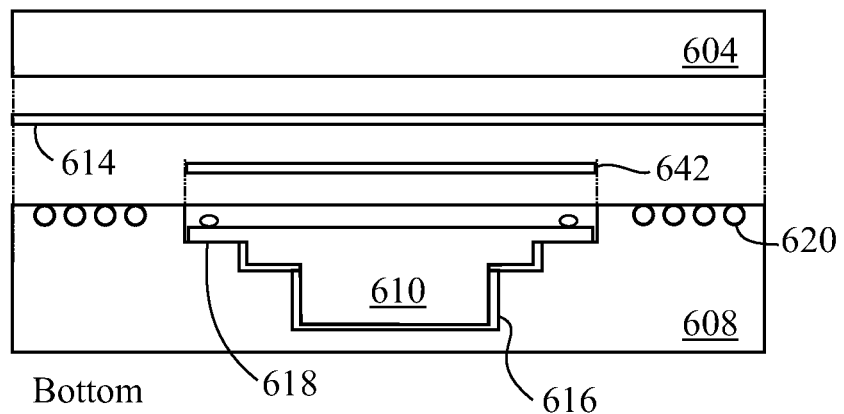

FIG. 6A is a cross-sectional view, illustrating an inlay substrate with a pocket-type recess, and a patch (lid) covering an opening of the recess, according to an embodiment of the invention.

Figure 6B:
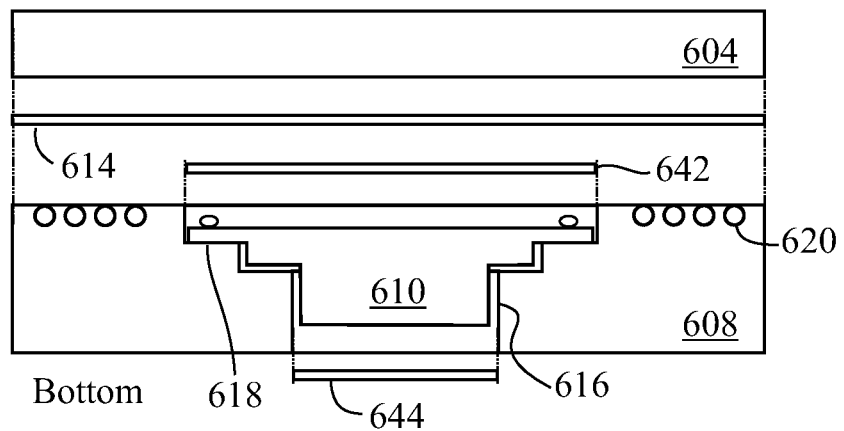

FIG. 6B is a cross-sectional view, illustrating an inlay substrate with a window-type recess, and patches (lids) covering openings in the top and bottom of the recess, according to an embodiment of the invention.

Figure 7A:
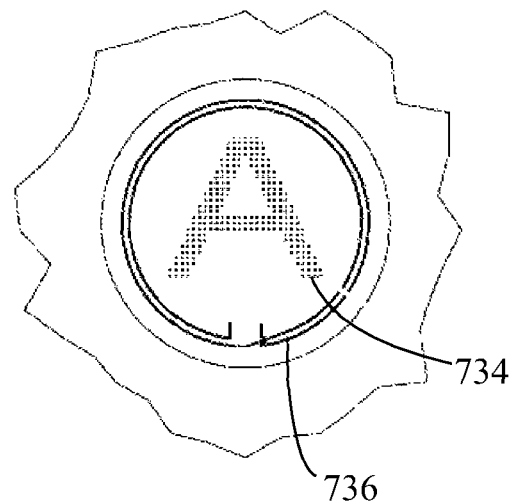

FIG. 7A is a top view of a security feature which may be used in an embodiment of the invention.

Figure 7B:
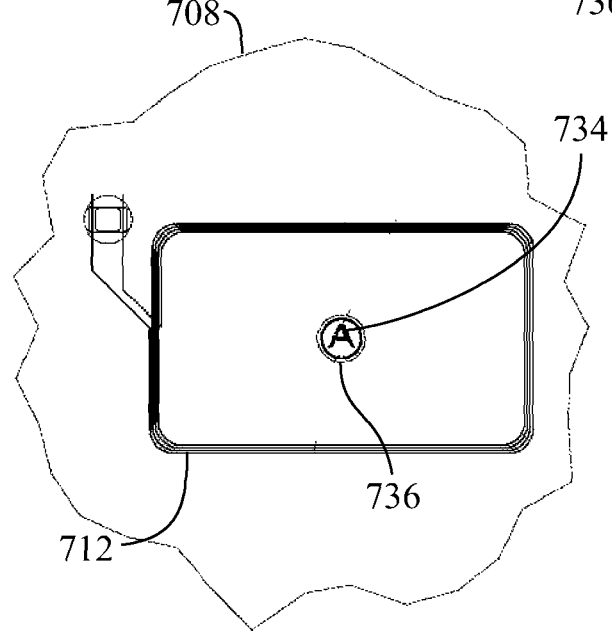

FIG. 7B is a top view of a the security feature of FIG. 7A.

Figure 7C:
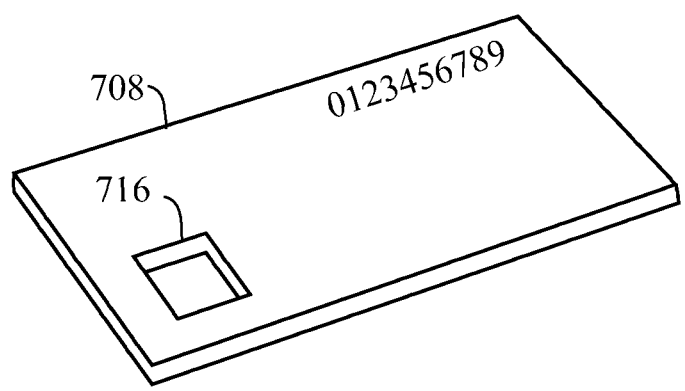

FIG. 7C is a perspective view of a security feature which may be used in an embodiment of the invention.

Figure 7D:
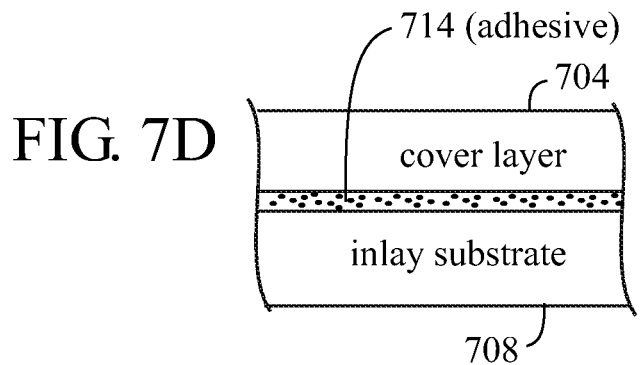

FIG. 7D is a cross-sectional view of a security feature which may be used in an embodiment of the invention.

Figure 7E:
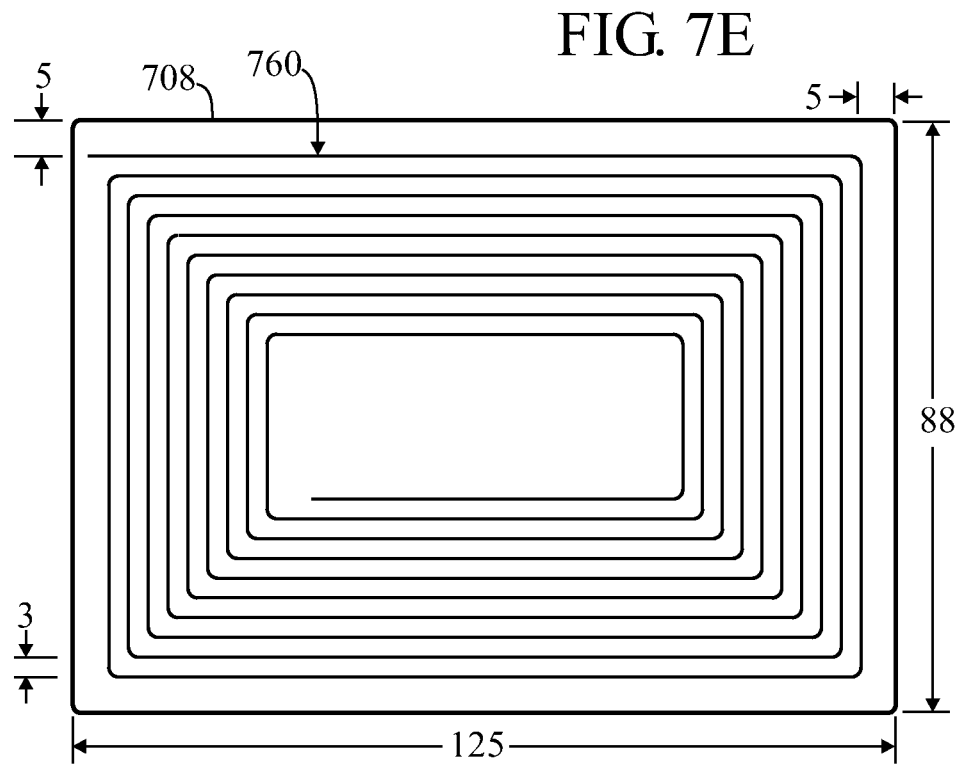

FIG. 7E is a top view of a security feature which may be used in an embodiment of the invention.

Figure 7F:
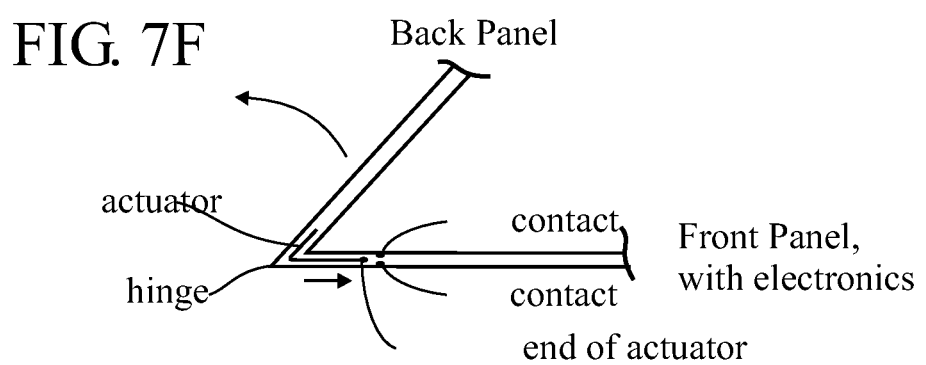

FIG. 7F is a diagrammatic cross-sectional view of a security feature which may be used in an embodiment of the invention.

Figure 8A:
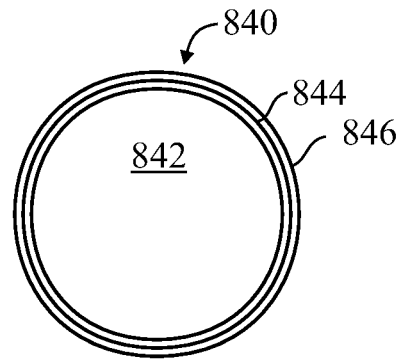

FIG. 8A is a cross-sectional view of a coated wire which may be used with embodiments of the invention.

Figure 8B:
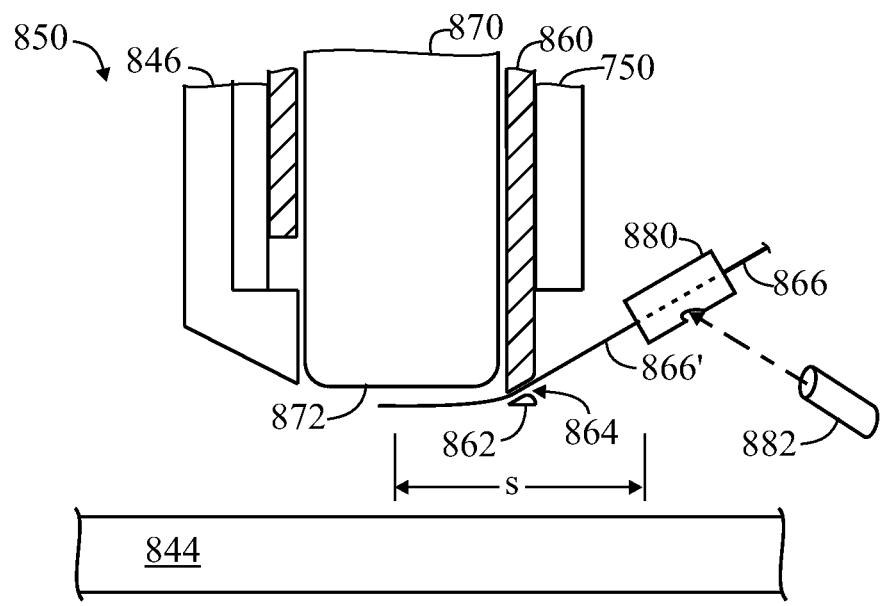

FIG. 8B is a cross-sectional view of a using a laser to remove insulation from a coated wire, a feature which may be used with embodiments of the invention.

Figure 8C:
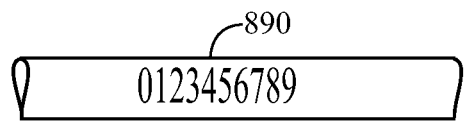

FIG. 8C is a cross-sectional view of a security feature which may be used with embodiments of the invention.

Figure 8D:
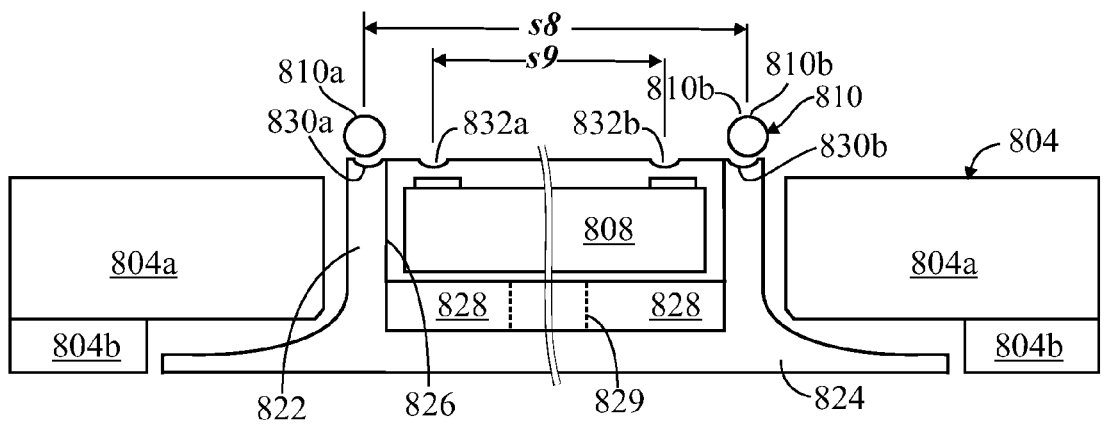

FIG. 8D is a cross-sectional view showing a technique for direct connection of the antenna wire to an RFID chip, according to an embodiment of the invention.

Figure 8E:
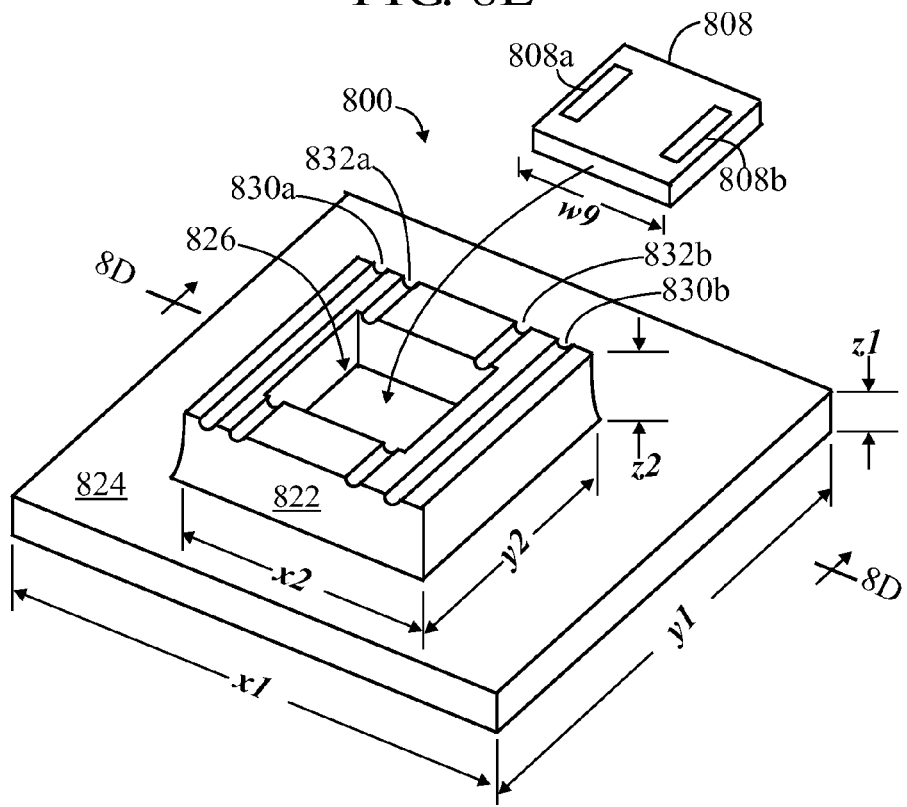

FIG. 8E is a perspective view related to the technique for direct connection, according to an embodiment of the invention.

Figure 8F:
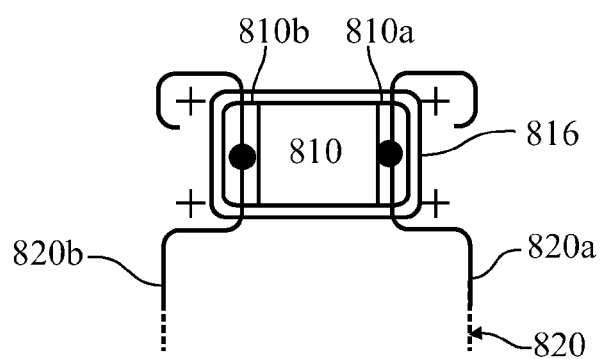

FIG. 8F is a plan view of a feature of an embodiment of the invention.

Figure 9A:
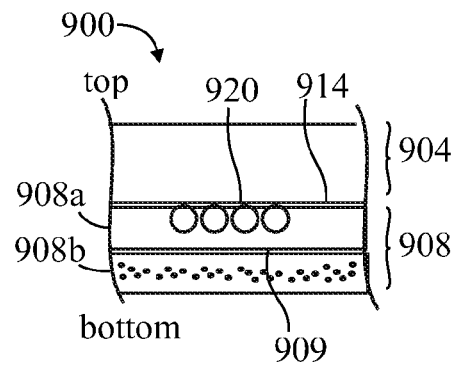

FIG. 9A is a cross-sectional view showing an embodiment of incorporating ferrite material into the inlay substrate, according to an embodiment of the invention.

Figure 9B:
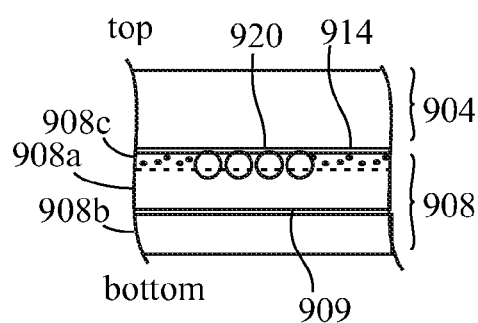

FIG. 9B is a cross-sectional view showing an embodiment of incorporating ferrite material into the inlay substrate, according to an embodiment of the invention.

Figure 9C:
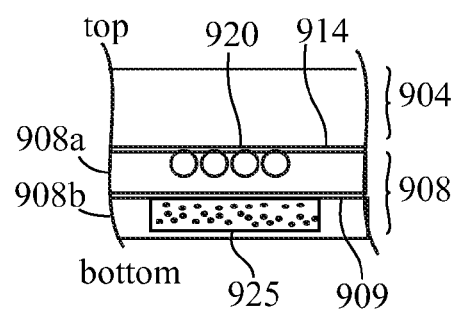

FIG. 9C is a cross-sectional view showing an embodiment of incorporating ferrite material into the inlay substrate, according to an embodiment of the invention.

Figure 9D:
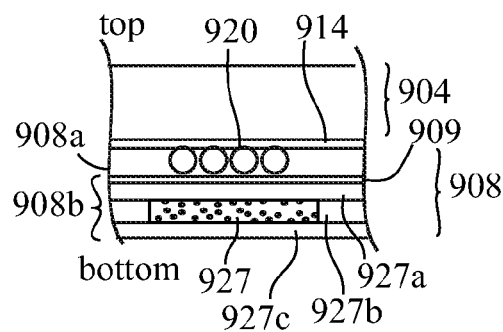

FIG. 9D is a cross-sectional view showing an embodiment of incorporating ferrite material into the inlay substrate, according to an embodiment of the invention.

Figure 9E:
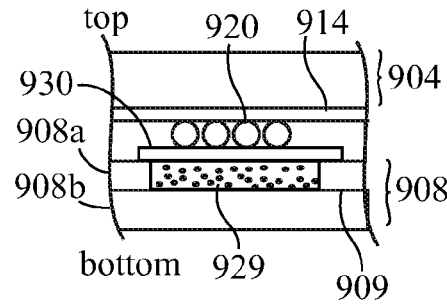

FIG. 9E is a cross-sectional view showing an embodiment of incorporating ferrite material into the inlay substrate, according to an embodiment of the invention.

Figure 10A:
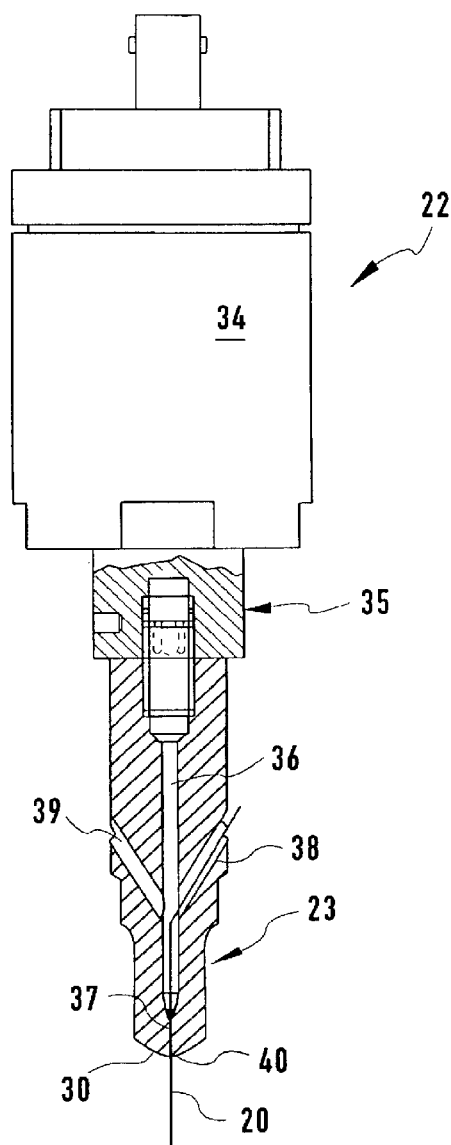

FIG. 10A is a side view of a sonotrode of the prior art (such as in U.S. Pat. No. 6,698,089).

FIG. 10B is a cross-sectional view of an ultrasonic wire guide (embedding) tool, according to an embodiment of the invention.

FIG. 10C is a perspective view of the ultrasonic wire guide tool shown in FIG. 9B.

DETAILED DESCRIPTION

Various "embodiments" of the invention (or inventions) will be discussed. An embodiment is an example or implementation of one or more aspects of the invention(s). Although various features of the invention(s) may be described in the context of a single embodiment, the features may also be provided separately or in any suitable combination. Conversely, although the invention(s) may be described herein in the context of separate embodiments for clarity, the invention(s) may also be implemented in a single embodiment.

The relationship(s) between different elements in the figures may be referred to by how they appear and are placed in the drawings, such as "top", "bottom", "left", "right", "above", "below", and the like. It should be understood that the phraseology and terminology employed herein is not to be construed as limiting, and is for descriptive purposes only.

The invention relates generally to inlays and techniques for making the inlays, including technical features and security features. As used herein, an "inlay" may be a single- or multi-layer substrate containing HF (high frequency) and/or UHF (ultra-high frequency) radio frequency identification (RFID, transponder) chips and/or modules. These inlays may be used in secure documents, such as, but not limited to, electronic passports (ePassports) and electronic ID (eID) cards.

Some Embodiments of the Invention

Various embodiments of the invention will be presented to illustrate the teachings of the invention(s). In the main, examples of electronic passport covers with inlay substrates having leadframe modules may be used to illustrate the embodiments. It should be understood that various embodiments of the invention(s) may also be applicable to other secure documents containing electronics (such as RFID and antenna), such as electronic ID cards. Secure documents may also be referred to as "electronic documents". In the main hereinafter, secure documents which are passport inlays, typically cold laminated (with adhesive), are discussed.

The following embodiments and aspects thereof may be described and illustrated in conjunction with systems, tools and methods which are meant to be exemplary and illustrative, not limiting in scope. Specific configurations and details may be set forth in order to provide an understanding of the invention. However, it should be apparent to one skilled in the art that the invention(s) may be practiced without some of the specific details being presented herein. Furthermore, well-known features may be omitted or simplified in order not to obscure the descriptions of the invention(s).

A Multi-Layer Inlay Substrate, and a Patch (FIGS. 2A, 2B)

FIGS. 2A and 2B illustrate embodiments of a secure document which is an inlay 200 suitable for use as a passport cover. The inlay 200 comprises a multiple-layer inlay substrate 208 and a cover layer 204 cold laminated (adhesively attached, joined) to the inlay substrate 208 with a layer 214 of adhesive such as 50 μm, which may be applied by roller coater.

A hinge gap 206 is shown in FIG. 2A (and in other figures). The hinge gap 206 may simply be a gap, approximately 1 mm wide, between a left (as viewed) portion of the inlay substrate 208 and a right (as viewed) portion of the inlay substrate 208. The left portion of the inlay 200 corresponds to the front of the passport cover (FIG. 1A), and the right portion of the inlay 200 corresponds to the back portion of the passport cover (FIG. 1A).

Notice that, in FIG. 1G, the hinge gaps 106 do not completely separate the back portion of the inlay substrate from the front portion, they are still joined by a "web". Typically, the gap is punched or cut after adhesive coating and pre-press lamination (to smooth the surface).

The cover layer 204 is generally a planar sheet or layer of flexible, durable, often "textile-type" material, such as PVC, coated offset board, with or without optical bleacher or acrylic coated cotton.

The inlay substrate 208 (both layers 208a and 208b) is generally a planar layer or sheet of flexible, durable, typically "plastic-type" material, such as Teslin™, PVC, Polycarbonate (PC), polyethylene (PE) PET (doped PE), PETE (derivative of PE), and the like. The material of the inlay substrate may be referred to as "synthetic paper".

The inlay substrate, or a bottom layer thereof (particularly when the antenna is embedded on a top surface of the top layer), can also be conductive, such as a ferrite-coated or ferrite-containing substrate to reflect or absorb electromagnetic energy. This is indicated by the particles (dots) in the bottom inlay substrate layer 208b of FIG. 2A.

FIG. 9A (compare FIG. 2A) illustrates a multi-layer inlay substrate 908 (compare 208). The inlay substrate 908 comprises an upper layer 908a (compare 208a) laminated with an adhesive 909 (compare 209) to a lower layer 908b (compare 208b). A cover layer 904 (compare 204) may be laminated with an adhesive 914 (compare 214) to the inlay substrate 908.

A ferrite layer (dots) can be created in a synthetic substrate layer 908b beneath the layer 908a in which the antenna wire 920 (or conductive material forming an antenna) is located, being applicable to all types of antennae such as wire embedded, etched or conductive ink antennae.

FIG. 9B illustrates that the inlay substrate layer 908a in which the antenna wire 920 is embedded may be a ferrite-coated synthetic layer (having a ferrite coating 908c). Since the antenna wire 920 is embedded in the ferrite-containing material, a coated (insulated) antenna wire, such as shown in FIG. 8A should be used. See, for example, Flexield Series Flexible Composite-Type Electromagnetic Shield Materials For 13.56 MHz RFID System, TDK Corporation, Tokyo Japan, incorporated by reference herein. See also U.S. Pat. No. 4,539,433, incorporated by reference herein. For a multi-layer inlay substrate, this could be the top layer (208a).

FIG. 9C illustrates that a recess (or cavity) may be created by mechanically milling or laser ablating a layer of the inlay substrate, then filling the recess with ferrite material (metal or nano-metal particles) and conductive polymers, to create a 3D ferrite-structured layer. Here, the lower layer 908b is provided with the recess 925 which is filled with ferrite particles. The recess 925 may extend completely through the layer 908b, or only partially through the layer 908b. After the ferrite filling is cured, the area may be sealed with a patch (not shown) of synthetic material.

The ferrite material can be applied using digital non-impact inkjet printing, conventional printing (flexography, gravure, screen printing, offset) or dispensing. The area of the ferrite layer is larger than the area occupied by the antenna, in order to ensure optimal reflection of the electromagnetic energy.

FIG. 9D illustrates that the recess to accommodate the ferrite material can also be produced by using multiple layers with a cavity or cavities in the center substrate layer or layers. Only the bottom layer 908b is shown, for illustrative clarity.

Here, the bottom layer 908b comprises a sandwich construction of a top layer 927a, a middle layer 927b and a bottom layer 927c. The middle layer 927b has a window-type recess 927 extending completely therethrough, and filled with ferrite material.

FIG. 9E (compare FIG. 9C) illustrates that the ferrite material may be disposed in a recess 929, such as in the top layer 908a, and after the ferrite filling is cured, the area may be sealed with a patch 930 of synthetic material. The antenna wire 220 can also be embedded into the same layer as the ferrite material and routed across the sealed patch 930 to form the antenna pattern.

Returning to FIGS. 2A and 2B, an antenna wire 220 is mounted to a top surface of the inlay substrate 208, and a chip module 210 is disposed in a recess 216 extending into the inlay substrate 208 from a top surface thereof. The antenna wire 220 may comprise 4 or 5 turns of wire, such as approximately 80 μm diameter (thick) wire. Ends of the antenna wire 220 are connected to terminals of the chip module 210.

The recess 216 may be a window-type recess extending completely through the inlay substrate 208 to the bottom surface thereof. of the inlay substrate.

The chip module 210 may be a leadframe-type chip module comprising a chip mounted on a leadframe 218 and encapsulated by a mold mass 212. The leadframe 218 may be approximately 80 μm thick and 8 mm wide. The mold mass 212 may be approximately 240 μm thick and 5 mm wide. The chip module 210 may have an overall size (width dimensions) of 5.1×8.1 mm and an overall thickness of 320 μm. The width of the recess 216 should be sufficient to accommodate the chip module (including leadframe 218), with some clearance.

The inlay substrate 208 comprises two or more layers 208a and 208b which are laminated (adhesively attached, joined) one another with a layer (or layers) 209 of adhesive such as 50-80 μm, which may be applied by a roller coater. In the main hereinafter, a two-layer example of an inlay substrate 208 will be described, comprising an upper (topmost) layer 208a and a lower (bottommost) layer 208b.

The recess 216 for the chip module 210 extends into the inlay substrate 208 from the top surface of the topmost layer 208a, through the topmost layer 208a, and at least partially into the bottommost layer 208b. The recess 216 extends fully through the entire inlay substrate 208, including fully through the bottommost layer 208a, exiting the inlay substrate 208 at the bottom of the bottommost layer 208b.

The recess 216 is "stepped" in that it has a larger width dimension opening at the top surface of the inlay substrate 208 than at the bottom surface of the inlay substrate 208. For example, a top portion of the recess 216, for accommodating the leadframe 218 has a width dimension of 5.3×8.1 mm, and a bottom portion of the recess 216 for accommodating the mold mass 212 has a width dimension of 5.1×5.1 mm.

The stepped recess 216 may be formed by a first opening having a first width dimension in the topmost layer 208a, second opening having a second width dimension in the next adjacent (which is the bottommost) layer 208b. When the layers 208a and 208b are assembled with one another, the openings in the layers 208a and 208b are aligned (such as concentric) with one another. The first width dimension is different than the second width dimension. The first width dimension, for accommodating the leadframe, is shown greater than the second width dimension, for accommodating the mold mass.

The openings of the recess 216 in the layers 208a and 208b may be any appropriate shape, such as rectangular for a rectangular chip module or circular for a circular (round) chip module. The openings may be formed by a mechanical punch operation.

In the prior art (FIG. 1H), a stepped recess may be formed in a single layer inlay substrate 108. by compressing the substrate using an ultrasonic stamp. An advantage of forming the inlay substrate 208 with (at least) two layers 208a and 208b is that the stepped recess may be formed more easily, and precisely.

The chip module 110 disposed in the recess 216 in such a way that the leadframe 218 is nearly flush with the upper surface of the top substrate layer 208a and the mold mass of the chip module is nearly flush with a bottom side of the bottom substrate layer 208b. However, note that the end portions of the antenna wire 220 are connected (bonded) to the top surface of the leadframe 218 (opposite the chip and mold mass which are on the bottom surface of the leadframe 218. Also note that the diameter of the antenna wire 220 is decreased where it is bonded to the leadframe 218. For example, the 80 μm wire may be compressed to approximately 40 μm during thermo-compression bonding.

In the finished inlay substrate 208, which may be considered an "interim product", all of the components (chip module 210 and antenna 220) mounted in or to the inlay substrate 208 should not project beyond the surface of the inlay substrate 208.

In FIG. 2A, the antenna wire 220 is embedded (disposed) in a top surface of the topmost substrate layer 208a, and is connected with a top surface of the leadframe 218.

In FIG. 2B, the antenna wire is embedded between the two adjacent inlay substrate layers 208a and 208b, such as in a top surface of the bottom substrate layer 208b, or in the bottom surface of the top substrate layer 208a.

FIG. 2B differs from FIG. 2A in that the antenna wire (which may be self-bonding wire) is disposed between the two substrate layers 208a and 208b (rather than atop the top layer 208a). This may be accomplished by:

first, with the top layer 208a inverted (bottom side up), partially embedding the antenna wire 220 into the bottom surface of the top layer 208a, without countersinking the antenna wire 220 entirely, leaving the antenna wire 220 to protrude above the layer. For example, the antenna wire 220 is embedded only approximately 30-70% of its diameter into the bottom surface of the top layer 208a, leaving 70-30% protruding above the bottom surface of the top layer 208a. Or, the antenna wire 220 is embedded only approximately 40% or 50% of its diameter into the bottom surface of the top layer 208a leaving 60% or 50%, respectively, protruding above the bottom surface of the top layer 208a. See FIG. 2C.

then, in a second step, the top layer 208a is flipped over (top side up), and is adhesively attached to the bottom layer 208b carrying the antenna, whereby the protruding antenna wire 220 is positioned face down onto the top surface of the bottom layer 208b, before lamination. In the lamination process, the antenna wire 220 sinks into the bottom layer 208b. The lamination process has also the advantage of "disguising" the position of the antenna in the two layered inlay substrate structure and creating a smooth and even surface on each external surface (top surface of the top layer, bottom surface of the bottom layer) of the multi-layered inlay substrate structure. See FIGS. 2D and 2E.

Another feature of FIG. 2B is the wire ends of the antenna are connected to the face-down side of the chip module leadframe.

An advantage of this inlay construction is that any attempt to peel the two layers apart, results in the destruction of the antenna and the wire interconnections to the chip module.

The chip module may be mounted face-down into the first layer 208a, then the antenna 208 is scribed into the opposite side of the first layer 208a, and the wire ends are connected to the chip module 210.

During the lamination process, the adhesive 209 compresses, some squeezes out, and some may get absorbed into the cover layer during the lamination process. After lamination, the adhesive layer 209 may be only 20 μm thick. The layers 208a and 208b may be "pre-pressed" with a hot laminator to smooth the surface and hide the wires.

During embedding of the antenna wire, the wires "mark" the inlay substrate. The material may be flattened by putting the inlay substrates through temperature and pressure for about 30 minutes.

A security feature of the antenna wire location (between the two layers) shown in FIG. 2B is that if an attempt is made to pull the chip module out of the inlay, this may destroy the interconnections and wire antenna.

It should be understood that there are various "combinations" of module orientation and interconnection location which may be shown in FIGS. 2A & 2B, 2F & 2G, 2H, 2I & 2J, 5B, 5G, 6A & 6B. Generally, the module can be mounted face down or face up and the interconnections thereto can be on the top of the module such as is the case with a leadframe or underneath the chip carrier (epoxy glass or leadframe).

FIGS. 2C, 2D and 2E show a method of making the inlay substrate 208 of FIG. 2B.

- (FIG. 2C) with the top layer 208a inverted (or, invert the top layer 208a), so the bottom surface is facing up, partially embed the antenna wire 220 in the upward-facing bottom surface of the top layer 208a, leaving a portion of the (diameter of) the antenna wire protruding from the surface;
- (FIG. 2D) flip over (un-invert) the top layer 208a so that its bottom surface is facing downwards (and top surface is facing upwards).
- (FIG. 2E) laminate (with adhesive) the top layer 208a (which has the antenna wire protruding from the surface) to the bottom layer 208b, thereby embedding the protruding portion of the antenna wire 220 into the top surface of the bottom layer 208b.

Alternatively, the antenna wire 220 can first be partially embedded in the top surface of the bottom layer 208b, then in the lamination process, sunk into the bottom surface of the top layer 208a.

Alternatively, the antenna wire 220 can be positioned between two adjacent layers of the inlay substrate, then partially embedded into both layers, adhesively bonded and then laminated to form one cohesive electronic laminate layer. Any attempt to separate the two layers may result in the destruction of the antenna and the wire-end connections to the chip module.

Some additional exemplary dimensions for the inlay 200 are:

- overall thickness of the inlay 200, approximately 700 μm (0.700 mm), including cover layer 204 and adhesive layers 214 and 209
- thickness of the cover layer 204, approximately 300 μm
- thickness of the inlay substrate 208, approximately 356 μm
- thickness of each layer 208a and 208b of the inlay substrate 208, approximately 145 μm
- thickness of the adhesive 209 joining the two inlay substrate layers 208a and 208b, approximately 50 μm
- thickness of the adhesive 214 joining the cover layer 204 to the topmost layer 208 of the inlay substrate 208, approximately 50 μm FIG. 2B also illustrates a "deep trench" formed extending from the bottom surface of the top layer, to within the top layer 208a, for routing the antenna wire 220 to the chip module 510. The formation of "channels" and "deep trenches" is discussed in greater detail hereinbelow, such as with respect to FIGS. 4A and 5D An additional feature shown in FIGS. 2A and 2B is a patch 230 covering (overlying) the chip module 210 and connections with the antenna wire 220. For example, the patch 230 may be made of the same material as the substrate (such as Teslin™)—laminated, adhesively attaches, ultrasonic or laser welding—50 μm thick. This patch 230 is not exclusive to the inlay substrate 208, rather it could be used, for example, with the inlay substrate 108 of FIG. 1H.

In situations where the recess 216 extends completely through the inlay substrate 208, the patch 230 may seal the area of the chip module 210 from moisture. The patch 230 may be moisture-resistant.

The patch 230 can be antistatic, to protect the chip module from electrostatic discharge.

The patch 230 may comprise a material that is luminous under ultraviolet (UV) light, so that tampering with the patch can be exposed by presenting the inlay 208 to an ultraviolet light source. As is known, To help thwart counterfeiters, sensitive documents (e.g. credit cards, driver's licenses, passports) may also include a UV watermark that can only be seen when viewed under a UV-emitting light. Passports issued by most countries usually contain UV sensitive inks and security threads. Visa stamps and stickers on passports of visitors contain large and detailed seals invisible to the naked eye under normal lights, but strongly visible under UV illumination. Passports issued by many nations have UV sensitive watermarks on all pages of the passport. Currencies of various countries' banknotes have an image, as well as many multicolored fibers, that are visible only under ultraviolet (UV) light.

FIGS. 2F and 2G illustrate embodiments of a secure document which is an inlay 200 suitable for use as a passport cover. A cover layer 204 is laminated with adhesive 214 to a multi-layer inlay substrate 208 comprising at least two layers 208a and 208b' (prime), laminated with an adhesive 209 to one another. A chip module 210 comprising a chip (not shown), a leadframe 218 and a mold mass 212 is disposed in a recess 216 extending into the inlay substrate 208 from a top surface thereof, and the recess 216 is stepped.

FIG. 2F illustrates an embodiment of a secure document which is an inlay 200 suitable for use as a passport cover. This inlay is substantially the same as the inlay 200 shown in FIG. 2A (multi-layer inlay substrate 208, antenna wire 220 on top of top inlay substrate layer 208a), with the addition of a strip (or stripe) 232 of a material, such as metal or Mylar, having a thickness of approximately 10 μm applied around the area where the patch 230 and the inlay substrate 208 (the bottom of the bottom inlay layer 208b) meet, bridging any gap between the bottom of the patch 230 and the bottom of the inlay substrate 208. The stripe 232 crosses any void between the patch 230 and the bottom surface of the inlay substrate 208.

FIG. 2G illustrates an embodiment of a secure document which is an inlay 200 suitable for use as a passport cover. This inlay is substantially the same as the inlay 200 shown in FIG. 2B (multi-layer inlay substrate 208, antenna wire 220 between the two substrate layers 208a and 208b). However, rather than using a patch (230), an epoxy filling 234, which may be luminescent under UV light, may be disposed in the recess, surrounding the chip module and the antenna wire interconnections. This may provide evidence of tampering when exposed to an ultraviolet light source.

FIGS. 2H and 2I show "variations" of inlays shown in FIGS. 2A and 2B. In most respects, the inlays 200' (prime) of FIGS. 2E and 2F are similar to the inlays 200 of FIGS. 2A and 2B. A cover layer 204 is laminated with adhesive 214 to a multi-layer inlay substrate 208 comprising at least two layers 208a and 208b' (prime), laminated with an adhesive 209 to one another. A chip module 210 comprising a chip (not shown), a leadframe 218 and a mold mass 212 is disposed in a recess 216 extending into the inlay substrate 208 from a top surface thereof, and the recess 216 is stepped.

In FIG. 2H, in a manner similar to that shown in FIG. 2A, the antenna wire 220 extends along (within) the top surface of the top layer 208a, and connects to the top surface of the leadframe 218.

In FIG. 2I, in a manner similar to that shown in FIG. 2B, the antenna wire 220 is disposed between the top layer 208a and the bottom layer 208b, and connects to the bottom surface of the leadframe 218.

A feature shown in the embodiments of FIGS. 2H and 2I (and 2J), is that rather than the recess 216 being a "window-type" recess extending completely through the inlay substrate 208' (prime), the recess 216' (prime) is a "pocket-type" recess extending only partially through the inlay substrate 208'. In the embodiments of FIGS. 2H and 2I, the recess 216' stops short of the bottom surface of the bottom layer 208b', leaving (for example) approximately 10 μm of material 208c directly under the chip module 210. This essentially eliminates the need for the patch 230 (FIGS. 2A, 2B), since there is no opening at the bottom surface of the inlay substrate 208' caused by the recess 216'.

At "first glance" it may appear that the multi-layer inlay substrate 208 is not significantly different than the "one or more" top layers 104a of the inlay sheet 100 shown in FIG. 1F. However, there are a number of significant differences, such as:

- the layers of a credit card (including, if applicable, multiple layers of the inlay substrate) are hot laminated to one another
- the layers of the passport booklet, such as the cover layer and the inlay layer (including, if applicable, multiple layers of the inlay substrate) are cold laminated to one another, with adhesives.
- the credit card is much thicker, making it easier to conceal and protect the RFID chip
- the antenna wire is embedded in a different plane
- the layers of the inlay substrate 208 are adhesively attached to one another, attempts to separate the two layers is intended to result in the destruction of the chip module and the antenna. This is an important security feature.
- The standard construction of a multi-layered inlay (such as suggested by the "one or more" top layers 104a) is to hot laminate the substrate together. There is no adhesive layer (209). This is generally not possible with a synthetic paper material like Teslin™.
- 1E and 1F are standard contactless card. 1F, if complete would have another layer on top 0.78 mm. (For ID cards, this is important, as they all follow the ISO 7816 standard for dimensions.)
- in a passport, the material of cover layer is different than material of inlay substrate
- in the contactless card (FIG. 1F) the cover layer (not shown) would be of the same material as the layer 104.
- The thickness of a credit card (FIG. 1F) is sufficient to cover and protect the chip and antenna. For example, 450 μm
- With a passport (FIGS. 2A-2I), the chip module is approximately as thick as the inlay substrate (both are in the range of 300-400 μm). It is more difficult to protect the chip module 210 in the passport than in the credit card. (A credit card 450 μm thick, and the chip module is surrounded by the substrate layer. In the passport, the substrate does not cover the chip, entirely.)

In the embodiments described above, with respect to FIGS. 2A-2I, the inlay substrate layers (such as Teslin™) are adhesively attached to form the inlay substrate 208 integrating the transponder (chip module 210) in the center of the inlay 200.

Any attempt to separate the two layers (208a, 208b) should result in the destruction of the inlay 200. Also the patch 230 protects the chip module 210.

FIG. 2J shows another variation on the inlay 200" (double prime). Again, most of the elements are the same as for the inlays 200 and 200', and the inlay 200" is nearly identical to the inlay 200'. A cover layer 204 is laminated to the inlay substrate 208, an antenna 220 is mounted to the inlay substrate 208, and a chip module 210 is disposed in a stepped, pocket-type recess 216'. However, here, the inlay substrate 208" (double prime) is formed in a single layer inlay substrate 208".

Fabricating the Inlay (Passport Cover)

Various methods may be used to fabricate the passport cover (200) such as:

- The first and second layers (208a and 208b) of the inlay substrate (208) may be adhesively attached to one another in sheet (rather than roll) format.
- The cover material (204) may also be processed in sheet format by applying a layer of polyurethane hot melt adhesive with a short opening time using a roller coating machine.
- The adhesive-coated cover material (204) may be positioned on the multi-layered inlay substrate and affixed at two (or more) points using an ultrasonic collator.
- The inlay substrate (208) may then be laminated to the cover material (204) by reactivating the polyurethane hot melt adhesive in a hot roll or lamination press.
- Instead of applying heat to the cover material, it can be advantageous to apply the heat to the inlay substrate at a temperature of approximately 120° Celsius by passing the cover and inlay substrate over a hot lamination roll, under a pressure of approximately 3 Bar.
- The layers of the multi-layer inlay substrate (208) and the cover layer (204) may be handled in sheet format and not from a web or an endless reel during the coating and lamination processes in which the material, held under tension, is passed over hot and cold rollers. Web coating and laminating over rollers is the primary cause of curling of the finished product.
- To avoid the so-called banana effect of curling inlays after adhesively attaching the cover layer to the inlay substrate, the reactive hot melt adhesive may be applied to the cover layer in sheet format. For security reasons, the peel strength of the laminated inlay with the cover layer should meet or exceed the ICAO standard (ISO/IEC 10373). This can be achieved by applying the correct thickness of adhesive during the coating stage, exerting the correct pressure and temperature during the reactivation stage and storing the finished product to complete the curing process in a moisture controlled environment.

An Alternative to Hot Melt Adhesive

In another embodiment of the invention, a solution is provided which minimizes the emission of $CO_2$ gas resulting in the formation of bubbles between a passport cover layer and the underlying inlay substrate. Instead of applying hot melt adhesive to the structured cover layer resulting in an uneven thickness of adhesive, a thin layer of aliphatic adhesive (as opposed to aromatic adhesive) high in viscosity (34,000 mPas at 130° Celsius) may be applied with a short open time of several seconds to the inlay substrate using a slot nozzle system (with shims). See, for example, Jowat 628.80.

In order to be able to apply the aliphatic adhesive under light pressure to the inlay substrate, it is advisable that the slot nozzle head does not go against the "grain" of the protruding antenna wires at the position of the chip module. For this reason, the slot nozzle head applying the adhesive may be applied in the direction of the wire ends, and not in the direction of the antenna.

After applying the aliphatic adhesive, but before the aliphatic adhesive is reactivated, the hinge gaps may be punched in the inlay substrate. And, finally, the cover layer may be placed over the inlay substrate and laminated in a press to create the passport cover.

Mechanically Milling the Recess

A problem with mechanical milling a synthetic material such as Teslin™ is that it is a flexible (resilient, deformable). It is no problem to punch out a hole through a layer of Teslin™ and, as described above, a stepped opening can be made by compression.

According to a feature of the invention, a recess (stepped or straight) can be formed in a material such as Teslin™ used for the inlay substrate by mechanical milling, by first reducing the temperature of the Teslin™ to make it more rigid and machineable. For example, below −10° C., such as approximately −18° C. Refrigeration and cooling units are well known. The material may be removed from the refrigeration unit immediately prior to machining (milling) and/or may be maintained at a low temperature during machining, such as by directing a stream of cooled air at the workpiece.

Numerous recesses in inlay substrates are illustrated herein, and milling is well known. A suitable milling tool is available from IBAG Switzerland AG, operating at 30,000 to 60,000 RPM, moving at 1-4 meters per minute (mpm).

Forming Recesses in Inlay Substrates, Using Laser Ablation

U.S. application Ser. No. 12/045,043 (Publication No. 2008/0179404) describes (see FIG. 8 therein) a technique for forming a recess in a substrate. As described therein . . .

> The laser 860 emits a beam (dashed line), targeted at the substrate 802, to ablate material from the substrate 802 to form the recess 806. The beam may have a diameter of approximately 0.1 mm. The beam may be scanned back and forth, traversing in one direction entirely across the recess area, turning around, and traversing back across the recess area, like plowing a field. Many passes may be required to carve out the entire area of the recess, given that the beam diameter is typically much (such as 10-100 times) smaller than the length or width of the recess. As is known, the beam may be scanned, in any suitable manner, such as with mirrors. Also, the intensity of the beam may be controlled or modulated to control the penetration into the substrate. For example, a pulse-width modulated beam may be used. The laser may be a UV laser (355 nm) with a power ranging from 20 to 70 watts.
>
> The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin and polycarbonate substrates. For PVC, laser milling is less effective.

In another embodiment of the invention use is made of a Teslin™ inlay substrate to accommodate a 3up format (182.56 mm×404.81 mm) with a thickness of 356 μm, prepared with milled cavities (laser abrasion or mechanically milled) with a depth of 95 μm on each side of an opening to accept a leadframe or glass epoxy chip module. Before a chip module is placed in each of the three pockets, as described, an ultra violet adhesive with reflecting particles is dispensed for the purpose of holding a chip module in placed as well as a security feature to indicate tampering. In the next step of the process, an insulated self bonding wire with a diameter of approximately 80 μm is embedded into the Teslin™ inlay substrate; scribing an antenna with 4 turns; looping the wire ends of the antenna adjacent to the terminal areas of a chip module; removing the wire insulation before interconnection, drawing the looped wires on each side of the chip module over the terminal areas; and bonding the wire ends to the leadframe or glass epoxy tape by means of thermo compression bonding. After bonding, the wire ends are deformed to a thickness of approximately 40 μm.

Given that the thickness of the chip module (leadframe: 80 μm and mold mass 240 μm) is approximately 320 μm and the inlay substrate 356 μm, the connected antenna wires to the leadframe of the chip module may protrude over the inlay by approximately 40 μm. The antenna is embedding entirely into the inlay substrate using an ultrasonic embedding head assembly with booster, alternatively the antenna can be pressed into the substrate using a heated stamp the size of the antenna or laminated in a conventional press. Typically the lamination process results in the shrinkage of the inlay substrate, and therefore it can be advantageous to punch the hinge gap (106, FIG. 1G) in the inlay substrate after lamination to remain in tolerance.

FIGS. 3A-3D illustrate various techniques for using a laser to ablate material in a controlled manner from a substrate such as an inlay substrate (such as 208) to form a recess (such as 126) extending into a surface of the inlay substrate.

FIG. 3A shows forming a recess (opening, window) in a single layer of material, such as a layer of Teslin™ for an inlay substrate (compare 106, FIG. 1F), using laser ablation. This single layer of material may also be representative of each of the two layers in a multi-layer inlay substrate such as are shown in FIGS. 2A and 2B.

FIG. 3A illustrates an exemplary process 300 of forming a recess 316 in an inlay substrate 308, using a laser 360. The inlay substrate 308 may be a single layer of Teslin (for example), having a thickness "t" of 355 μm. A typical size (width dimensions) for the recess 316, to accommodate a chip module (such as 210) with a lead frame (such as 218), may be approximately 5 mm×8 mm. The recess 316 may extend completely through the inlay substrate 308, resulting in a window-type recess. The recess 316 may extend only partially, such as 260 μm through the inlay substrate 308, resulting in a pocket-type recess.

The laser 360 emits a beam (dashed line), targeted at the substrate 302, to ablate material from the substrate 308 to form the recess 316. The beam may have a diameter of approximately 0.1 mm. The beam may be scanned back and forth, traversing in one direction entirely across the recess area, turning around, and traversing back across the recess area, like plowing a field. Many passes may be required to carve out the entire area of the recess, given that the beam diameter is typically much (such as 10-100 times) smaller than the length or width of the recess. As is known, the beam may be scanned, in any suitable manner, such as with mirrors. Also, the intensity of the beam may be controlled or modulated to control the penetration into the substrate. For example, a pulse-width modulated beam may be used. The laser may be a UV laser (355 nm) with a power ranging from 20 to 70 watts.

The process of using a laser in this manner, rather than (for example) a conventional rotating milling tool, may be referred to as "laser milling". The technique described herein may be particularly beneficial for applications where it is desired to form a "pocket" type recess which intentionally does not extend all the way through the substrate or sheet (in other words, the recess or pocket extends only partially through the substrate). Mechanical milling can be difficult. On the other hand, laser milling can be very effective for Teslin and polycarbonate substrates. For PVC, laser milling is less effective.

The recess (opening) 316 formed in the inlay substrate layer 308 of FIG. 3A extends completely through the inlay substrate layer 308. The layer may be representative of each of the at least two inlay substrate layers 308a and 308b shown in FIGS. 2A and 2B which, to form a stepped recess (216) would have two different-size openings formed therein.

FIG. 3B shows forming a stepped window-type recess 316r in a single layer of material, such a layer of Teslin™ for an inlay substrate 308r (compare 108, FIG. 1H), using laser ablation. This may be a two-step process comprising:
  first laser milling a central area (such as between "b" and "c") to a first partially through the substrate,
  then continuing laser milling the entire area (such as between "a" and "c") to create a recess extending partially through the substrate in a peripheral area, and to extend the recess in the central area completely through the substrate.
Alternatively:
  first laser milling the entire area (between "a" and "d") to a first depth (d1)
  then laser milling only the central area (between "b" and "c") to a second depth (d2).

FIG. 3C shows forming a stepped pocket-type recess 316s in a single layer of material, such a layer of Teslin™ for an inlay substrate 308s (compare 108, FIG. 1H), using laser ablation. This may be a two-step process comprising:
  first laser milling a central area (such as between "b" and "c") to a depth partially through the substrate,
  then continuing laser milling the entire area (such as between "a" and "d") to create a recess extending partially through the substrate in a peripheral area, and to extend the recess in the central area deeper into (but not completely through) the substrate.
Alternatively:
  first laser milling the entire area (between "a" and "d") to a first depth (d1)
  then laser milling the central area (between "b" and "c") to a second depth (d2).

FIG. 3D shows that a two-step pocket type recess 316t can be formed in a single layer of material, such a layer of Teslin™ for an inlay substrate 316t, using laser ablation. This may be a three-step process comprising:
  first laser milling a central area (such as between "c" and "d") to a depth partially through the substrate,
  next laser milling a middle area (such as between "b" and "e") to a depth partially through the substrate, which will increase the depth in the central area,
  then continuing laser milling the entire area (such as between "a" and "f") to create a recess extending partially through the substrate in a peripheral area, and to extend the recess in the middle and central area deeper into (but not completely through) the substrate.
Alternatively:
  first laser milling the entire area (between "a" and "f") to a first depth (d1)
  then laser milling the middle area (between "b" and "e") to a second depth (d2)
  then laser milling the central area (between "c" and "d") to a third depth (d3).
For example, the resulting depths may be:
  in the peripheral area ("a"-"b", and "f"), approximately 0.056 mm
  in the middle area ("b"-"c", "d"-"e"), approximately 0.116 mm
  in the central area ("c"-"d"), approximately 0.306 mm
  remaining thickness at the bottom of the central area, approximately 0.050 mm
  (total thickness of the substrate, 0.306+0.050=0.356)

Forming Channels in Inlay Substrates, for Mounting the Antenna Wire

As mentioned above, the antenna wire may be mounted to the surface of an inlay substrate by ultrasonically embedding (countersinking) it into the surface of the inlay substrate. Ideally, the antenna wire is fully embedded so that it is flush or below the top surface of the inlay substrate.

With ultrasonic embedding, the wire may become only partially embedded, such as approximately half its diameter. In other words, a 100 μm diameter wire may be embedded 50 μm (half its diameter) into the inlay substrate, and may protrude approximately 50 μm (half its diameter) from the surface of the inlay substrate. And, in the case of adhesively sticking, a 100 μm diameter wire may be substantially not embedded at all into the inlay substrate, and may protrude approximately 100 μm (its entire diameter) from the surface of the inlay substrate.

For applications such as driver's license or passports, it is generally not desirable that the wire extend (protrude) above the surface of the inlay substrate. As discussed hereinabove, the chip module may be recessed so as to be substantially contained within the inlay substrate (or sheet), without sticking out and creating a bump.

According to an embodiment of the invention, the antenna wire may be mounted so as to be substantially entirely disposed (embedded) within the surface of the inlay substrate, without protruding therefrom. In other words, the wire will be substantially entirely recessed below the surface of the inlay substrate.

Generally, this may be accomplished by creating a "groove" (or "channel", or "trench") in the surface of the inlay substrate to accept the antenna wire. Then, the antenna wire may then be laid (inlaid, pressed, sunk) into the groove.

In general, the groove may be formed either by removing material from the substrate (by analogy, digging a trench with a shovel, and tossing the dirt aside), or displacing material of the substrate (by analogy, hoeing a trench to push aside dirt). Some exemplary techniques for removing or displacing material will be described below. A mechanical tool, such as a wirebonder, may be used to form and press the wire into the groove.

The depth of the groove should be at least a substantial portion of the diameter of the wire, such as at least 50% of the diameter of the wire, including at least 60%, at least 70%, at least 80% and at least 90%, and the groove may be at least as deep as the wire diameter, such as at least 100%, at least 105%, at least 110%. In some cases, described below, the groove may be a "deep trench" which is much greater than the diameter of the wire, for routing the wire from one level, such as just within the surface of the substrate) to another level, such as deep within the substrate, such as for facilitating connecting the wire to contact areas or pads of a module which are disposed below the surface of the substrate (see, for example, FIGS. 2B and 2D where the wire ends are bonded to a bottom surface of the leadframe, rather than to the top surface thereof).

For example, for mounting a 60 μm diameter wire, a groove which is approximately 60 μm deep may be formed into the surface of the inlay substrate. As discussed below, in conjunction with mechanically embedding the antenna wire in the groove, heat may be applied to allow further embedding.

Therefore, for example, a 60 μm wire could be pressed, with heat, into a 40 μm deep groove, and become substantially entirely embedded within the surface of the substrate, without protruding therefrom.

The groove may be less deep than the diameter of the wire and, as the wire is laid down into the groove, it may be pressed further into the substrate. Or, after the entire antenna wire is laid down, the inlay substrate may be placed in a press which may further sink the antenna wire into the inlay substrate. The wire may be warmed. The process may be performed in a warm environment to soften the substrate.

The width of the groove may be approximately equal to the diameter of the wire. For example, for a wire having a diameter of 60-80 μm, a laser beam having a diameter of 0.1 mm (100 μm) would create a groove sufficiently wide (100 μm) to receive the wire. The groove may be narrower than the diameter of the wire, such as approximately 95% of the diameter of the wire, to facilitate an "interference" fit, securely holding the wire in position for subsequent handling. In general, a groove which is significantly wider than the diameter of the wire would not be preferred, since it would tend not to retain the wire (such as by interference fit), without more (such as an adhesive).

The groove may be slightly narrower than the diameter of the wire, and as the wire is being laid down, the material of the inlay substrate may resiliently retract (e.g., elastic deformation) to receive the wire, holding it in place. Generally, the wire typically has a circular cross-section (but may have other cross-sections, such as a ribbon wire), and the groove may have a substantially rectangular cross-section. For example, a 60 μm wide groove may receive and retain in place an 80 μm diameter wire. The wire may be warmed as it is being laid down (scribed, sunk) into the groove to facilitate its entry into the groove.

The groove may simply be a channel extending along the surface of the inlay substrate, formed by a mechanical tool (ultrasonic stamp or scribe), or by a hot mold process. Alternatively, the groove may be formed by laser ablation, in a manner similar to how recesses are made (FIGS. 3A-3D).

Generally, the groove facilitates holding the wire in place. For example, a 100 micron diameter wire can be inserted (with some pressure) into a narrower, such as 95 micron wide channel (the depth of the channel should be at least half the diameter of the wire, so that the wire can be embedded "over center"), and will stay in place. It is beneficial that this can be done without requiring an ultrasonic embedding tool. As mentioned above, mounting a wire to the inlay substrate is typically done by ultrasonically embedding the wire into the inlay substrate, or ultrasonically causing a self-bonding wire to adhere to the inlay substrate. The "channeling technique" disclosed herein can proceed faster than the ultrasonic techniques, and sheets can be prepared with wire channels, off-line, then the wire can be installed in a simple embedding machine which does not need ultrasonics.

FIG. 4A (corresponding to FIG. 9 of Ser. No. 12/045,043) illustrates a technique 400a using a laser 460a to form a groove (channel, trench) 462a in a surface of an inlay substrate 408. This is an example of removing material to form the groove. The laser 460a is shown moving from left-to-right in the figure.

A wire 420 is shown being laid down into the groove 462, from left-to-right, and may be urged into the groove 462 by a simple pressing tool (or wheel) 468. The wire 420 may be laid into the groove 462 during formation of the groove (channel), by following after the laser a distance "u".

Although only one straight groove is shown, a 2-dimensional (x-y) groove pattern may thus be formed in the top surface of the inlay substrate, extending from (originating and terminating at) a recess in the inlay substrate, for embedding an antenna wire having a number of turns or coils (see FIG. 1E). As mentioned above, insulated wire is relevant where the wire needs to cross over itself, such as at the point "c" in FIG. 1E. And, in some cases, the antenna wire does not need to cross over itself. See, for example, FIG. 4 of U.S. Pat. No. 6,698,089.

FIG. 4B illustrates a technique 400b using a mechanical tool 460b to form a groove 462b in a surface of an inlay substrate 408. This is an example of removing material to form the groove. The tool may be a milling tool, such as a conventional or climb milling tool available from IBAG Switzerland AG, described hereinabove. Reducing the temperature of the material being milled, as discussed above, may be employed.

Alternatively, the tool 460b may be similar to a "gouge" used to carve patterns in wood. (Gouge—Carving tool with a curved cutting edge.) A gouging tool 460b is shown moving from left-to-right in the figure. In this figure, the wire (420) and the pressing tool (468) are omitted, for illustrative clarity. The "debris" from gouging (or milling) is also omitted, for illustrative clarity. Reducing the temperature of the material being gouged may be employed.

FIG. 4C illustrates a technique 400c using an ultrasonic stamp tool 460c form a groove 462c in a surface of an inlay substrate 408. This is an example of displacing material, with pressure, to form the groove. The tool may be a thin rectangular block, or a small diameter cylinder, mounted to an ultrasonic converter (not shown). The tool 460c is shown moving from left-to-right in the figure. In this figure, the wire (420) and the pressing tool (468) are omitted, for illustrative clarity. A similar tool could be used to push the wire further into the substrate, once it has already been (partially) embedded therein.

FIG. 4D illustrates a technique 400d forming a groove 462d in the surface of an inlay substrate 408 by using heat and molding. Essentially, a die tool 460d having a raised pattern 461 corresponding to the desired pattern for the groove(s) is pressed (arrow) down against the surface of the inlay substrate, and heat may be applied, to transfer the pattern to (mold the pattern into) the inlay substrate. This technique can also be considered to be "displacing".

Regarding techniques for displacing material to form a channel for the antenna wire, it could be said that in straight-forward embedding (ultrasonic, sonotrode), the wire displaces substrate material as it is embedded into the surface of the substrate. It should be understood that the displacing techniques described herein are performed with a tool separate and distinct from the wire, and prior to the wire being embedded in the surface of the substrate.

It should be understood that the channels for antenna wire being discussed herein are "pre-formed" (prior to mounting/embedding the antenna wire therein) in a desired pattern for the antenna. An inlay substrate may be prepared with such pre-formed channels for later embedding of antenna wire.

It should be understood that when a wire is inserted (mounted) into a pre-formed groove, this is different than ultrasonic embedding into a non-grooved surface of a substrate, such as is disclosed in U.S. Pat. No. 6,698,089. A tool for mounting the wire into a pre-formed groove may or may not be ultrasonic. Although the word "embedding" may be used herein, in conjunction with mounting wires in pre-formed grooves, it should be understood that it is used in its generic sense relating to inserting a first material (such as a wire) into a groove formed in another material (such as the inlay substrate, or a given layer thereof).

FIGS. 4E and 4F are cross-sectional views of a substrate 408 with a groove 462e (compare any of grooves 462a, 462b, 462c, 462d) and a wire 620 mounted in the groove. A simple embedding tool 460a may be used (such as without ultrasonics). FIG. 4E shows after groove formation, prior to embedding. In FIG. 4F, the wire 420 is shown, after embedding, protruding above the top surface of the substrate 608. If sufficient pressure, heat and/or ultrasonic are used during embedding and/or the groove is sufficiently deep, the wire may be fully embedded, flush with the top surface of the substrate.

In FIGS. 4E and 4F, a channel 462e is previously formed in a surface of an inlay substrate (or in a surface of a layer of a multi-layer substrate), and a wire 420 is mounted into the pre-formed channel 462e. The wire may be completely inset into the substrate, or it may protrude slightly therefrom.

FIGS. 4G and 4H illustrate that a channel 472 forming an antenna pattern may be formed in a layer 474 of adhesive (compare 209, 214) on the surface of an inlay substrate 476 or layer of a multi-layer inlay substrate (compare 208, 408), and a wire 478 (compare 420) may be mounted therein using a tool 480 (compare 460a). For example, the adhesive 474 may be 80 µm thick glue. The channel (groove, trench) 472 may be, for example, 60-80 µm deep. The channel 472 may go all the way through the adhesive 474, and further into the substrate 476. The channel 472 may extend only partially through the adhesive 474, as indicated by the dashed line at the bottom of the channel 472.

The adhesive 474 may be polyurethane. Polyurethane, once beyond its "open time", goes hard, making it ideal for trench formation. Later, for laminating, it may be reactivated with a heat source, such as an infrared light. Hence, the adhesive may be applied sufficiently in advance of channel formation, such as 1-10 minutes (for example) before, to facilitate channel formation.

U.S. Provisional Patent Application No. 61/235,012 filed Aug. 19, 2009 by Finn, discloses forming channels in an inlay substrate or in an adhesive layer on an inlay substrate, the channel forming a pattern for an antenna, and filling the channel with a flowable, conductive material rather than mounting a wire therein. FIGS. 4I-4L herein correspond to FIGS. 6A-6D therein. The Provisional Patent Application also discloses techniques for connecting the antenna formed by the filled channels with chip modules. FIGS. 4M-4P herein correspond with FIGS. 7A-7D therein.

FIG. 4I illustrates a substrate 408 having a channel (groove, trench) 462 formed in a top surface thereof, and a quantity of flowable, conductive material 444 applied on the surface. Some of the material 444 may be in the channel 462. The conductive material 444 is viscous, such as metallic powder, conductive glue (see list above). A squeegee 446 is shown positioned above the material 444. The squeegee 446 will be lowered (see arrow) so as to be substantially in contact with the top surface of the substrate 408.

Exemplary (non-limiting) dimensions for the channel(s) 462 may be
  60-80 µm deep
  having a width of, for example, 50-100 µm.

FIG. 4J illustrates that as the squeegee 446 is advanced (see arrow), it forces the conductive material 444 into the channel 462. Residual conductive material 444 is substantially cleared from the surface of the substrate 408, but an additional cleaning step may be added.

FIGS. 4K and 4L are similar to FIGS. 4I and 4J, and show that the channels can be formed in a layer 409 of adhesive on the surface of the substrate 408 and filled with conductive material 444. In this example, the adhesive 409 is 80 µm thick glue. The channel (groove, trench) 462 may be, for example, 60-80 µm deep. The channel 462 may go all the way through the adhesive 409, and further into the substrate 608.

The adhesive 409 may be polyurethane. Polyurethane, once beyond its "open time", goes hard, making it ideal for trench formation. Later, for laminating, it may be reactivated with a heat source, such as an infrared light. Hence, the adhesive may be applied sufficiently in advance of channel formation, such as 1-10 minutes (for example) before, to facilitate channel formation.

FIG. 4M (compare FIG. 5A) illustrates an example of an inlay substrate 708 having a recess 416 for receiving a chip module 410 (dashed lines), and a channel (or channel pattern) 440 formed in the top surface of the inlay substrate 408 for filling with a flowable, conductive material (not shown, see FIG. 4N). The recess 416 may be rectangular, for receiving a leadframe-type chip module (compare FIG. 1C).

The channel (groove, trench, channel pattern) 440 (compare 462) may be formed in the inlay substrate 408 prior to the chip module 410 being mounted in the recess 416 (and prior to filling the channel with conductive material), using any of the techniques disclosed in FIGS. 4A-4D, or the like. An inlay substrate 408 with a channel 440 may be considered to be an "interim product". The channel 440 may be filled as shown in FIGS. 4I-4J, and may be in an adhesive layer as shown in FIGS. 4K-4L.

The channel 440 may comprise a first portion extending at one location across the recess 416, and a second portion extending at another location across the recess 416. More particularly, for example,
  a first channel segment 440a extends from a top portion of the recess 416 in one direction (towards the left, as viewed) across the surface of the substrate 408
  a second channel segment 440b extends from the top portion of the recess 416 in another direction (towards the right, as viewed) across the surface of the substrate 408, and may be collinear with the first channel segment 440a
  a third channel segment 440c extends from a bottom portion of the recess 416 in one direction (towards the left, as viewed) across the surface of the substrate 408
  a fourth channel segment 440d extends from the top bottom of the recess 416 in another direction (towards the right, as viewed) across the surface of the substrate 408, and may be collinear with the third channel segment 440c.

It should be understood that the terminal 410a and 410b may be representative of contact areas (rather than distinct terminals, on a top surface of a leadframe of the chip module 410.

The channel segments 740a, 740b, 740c, 740d (the entire pattern 740) are filled with conductive material 720.

FIG. 4N (compare FIG. 5B) is a cross-sectional view of the inlay substrate 408, showing:
  the substrate 408
  a "pocket" recess 416 extending into a top surface of the substrate 408. (Although the recess 416 is shown as a "straight" "pocket" type recess, for purposes of this embodiment, it is not particularly important whether the recess is "stepped" or "straight", or whether it is "window" or "pocket".)
  a chip module 410 disposed in the recess 416
  a terminal 410a (which is one of two terminals) disposed on a top surface of the chip module. (The terminal 410a may be representative of a contact area on a top surface of a leadframe of the chip module 410.)
  a channel 440 formed in a top surface of the substrate
  conductive material 460 disposed in the channel 440

FIG. 4N shows laying an elongate conductive jumper 770 (such as a short length of wire) across the recess 416, extending over a terminal 410a, and being bonded to the terminal 410a, using a sonotrode 118 (source, FIG. 1F) for connecting the jumper 470 to the terminals 410a of the chip module 410 (or connection areas of the leadframe). This is an "exploded" view.

As best viewed in FIG. 4M, to accommodate the jumpers 470, the channels 440 may have enlarged regions "e" where they are adjacent the recess 416. For example, whereas the channel 440 may be 60 μm wide, in the area adjacent the recess, it may be 100 μm wide. In the regions "e" adjacent the recess 416, the channels can also be deeper.

FIG. 4P shows the "finished product", with the jumper 470 bonded to the terminals of the chip module.

FIG. 4Q illustrates a variation where elongate, conductive jumpers 472 (compare 470) are initially bonded to the terminals 410a of the chip module 410, before the chip module 410 is inserted into the recess 416.

In prior art printing techniques conductive ink is applied to the surface of the substrate. The techniques are "additive" in nature.

According to the invention, by first having channels, the conductive material is embedded in the substrate, and may be flush with the surface thereof. By not protruding therefrom, after subsequent lamination, the pattern of the antenna may not be evident.

Inlay Substrates having Channels

FIG. 5A illustrates an example of an inlay substrate 508 having a recess 516 for receiving a chip module 510 (dashed lines), and a channel (or channel pattern) 540 formed in the top surface of the inlay substrate 508 for receiving an antenna wire (not shown, see FIG. 5B). The recess 516 may be rectangular, for receiving a leadframe-type chip module (compare FIG. 1C).

The channel (groove, trench, channel pattern) 540 (compare 462) may be formed in the inlay substrate 508 prior to the chip module 510 being mounted in the recess 516 (and prior to the antenna wire 520 being mounted into the channel), using any of the techniques disclosed in FIGS. 4A-4D, or the like. An inlay substrate 508 with a channel 540 may be considered to be an "interim product".

The channel 540 may comprise a first portion extending at one location across the recess 516, and a second portion extending at another location across the recess 516. More particularly, for example, a first channel segment 540a extends from a top portion of the recess 516 in one direction (towards the left, as viewed) across the surface of the substrate 508
a second channel segment 540b extends from the top portion of the recess 516 in another direction (towards the right, as viewed) across the surface of the substrate 508
a third channel segment 540c extends from a bottom portion of the recess 516 in one direction (towards the left, as viewed) across the surface of the substrate 508
a fourth channel segment 540d extends from the top bottom of the recess 516 in another direction (towards the right, as viewed) across the surface of the substrate 508

The first channel segment 540a may be collinear with the second channel segment 540b, and may be positioned such that when the antenna wire (such as an end portion thereof) is laid in the channel segments 540a and 540b, the wire will extend directly above a first terminal 510a (shown in dashed lines, compare 108a, FIG. 1B) of the chip module 510, for connecting (such as by bonding) thereto. It should be understood that the terminal 510a and 510b may be representative of contact areas (rather than distinct terminals, on a top surface of a leadframe of the chip module 510.

The third channel segment 540c may be collinear with the fourth channel segment 540d, and may be positioned such that when the antenna wire (such as an end portion thereof) is laid in the channel segments 540c and 540d, the wire will extend directly above a second terminal 510b (shown in dashed lines, compare 108a, FIG. 1B) of the chip module 510, for connecting (such as by bonding) thereto.

FIG. 5B is a cross-sectional view of a the inlay substrate 508 of FIG. 5A, showing:
the substrate 508
a "pocket" recess 516 extending into a top surface of the substrate 508. (Although the recess 516 is shown as a "straight" "pocket" type recess, for purposes of this embodiment, it is not particularly important whether the recess is "stepped" or "straight", or whether it is "window" or "pocket".)
a chip module 510 disposed in the recess 516
a terminal 510a (which is one of two terminals) disposed on a top surface of the chip module. (The terminal 510a may be representative of a contact area on a top surface of a leadframe of the chip module 510.)
a channel 540 formed in a top surface of the substrate
the wire 520, shown spaced above the channel 540
a tool 566 for pushing the wire 520 into the channel 540
a sonotrode 118 (source, FIG. 1F) for connecting the wire to terminals of the chip module 510 (or connection areas of the leadframe)

Starting with the interim product" comprising an inlay substrate 508 with a channel 540, the chip module 510 may be disposed in the recess 516 (optionally, with the cushion 542), and the antenna wire 520 may be laid into the channel, with the tool 566 urging the wire 520 into the channel, as indicated by the vertical (downward-pointing) arrow. This would generally be done by feeding the antenna wire from a spool (not shown), such as in a wirebonder apparatus, and pressing the wire into the channel as it is fed from the spool, such as millimeter-by-millimeter, as indicated by the horizontal arrow. In other words, the entire wire of the antenna (such as 4 or 5 loops) is not pressed all at once into the entire channel pattern.

The channel 540 may be slightly undersized (less wide than the diameter of the antenna wire), and the tool 566 may be heated to assist insertion (laying) of the antenna wire 520 into the channel 540.

Then, after the wire 520 is laid into the channel 540, it may be bonded, using the sonotrode 18, to the terminals of the chip module 510 (or to connection areas of the leadframe of the chip module). In an exemplary wire-laying and wire-bonding sequence:
the wire 520 may first be inserted into the channel pattern 540 adjacent (such as 1 mm from) the recess 516,
then the wire 520 may be advanced over the recess 516 and a corresponding terminal of the chip module 510, and bonded thereto,
then the wire 520 may be advanced along the channel pattern 540 in the top surface of the inlay substrate 508 to form the loops of the antenna,
then the wire 520 may be advanced again over the recess 516 and a corresponding second terminal of the chip module 510 and bonded thereto, and
then the wire 520 may be further advanced (such as approximately 1 mm) into the channel 540 adjacent the recess 516, and cut.

As disclosed in U.S. patent application Ser. No. 11/831,987 filed Aug. 1, 2007 by Finn (Publication No. 2008/0073800;

FIG. 6B therein), a recess may be sized and shaped to accommodate a thin layer of synthetic cushion material (such as silicone rubber) between the chip module and the (underlying) substrate layer, to provide some protection against shock, as well as against moisture.

FIG. 5B illustrates that, optionally, a thin layer 542 of synthetic cushion material is shown disposed under the chip module 510, at the bottom of the recess 516. This cushion feature is applicable to any of the embodiments disclosed herein having a pocket-type recess, or some support layer under a window-type recess.

U.S. patent application Ser. No. 11/773,434 filed Jul. 1, 2007 (Publication No. 2008/0155822), incorporated by reference herein, (see, e.g., FIGS. 2A, 2B, 3A-3E, 4A-4E therein) discloses having a recess large enough that end portions of the antenna wire can extend across the recess, as wire "bridges" spaces sufficiently far apart from one another that a transponder chip (module) being inserted past the spaced-apart wire bridges, followed by repositioning the wire bridges to be over corresponding terminals of the transponder chip prior to bonding thereto. (A tool for repositioning the wire bridges to be over the transponder chip terminals, for bonding thereto, is shown in FIG. 6B. A method is described with respect to FIG. 7 therein.)

U.S. patent application Ser. No. 11/831,987 filed Aug. 1, 2007 (see Publication No. 2008/0073800, e.g., FIGS. 3A-3D therein) discloses having a recess large enough that end portions of the antenna wire can extend across the recess, as wire "bridges" spaces sufficiently far apart from one another that a transponder chip (module) being inserted past the spaced-apart wire bridges, followed by rotating the transponder chip, such as 90 degrees, so the terminals of the transponder chip are under the wire bridges (which need not be repositioned) for bonding thereto.

FIG. 5C illustrates an example of an inlay substrate 508 having a recess 516' (prime) for receiving a chip module (not shown), and a channel formed in the surface of the inlay substrate for receiving an antenna wire (not shown). The recess 516' may be round (circular), for receiving a circular epoxy glass—type chip module (compare FIG. 1D). The recess 516' is similar to the recess 516 (FIG. 5A), and both may be mechanically milled (such as with cooling, as described herein), or laser ablated.

FIG. 5D shows the chip module 510 disposed in the recess 516'. In this example, the chip module 510 may be an epoxy glass module. Notice that the chip module 510 is "upside down" (such as when contrasted with FIG. 2J) in that the mold mass is on the top side, the FR4 substrate (or leadframe) is on the bottom, also the connection areas are on the top side of the FR4 substrate (or leadframe).

The connection areas on the chip module 510 are disposed well below (rather than substantially at the same level as) the top surface of the substrate 508. This shows the need to form a "deep trench" 521 from the top of the inlay substrate 508, whereat the antenna wire 520 is embedded, deeper down into the substrate to be at the "sunken" level of the connection areas on the chip module 510. The deep trench 521 allows for routing of end portions of the antenna wire 520 down through the inlay substrate 508 (or layer of a multi-layer inlay substrate) to the contact pads (or areas) on the chip module.

A cover layer 504 is shown over the inlay substrate 508. A film or layer 542 of material, such as Teslin™, having a thickness of approximately 10 μm, may be disposed over the chip module and antenna connections, within a top portion of the recess 516'. This film or layer may be referred to as a "lid", or "cover", and is discussed in greater detail with respect to FIGS. 6A and 6B.

A "deep trench" is essentially a channel (compare FIGS. 4A-4D) which, rather than traversing the substrate at a substantially constant depth, such as 40 μm, may ramp down (or be "inclined"), as illustrated in FIG. 5B, so that the antenna wire (520) can reach a deeper level in the substrate 508, such as more than 100 μm. Generally, using laser ablation, several passes may be required to form such a deep trench, since each as of the laser may only be able to ablate 5-10 μm of material. (A few passes of the laser would also be required for a channel that is deeper than the amount of material which can be ablated in a single pass of the laser.)

Lids (or Covers) Covering the Openings of the Recess(es)

In various embodiments described above, a recess (such as 216, 216') for the chip module (such as 210) extends (i) completely through the inlay substrate from the top surface to the bottom surface thereof and, in some instances, (ii) only partially through the inlay substrate (such as 208") from a top surface thereof. The openings of the recesses (the openings are where the recess enters/exits the substrate surface) should be sealed to keep moisture out of the inlay substrate, particularly in the area of the chip module and antenna connections.

The cover layer itself (such as 204), which is cold laminated to the inlay substrate, will typically covers the opening at the top surface of the inlay substrate (such as 208).

A patch (such as 230) may cover the inlay substrate and connections. And, as discussed above, instead of using a patch to hermetically seal the area, a moisture curing adhesive or a potting material (such as 234, FIG. 2G) may be used.

FIG. 6A illustrates a relevant portion of an inlay substrate 608 having a stepped recess 616 extending partially therethrough, from a top surface towards a bottom surface thereof (compare the two step recess 316t in FIG. 3D). The inlay substrate 608 may be a single or multi-layer substrate. A leadframe-type chip module 610 is shown disposed in the recess 616.

An antenna wire 620 is embedded in the top surface of the inlay substrate 608. End portions of the antenna wire are connected to the top surface of the leadframe 618. (It is generally immaterial which kind of chip module is disposed in the recess, or whether the recess is round or rectangular.)

In this "exploded view", the cover layer 604 is shown space apart from the top surface of the inlay substrate 608, as is the adhesive layer 614 for joining the cover layer 604 to the inlay substrate 608.

The recess 616 has a width dimension at the top surface of the inlay substrate. If the recess is round, the width dimension is a diameter. The chip module 610 and end portions of the antenna wire 620 are slightly, such as approximately 10 μm, recessed below the top surface of the inlay substrate 608.

A film or layer (patch) 642 of material, such as Teslin™, having a thickness of approximately 10 μm, is disposed over the chip module and antenna connections, within a top portion of the recess 616. This film or layer may be referred to as a "lid", or "cover".

As mentioned before, the cover layer (204) will cover the opening in the recess at the top surface of the inlay substrate. However, for an "interim product", such as an inlay substrate with transponder (and antenna), and no cover layer (yet), it is important to protect the chip module in the recess. Hence, the lid 642 serves to protect the chip module in the recess.

If the lid 642 extends over the recess, rather than being level with the top surface of the substrate, it may be desirable to remove the lid 642 prior to laminating the cover layer 604 to the substrate 608.

FIG. 6B illustrates a relevant portion of an inlay substrate 608 having a stepped recess 616 extending completely therethrough, from a top surface to a bottom surface thereof (compare the two step recess 316t in FIG. 3D). The inlay substrate 608 may be a single or multi-layer substrate. A leadframe-type chip module 610 is disposed in the recess 616. An antenna wire 620 is embedded in the top surface of the inlay substrate 608. End portions of the antenna wire are connected to the top surface of the leadframe 618.

In this "exploded view", the cover layer 604 is shown space apart from the top surface of the inlay substrate 608, as is the adhesive layer 614 for joining the cover layer 604 to the inlay substrate 608.

The recess 616 has a width dimension at the top surface of the inlay substrate 608. If the recess is round, the width dimension is a diameter. The chip module 610 and end portions of the antenna wire 620 are slightly, such as approximately 10 μm, recessed below the top surface of the inlay substrate 608.

In a manner similar to FIG. 6A, a film or layer 644 of Teslin™ (generally, the material for the lid can be the same material, different thickness, as the inlay substrate), having a thickness of approximately 10 μm, is disposed over the chip module 610 and antenna connections, within a top portion of the recess 616.

The recess 616 has a width dimension at the bottom surface of the inlay substrate 608. If the recess is round, the width dimension is a diameter. For a stepped recess, the width dimension at the bottom of the inlay substrate is typically less than the width dimension at the top surface of the inlay substrate.

The chip module 610 (and mold mass) are slightly, such as approximately 10 μm, recessed above the bottom surface of the inlay substrate 608. A film or layer 642 of Teslin™ (for example) having a thickness of approximately 10 μm, is disposed under the chip module 610, within a bottom portion of the recess 616.

The top and bottom layers 642 and 644 may be referred to as "covers", or "lids" since they are used to close off (seal, plug) the recess 616, by way of analogy in the manner of manhole covers. They may also be referred to as "patches". Generally, in contrast with a patch (such as 230) which may be placed over the recesses, by virtue of the fact that the covers 642 and 644 fit into the recess 616, they do not add to the overall thickness or surface flatness of the inlay substrate 608.

A Security Appliqué

In its broadest sense, an appliqué or applique is a smaller ornament or device applied to another surface. In the context of ceramics, for example, an appliqué is a separate piece of clay added to the primary work, generally for the purpose of decoration. The word appliqué is a French word that, in this context, means "that has been applied".

Credit cards, for example, may have holograms on a surface thereof. In 1984, most Visa™ cards around the world began to feature a hologram of a dove on its face, generally under the last four digits of the Visa™ number. This was implemented as a security feature. Similar changes were implemented with MasterCard™ cards. On most Visa™ cards, holding the face of the card under an ultraviolet light will reveal the dove picture, as an additional security test. (On newer Visa cards, the UV dove is replaced by a small V over the Visa logo.)

FIG. 7A illustrates an "electronic ink" display ("applique") which can be activated by the electro-magnetic field (from a reader, not shown) driving the RFID chip, comprising the following elements:

- 734, a hologram, metal stripe or an electronic ink display which can be activated by an electro-magnetic field to indicate unauthorized tampering at the area surrounding the chip
- 736, inductive coupling antenna to drive the electronic ink display In this manner, when the secure document is being read (interrogated), the display will become visible. This enhances the security of the document.

FIG. 7B illustrates that the applique can be placed anywhere on the inlay 700. Here, it is shown in the middle of the antenna coils. It could be used, for example, as the bottom lid (642, FIG. 6B).

Personalizing the Substrate

FIG. 7C illustrates an inlay substrate 708 with additional security features. For example, an additional security feature may be using laser ablation (see FIGS. 3A, 4A) to personalize the inlay substrate with patterns of dots, lines, bar codes, symbols, numbers, letters, or the like. This may be done in conjunction with other laser ablation steps (laser ablation of the recess 716 or channels), or in a separate laser ablation step. And, instead of using laser ablation, any other process (such as stamping, printing, compressing, staining, watermarking, and the like) may be used to personalize the substrate. The general idea is that each inlay substrate is uniquely identified, and its identity can be ascertained.

Anti-Skimming Features

Regarding skimming, two solutions are presented:
- including aluminum metallic powder into the hotmelt adhesive (209) or
- embedding a de-tuning antenna into the substrate layer opposite the transponder.

FIG. 7D illustrates a passport cover comprising a cover layer 704 laminated with adhesive 714 to an inlay substrate 708. The black dots in the adhesive layer 714 represent metallic powder.

FIG. 7E illustrates a shielding/detuning antenna 760 which may be disposed on the back panel of the passport cover (see FIG. 1A). The antenna 760 may be mounted to the top surface of the inlay substrate 708 (compare 208) in the same manner as the antenna (220) for the chip module (210) is mounted (embedded). The same or different wire may be used.

The antenna 760 may make several, such as 9 or 10 turns, and may be open (ends not connected with one another). Exemplary dimensions (in millimeters) are shown. For example, the back panel of the inlay substrate 708 may measure 88×125 mm, the antenna wire may be spaced 5 mm in from the edge of the substrate, and the coil "pitch" may be 3 mm, The "de-tuning" antenna for shielding purposes can be an open circuit antenna tuned to half the resonance frequency of the transponder circuit, approx. 7.5 MHz—or alternatively the de-tuning antenna can be a closed circuit antenna in which both ends of the antenna are connected.

U.S. patent application Ser. No. 12/198,103 filed Aug. 25, 2008 (Publication No. 2008/0308641), incorporated by reference herein, discloses: in order to prevent skimming and eavesdropping of the personal data stored in the memory of an RFID chip in an electronic passport or secure document, it is proposed to use a de-tuning antenna scribed into the substrate which forms part of the back cover of the passport cover. The wire antenna made of copper and insulated is embedded from the center of the substrate to the perimeter leaving the wire ends open. When the passport cover is closed the de-tuning antenna is positioned over the primary antenna connected to the RFID chip and separated by the pages of the passport cover which act as a dielectric medium. When the passport is in an electromagnetic field, the de-tuning antenna is coupled with the primary antenna resulting in the de-tuning of the complete system, making it substantially impossible to activate the RFID chip with correct keys, and prevent reading or writing data to the RFID chip. When the passport cover is opened and presented to a reader, the de-tuning antenna is not positioned over the primary antenna connected to the RFID chip, and it is possible to activate the RFID chip.

Regarding de-tuning the antenna for the chip module, in addition to the two variations of open and closed circuit antenna, there is a third variation which is an LCR circuit with the antenna tuned to half resonant frequency of the transponder circuit, for example approximately 7.5 MHz with the antenna inductor connected to a capacitor (100 pf) and a resistor (100 Ohm) in parallel—it is a filter circuit.

FIG. 7F shows (diagrammatically) a passport booklet, partially open, having a back panel and a front panel. In this example, the electronics (chip module and antenna) are located in the front panel. An actuator, which may be a strip of material, is fixed in the back panel (such as between the cover layer and the inlay substrate), and extends past the hinge area into the front panel. The actuator strip is not fixed in the front panel, rather it is able to slide back and forth as the passport booklet is opened and closed.

When the booklet is opened (curved arrow), the portion of the actuator in the front panel moves (to the right, see right-facing arrow). The end of the actuator is conductive, and makes contact between two terminals (contacts) of the antenna wire. When the booklet is closed, the contact is broken. The end of the actuator and the two contacts associated with the chip module's antenna constitute a switch disposed in the passport cover for disconnecting the chip module's antenna when the passport booklet is closed. This provides security against skimming.

Some Features of the Antenna Wire

The antenna wire for the inlays described herein may comprise self-bonding copper wire or partially coated self-bonding copper wire, enamel copper wire or partially coated enamel wire, silver coated copper wire, un-insulated wire, aluminum wire, doped copper wire or litz wire.

The antenna wire may have a diameter of approximately 50-120 μm, and may be coated with enamel so as to be insulated and/or "self-bonding".

Insulated wire is relevant where the wire needs to cross over itself, such as at the point "c" in FIG. 1E.

Self-bonding wire is relevant to adhesively mounting the wire to the surface of the inlay substrate (or a layer of a multi-layer inlay substrate).

An exemplary wire is Electrisola brand enamelled copper wire. 0.010-0.50 mm (AWG 24-58) (0.010 mm=100 μm). A 112 μm wire may have only a few microns of insulation on it. With an adhesive layer and an insulation layer, the overall diameter may be 132 μm (for example).

FIG. 8A shows a self-bonding (of self-adhering) wire. Such self-bonding wire is described in U.S. Pat. No. 7,546,671, incorporated by reference herein. The insulated, self-adhering wire 840 may comprise:

a metallic core 842, having a diameter;
a first non-metallic coating 844 disposed on the surface of the metallic core 842; and
a second non-metallic coating 846 disposed on the surface of the first metallic coating 844.

The core 842 may comprise copper, aluminum, doped copper, gold, or Litz wire, and may have a diameter of 0.010-0.50 mm (AWG 24-58) (0.010 mm=100 micron).

| | |
|---|---|
| Litz wire | Litz wire is a special type of wire used in electronics. It consists of many thin wires, individually coated with an insulating film and braided, thus increasing the surface area of the conductor and thereby reducing the skin effect and associated power losses when used with high-frequency applications. The word originated from Litzendraht, German for braids wire. |

The first coating 844, or "base coat" may comprise modified polyurethane, and may have a thickness of only a few microns.

The second coating 846, or "bond coat" may comprise polyvinylbutyral or polyamide, and may have a thickness of only a few microns.

The composition of the insulated wire can have a base coat of modified polyurethane and a bond coat of polyvinylbutyral or polyamide.

When mounting (adhesively placing) self-bonding wire, the wire coating is chemically changed to react to the heat generated by the rubbing with the ultrasonic horn (sonotrode). Additionally, ultraviolet (UV) light radiation may be used, in a curing station. The self-bonding coating affords the strength of bonding (adhesively placing, or positioning) the wire to the substrate with the ultrasonic horn, while the UV light hardens the adhesion.

In polymer chemistry and process engineering, "curing" refers to the toughening or hardening of a polymer material by cross-linking of polymer chains, brought about by chemical additives, ultraviolet radiation or heat.

The antenna wire for the inlays described herein may comprise a luminous coating, which may be one of the coatings described immediately hereinabove with regard to the insulating and/or self-bonding wire. By having a luminous coating, tampering with the antenna wire or the bond positions can be exposed by presenting the inlay to an ultraviolet (UV) light source.

Removing Insulation from the Antenna Wire

With insulated wire, it may be advantageous to remove the insulation from at least a portion of the wire that will be bonded to the chip module. FIG. 7 of U.S. patent application Ser. No. 12/045,043 filed Mar. 10, 2008 (Publication No. 2008/0179404), incorporated by reference herein, is a cross-sectional view illustrating a technique for removing insulation from wire, according to an embodiment of the invention.

FIG. 8B illustrates removing insulation while mounting the wire. An exemplary embedding tool 850 is shown. A wire 866 is shown passing through an eye 864 in a wire guide 860 of the embedding tool 850. An end 872 of the sonotrode 870 pushes the wire against a substrate 844, for mounting thereto. A wire cutter 846 is shown.

The purpose of the wire guide 860 is to guide wire 866 from an external supply (not shown) to under the end 872 of the sonotrode 870, so that the wire 866 can be embedded in to the surface of a substrate 844. The end 862 of the wire guide 860 is provided with a small feed hole (or "eye", as in eye of a needle) 864 through which the wire 866 can be inserted (or "threaded", akin to threading a sewing machine needle). The wire 866 can be seen passing through the wall of the wire guide 860, at approximately a 45-degree (30-60 degree) angle.

Before passing through the eye 864 of the wire guide 860, the wire 866, which is a coated wire, passes through an insulation-removal station 880, which may comprise a nozzle where laser light from a laser 882 can be introduced via a glass fiber, to remove (ablate) the insulation from the wire 866. After passing through the insulation-removal station

880, the wire is no longer coated, as indicated by the primed reference numeral 866'. As shown in the drawing, a distance "s" represents how far in advance, along the length of the wire, the insulation needs to be removed to control its final destination.

Personalizing the Antenna Wire

FIG. 8C illustrates that the antenna wire 890 may be "personalized", for example stamped with a serial number, production batch number and or manufacturer's code as an additional security feature. (Compare FIG. 7C, personalizing the substrate.)

Some Additional Features

Some additional features (embodiments) of the invention will now be discussed. These features may be technical features, or security features. These features may be incorporated into the inlays, inlay substrates, and manufacturing processes described herein. These features may be combined with other embodiments of the invention set forth herein.

FIGS. 8D and 8E correspond with FIGS. 5A and 5B of U.S. patent application Ser. No. 11/773,434 filed 1 Jul. 2007 by Finn (Publication No. 2008/0155822), incorporated by reference herein, and illustrate a technique for connecting end portions of an antenna wire to an RFID chip, which may be referred to as "direct connection".

The technique to encapsulate a chip (die) in a thermoset plastic package is commonly known as transfer molding. The molding material is highly filled epoxy primarily consisting of sand and glue, and also soot to protect the die from ultraviolet light as well as antistatic, flame retardant (e.g. red phosphorous) and anti-stick (e.g. wax) compounds.

According to an embodiment of the invention, a transfer molding technique is used, not for chip package encapsulation, but to hold the die in a fixed position in a housing during the direct connection of the wire ends of an antenna to the aluminum pads on a silicon device or to bumps mounted on the aluminum pads.

FIGS. 8D and 8E illustrate a chip housing 800 with an opening 826 to accept a die 808, and may be used to replace a conventional chip module in manufacturing a transponder inlay. The die 808 is shown with two metalized bumps 808a and 808b on its front (top, as viewed) surface. The chip may have a generally rectangular shape, and the chip housing 800 may have a similar (but larger) generally rectangular shape. The bumps (connection areas) 808a and 808b can be enlarged or elongated pads.

A substantially planar base portion 824 of the chip housing 800 has a first dimension "x1" which may measure 8 mm, and a second dimension "y1" which may measure 8 mm, and has a thickness ("z1") which may measure 100 μm (0.1 mm). The thickness of the base portion 824 is intended to correspond (be substantially equal) to the thickness of the bottom layer(s) 804b (compare 104b) of a multi-layered inlay 804 (compare 104). These, and other dimensions set forth herein, are exemplary, and may vary with different applications and configurations.

A wall portion 822 has four walls and protrudes from the top surface of the base portion 824, and is sized and shaped to surround a bare die 808. For example, a die 808 may measure 1 mm×1 mm, and have a thickness of 150 μm (0.15 mm). The opening 826 is shown, formed by the four walls of the wall portion 822.

The four walls of the wall portion 822 rise from the base 824 and "frame" the die 808. The width and length of the wall portion 822 depends on the size of the die. The four walls may each have a thickness of approximately 0.5 mm (500 μm), so that the wall portion 822 has an overall first dimension "x2" measuring 2 mm, and an overall second dimension "y2" measuring 2 mm. The support portion may have a height ("z2") of 200 μm (0.2 mm), which is intended to correspond (be substantially equal) to the thickness of the upper layer(s) 804a (compare 104a) of the multi-layered inlay 804.

As best viewed in FIG. 8D, protruding from the center of the base portion 824, within the wall portion 822, is a support portion 828 upon which the die 808 may be supported. The height of the support portion (200 μm) including the underlying base portion (100 μm) is approximately equal to the thickness of the inlay (300 μm), before this inner sandwich is laminated with a top and bottom layer. A hole 829 may be provided from the bottom of the base portion 824 through the center of the support portion 528 to allow for the passage of a heating element or for dispensing a substance. The support portion 828 may be formed integrally with the base and wall portions, or may be an insert disposed within the opening 826.

As mentioned above, the housing 800 has a wall portion 822 extending vertically from the base portion 824. Top surfaces of the wall portion 822 are provided with grooves within which end portions 810a and 810b (compare 210a/b, 310a/b, 410a/b) may be positioned prior to disposing h the chip 808 in the opening 826. The opening 826 corresponds to the aforementioned recesses (206, 306, 406), and the end portions 810a and 810b of the antenna wire 810 span (bridge) the opening 826, and are spaced sufficiently wide apart that the chip may be inserted past the end portions 810a and 810b of the wire 810, into the opening 826. Initially, the end portions 810a and 810b of the wire 810 are "pre-positioned" and may be located in a pair of grooves 830a and 830b which extend across the top surface of the housing portion 822.

The grooves 830a and 830b may be generally semi-circular, and extend in parallel across the top surface of the housing portion 822, spaced a distance ("s8") apart which is greater than a corresponding dimension ("w9") of the chip 808. With the end portions 810a and 810b of the antenna wire 810 disposed in this first set of grooves 830a and 830b, and if these grooves are over the opening, the laser may be used to remove insulation from the end portions 810a and 810b of the antenna wire 810, before positioning the wire ends of the antenna into a second set of grooves 832a and 832b which are spaced a distance ("s9") apart so as to be over the terminal areas of the chip 808. During insulation removal, reflective material such as a mirror can be used to ensure that the insulation is completely removed from all sides of the wire conductor.

The opening (or recess) is only slightly larger than the chip, and the end portions of the wire (wire bridges) are directly moved from an initial position which is wider than a width dimension of the chip (or chip module) to a final position which is narrower and places the wire bridged over the terminals of the chip for bonding thereto.

A procedure to produce an inlay with an array of transponder sites may be as follows: Firstly, a cavity is punched at each transponder site in the bottom layer(s) of an inlay sheet or substrate to accommodate the base of the chip housing and cavities are also punched through the inner layers to accommodate the support; Secondly, slots on each side of a cavity can be provided in the top layers of the inlay to allow for easy manipulation of the wires in bringing them into position over the terminal areas of the chip; thirdly, a chip housing is inserted into the inlay at each transponder site and supported by an underlying layer; fourthly, an antenna is mounted at each transponder site in the array, passing the antenna wire over the slots and aligning the wire ends of the antenna adjacent to the cavity containing the chip housing; fifthly, in preparation for interconnection, the insulation from the wire ends of the antenna is removed; and finally, a chip is placed in the recess at the apex of the housing and the un-insulated wires are aligned over the terminal areas for bonding.

Fiducials

As disclosed in FIGS. 4A and 4B of U.S. Provisional Application 61/145,971 filed 21 Jan. 2009, the antenna for a passport inlay may have a special design with a "squiggle radius" at each corner of the antenna. For example, the antenna wire may be "looped" around the terminal areas of a chip module and embedded at the start and end of an antenna in a certain way or shape, to allow immediate recognition of the original inlay manufacturer. The four radii (rounded corners) of the antenna may be "squiggled" at each radius during the embedding process.

FIG. 8F illustrates two end portions 820a and 820b of an antenna wire 820 passing over corresponding two terminals 810a and 810b of a transponder chip (or chip module) 810, and bonded (dots) thereto. The chip module 820 is disposed in a recess 816 which is slightly larger than the chip module. Fiducials (+) may be printed on the inlay substrate adjacent (near) the recess.

The end portions 820a and 820b of the antenna wire 820 are both shown crossing over the terminals 810a and 810b in an upward direction. Note that prior to crossing over the terminals, the end portions of the antenna wire turn inward, then upward, and after crossing over the terminals, the wire. Then the end portions of the antenna wire turn outward, and "wrap" around the upper left and right fiducials. This provides for quality control, alignment and security.

An Ultrasonic Embedding Tool of the Prior Art

FIG. 10A shows a sonotrode (wiring device for wiring a wire conductor by means of ultrasound) of the prior art, such as from U.S. Pat. No. 6,698,089. As described therein (with reference to FIG. 3 therein, numbering preserved herein):

FIG. 3 shows the wiring device 22 in an individual representation with an ultrasonic generator 34 which is arranged coaxially with respect to the wire guide 23 and is rigidly connected to the latter in a connecting region 35. Overall the wiring device 22 represented in FIG. 3 is of rotationally symmetrical construction. The wire guide 23 comprises a central longitudinal bore 36 which in the region of the wire-guide nozzle 30 merges with a wire capillary 37 which in comparison with the longitudinal bore 36 has a narrowed diameter that is matched to the diameter of the wire conductor 20. The wire-guidance capillary 37 serves primarily to be able to align the wire conductor exactly in the wiring plane 28 (FIG. 1).

In the embodiment example represented in FIG. 3 there are arranged to the side of the wire guide 23, above the wire-guide nozzle and leading into the longitudinal bore 36, two wire-feed channels 38, 39 which extend obliquely downwards in the direction of the wire-guide nozzle 30. The wire-feed channels 38, 39 serve for lateral introduction of the wire conductor 20 into the wire guide 23, so that the wire conductor 20, as represented in FIG. 3, extends laterally on a slant into the wire-feed channel 38, through the longitudinal bore 36 and, guided out of the wire-guidance capillary 37, through the wire guide 23. In this case the multiple arrangement of the wire-feed channels 38, 39 permits selection of the wire-supply side of the wire guide 23 that is most favorable in the given case.

As is further evident from FIG. 3, the wire-guide nozzle 30 is of convex construction in the region of a wire outlet 40 in order to enable a deflection of the wire conductor 20 that is as non-damaging as possible in the region of the contact point 32 (FIG. 1) or in the region of the wire outlet 40 in the course of the wiring operation represented in FIG. 1.

Although not represented in any detail in FIG. 3, the wire guide 23 may be equipped with a wire-severing instrument and a wire-advancing instrument. In this case the wire-severing device may be directly integrated into the wire-guide nozzle 30. FIG. 4 shows a wire conductor 20 which, for the purpose of forming a coil 41 which in this case takes the form of a high-frequency coil, is wired on a substrate 42. The coil 41 here has a substantially rectangular configuration with an initial coil region 43 and a final coil region 44 which are guided away via a window-shaped substrate recess 45. In this case the initial coil region 43 and the final coil region 44 are in parallel alignment with a main coil strand 46 which they accept between them in the region of the substrate recess 45. In the course of the ultrasonic wiring of the wire conductor 20 already elucidated in principle with reference to FIG. 1 the ultrasonic loading of the wire conductor 20 is interrupted while the latter is being guided away via the substrate recess in the course of the wiring operation, in order on the one hand to ensure no impairment of the alignment of the wire conductor 20 in an unrestrained region 47 between the recess edges 48, 49 located opposite one another and on the other hand in order to rule out stressing of the connection between the wire conductor 20 and the substrate 42 in the region of the recess edges 48, 49 by tensile stresses on the wire conductor 20 as a consequence of ultrasonic loading.

A Cantilevered Sonotrode

In an embodiment of the invention, the apparatus to countersink a wire into a Teslin™ substrate, transforms ultrasonic energy operating at 60 KHz from an ultrasonic converter to a sonotrode via a booster block. The booster block made of aluminum or titanium is bolted to the converter and the sonotrode, transporting ultrasonic energy with no loss of amplitude from the converter to the sonotrode. To enhance the bundling of ultrasonic energy to the sonotrode, the booster block can be shaped to direct the energy to the sonotrode. FIG. 5 is a production-type drawing, with various views, illustrating an ultrasonic embedding tool.

According to an embodiment of the invention, an ultrasonic wire guide tool 900 comprises: an ultrasonic converter 901; an aluminum block 902 bolted to the ultrasonic converter for the purpose of directing ultrasonic energy to the sonotrode 903; and a capillary 904 comprising a wire feed channel entering at the top of the aluminum block 902, passing through the sonotrode 903, and exiting at the tip 905 of the sonotrode; a compressed air connection (906) to facilitate the movement of a wire 907 through the wire feed channel and a sonotrode (903) blotted to the aluminum block 902 and in use is oriented so that the tip of the sonotrode is perpendicular to the surface of the substrate.

In another embodiment a UV laser, may be provided for removing insulation from a wire 907, in a controlled manner, prior to the wire passing through the capillary (904) in the aluminum block 902. (Compare FIG. 8B)

The technique differs significantly from the technique described in, U.S. Pat. No. 6,698,089 which discloses that the ultrasonic generator/converter is arranged coaxially with respect to the wire guide (23) (sonotrode) (see for example claim 5 of the '089 patent). In the ultrasonic wire guide tool 900 disclosed herein, converter 901 and wire guide 903 are not coaxial, but have axes offset from one another. In this sense, the sonotrode is cantilevered with respect to the ultrasonic converter.

FIGS. 10B and 10C illustrates an ultrasonic wire guide tool 1000, generally comprising:
- an ultrasonic converter 1001
- an aluminum block 1002 bolted to the ultrasonic converter 1001
- a wire guide or sonotrode 1003 bolted to the aluminum block 1002 (FIG. 10C, detail of sonotrode)
- a wire feed channel 1004 in the aluminum block 1002 oriented perpendicular to the ultrasonic converter 1001 and passing through the wire guide or sonotrode 1003 and existing at the tip of the sonotrode
- an entry point 1005 at the tip of the sonotrode and
- a compressed air connection 1006 to facilitate the movement of a wire 1007 through the aluminum block 1002 and sonotrode 1003 (wire 1007 omitted from FIG. 10B, for illustrative clarity)

The ultrasonic embedding head or commonly known as a sonotrode resonates at the ultrasonic generator frequency of approximately 60 KHz using an embedding tool made of titanium. Because the sonotrode directly embeds insulated wire into a synthetic substrate like Teslin™, there is enormous abrasion at the tip of the sonotrode tool. To counter act the effects of abrasion, the sonotrode is fitted with a hard metal insert which significant increases its life time. But because the hard metal insert changes the resonant frequency of the original titanium shaped sonotrode, the form of the sonotrode is altered by removing metal to bring the sonotrode back to its original resonant frequency. According to the embodiment of this invention, the sonotrode is not provided with a hard metal insert to increase its longevity, but rather the tip of the titanium sonotrode is nitride hardened and or coated with diamond like carbon (DLC).

The aluminum block may be designed to have the same resonance frequency as the sonotrode, approximately 60 KHz.

An advantage of the aluminum "interface" block 902 is that by offsetting the sonotrode 1003 from the converter 1001, the wire 1007 may be fed along the axis of the sonotrode 1003, without needing to bend or be fed from the side. This "straight through" wire feed feature simplifies the design of the sonotrode, and minimizes dragging forces (stiction) on the wire 1007. Compare, for example, the prior art sonotrode in FIG. 10A in which "wire-feed channels 38, 39 serve for lateral introduction of the wire conductor 20 into the wire guide 23".

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. An inlay substrate for a secure document having a recess extending into the inlay substrate from a first (top) surface thereof for receiving a chip module therein, and an antenna wire disposed in the inlay substrate, wherein:
the inlay substrate comprises at least two layers of a synthetic material laminated to one another with a layer of adhesive; and
the recess extends through a top of the two layers and at least into a bottom of the two layers.

2. The inlay substrate of claim 1, wherein:
the antenna wire is disposed between the at least two layers.

3. The inlay substrate of claim 1, wherein:
the recess is stepped, and is formed by a first opening having a first width dimension in a first one of the at least two layers, and a second opening having a second width dimension in a second one of the at least two layers which is adjacent to the first one of the at least two layers and the second opening is aligned with the first opening; and
the first width dimension is different than the second width dimension.

4. The inlay substrate of claim 1, wherein:
the recess is a pocket-type recess extending only partially through the inlay substrate or a window-type recess extending completely through the inlay substrate.

5. The inlay substrate of claim 1, further comprising:
a moisture-resistant patch covering the chip module.

6. The inlay substrate of claim 1, further comprising:
an epoxy filling disposed in the recess, surrounding the chip module and the antenna wire interconnections.

7. The inlay substrate of claim 1, further comprising:
pre-formed channels in a surface of the substrate within which the antenna wire is at least partially embedded.

8. The inlay substrate of claim 1, wherein:
the chip module is a leadframe-type module or an epoxy glass type module.

9. The inlay substrate of claim 1, further comprising:
at least one lid covering at least one opening of the recess.

10. The inlay substrate of claim 1, further comprising:
a cover layer laminated to the inlay substrate.

11. The inlay substrate of claim 10, wherein:
the cover layer and inlay substrate comprise an inlay, such as for a passport booklet (cover) having a front panel and a back panel.

12. The inlay substrate of claim 11, further comprising:
a shielding/detuning antenna disposed on the back panel of the passport cover.

13. The inlay substrate of claim 11, further comprising:
a switch disposed in the passport cover for disconnecting the chip module's antenna when the passport booklet is closed.

14. The inlay substrate of claim 1, wherein:
the antenna wire is disposed on a top surface of the top layer.

15. The inlay substrate of claim 1, further comprising:
ferrite particles in the bottom layer.

16. The inlay substrate of claim 1, wherein:
the recess extends through the bottom layer.

17. The inlay substrate of claim 16, further comprising:
a strip of material on a bottom surface of the bottom layer.

18. The inlay substrate of claim 16, further comprising:
an epoxy filling disposed in the recess.

19. A secure document comprising the inlay substrate of claim 1.

20. The secure document of claim 19, comprising:
a chip module disposed in the recess and connected with the antenna.

* * * * *